United States Patent
Fujishima et al.

(10) Patent No.: US 6,788,389 B2
(45) Date of Patent: Sep. 7, 2004

(54) PRODUCTION METHOD OF PROJECTION OPTICAL SYSTEM

(75) Inventors: Youhei Fujishima, Ageo (JP); Hironori Ikezawa, Fukaya (JP); Toshihiko Ozawa, Fukaya (JP); Yasuhiro Omura, Kumagaya (JP); Takeshi Suzuki, Ageo (JP)

(73) Assignee: Nikon Corporation, Tokyo (JP)

(*) Notice: Subject to any disclaimer, the term of this patent is extended or adjusted under 35 U.S.C. 154(b) by 6 days.

(21) Appl. No.: 10/191,428

(22) Filed: Jul. 10, 2002

(65) Prior Publication Data

US 2003/0053036 A1 Mar. 20, 2003

Related U.S. Application Data

(60) Provisional application No. 60/308,840, filed on Aug. 1, 2001.

(30) Foreign Application Priority Data

Jul. 10, 2001 (JP) .................................. 2001-208837

(51) Int. Cl.$^7$ .................. G03B 27/54; G03B 27/42; G02B 13/14

(52) U.S. Cl. .................. 355/67; 355/53; 359/355

(58) Field of Search .................. 355/30, 54, 67–71; 359/754, 497, 499, 355

(56) References Cited

U.S. PATENT DOCUMENTS

| | | | |
|---|---|---|---|
| 4,309,602 A | 1/1982 | Gonsalves et al. | |
| 5,561,525 A | 10/1996 | Toyonaga et al. | |
| 5,563,706 A | 10/1996 | Shibuya et al. | |
| 5,898,501 A | 4/1999 | Suzuki et al. | |

(List continued on next page.)

FOREIGN PATENT DOCUMENTS

| | | |
|---|---|---|
| EP | 1 114 802 A1 | 7/2001 |
| JP | A-7-283119 | 10/1995 |
| JP | A-8-107060 | 4/1996 |
| JP | A-10-154657 | 6/1998 |
| JP | A-10-260020 | 9/1998 |
| JP | A-10-260024 | 9/1998 |
| JP | A-11-6784 | 1/1999 |
| JP | A-11-54411 | 2/1999 |
| JP | A-2000-97616 | 4/2000 |
| JP | A-2000-331927 | 11/2000 |
| JP | 2000-331927 | 11/2002 |

(List continued on next page.)

OTHER PUBLICATIONS

Intrinsic Birefringence in 157nm Materials, John H. Burnett et al., 2$^{nd}$ International Symposium on 157nm Lithography on May 15, 2001.

(List continued on next page.)

Primary Examiner—Henry Hung Nguyen
(74) Attorney, Agent, or Firm—Oliff & Berridge PLC

(57) ABSTRACT

A projection optical system in which an image of a first surface is projected onto a second surface based on a light beam having a predetermined wavelength. The projection optical system having at least one isometric system refractive member made of an isometric system crystal material. The isometric system crystal material transmits a light beam having the predetermined wavelength. The projection optical system also has an amorphous refractive member made of an amorphous material for compensating deterioration of optical performance due to intrinsic birefringence of the isometric system refractive member.

49 Claims, 23 Drawing Sheets

U.S. PATENT DOCUMENTS

| | | |
|---|---|---|
| 6,025,955 A | 2/2000 | Hiraiwa et al. |
| 6,137,626 A | 10/2000 | Takaoka |
| 6,201,634 B1 | 3/2001 | Sakuma et al. |
| 6,239,924 B1 | 5/2001 | Watson et al. |
| 6,366,404 B1 | 4/2002 | Hiraiwa et al. |
| 2003/0000453 A1 | 1/2003 | Unno et al. |
| 2003/0012724 A1 | 1/2003 | Burnett et al. |
| 2003/0021026 A1 | 1/2003 | Allan et al. |
| 2003/0099047 A1 * | 5/2003 | Hoffman et al. ............ 359/754 |

FOREIGN PATENT DOCUMENTS

| | | |
|---|---|---|
| WO | WO 02/003257 A2 | 11/2002 |
| WO | WO 02/093209 A2 | 11/2002 |
| WO | WO 03/009021 A1 | 1/2003 |
| WO | WO 03/009062 A1 | 1/2003 |

OTHER PUBLICATIONS

Intrinsic Birefringence in Calcium Fluoride and Barium Fluoride, John H. Burnett et al., International SEMATECH $2^{nd}$ International Symposium on 157 nm Lithography, May 2001.

Birefringence of CaF2, Kurt Nattermann, International SEMATECH Calcium Fluoride Birefringence Workshop, Jul. 2001.

English–language translation of JP–A–11–54411.

* cited by examiner (a)          (b)          (c)

(a)          (b)

(a)

(b)

(c)

(d)

(a)

(b)

though a refractive member is made of an isometric system crystal material having intrinsic birefringence.

PRODUCTION METHOD OF PROJECTION OPTICAL SYSTEM

This non-provisional application claims the benefit of U.S. Provisional Application No. 60/308,840 filed Aug. 1, 2001. The disclosure of Japanese Priority Application No. 2001-208837 filed Jul. 10, 2001, is incorporated herein by reference in its entirety.

BACKGROUND OF THE INVENTION

1. Field of Invention

The present invention relates to projection optical systems, production methods of the projection optical systems, and exposure apparatus including the projection optical system, in particular, projection optical systems which are suited for exposure apparatus to be used to manufacture microdevices such as semiconductor devices and liquid crystal display devices using a photolithography process.

2. Description of Related Art

It is known to use a method in which a pattern of a photomask (also called a reticle), after being reduction magnified, 4–5 fold, is formed onto a photosensitive substrate (an exposed substrate) such as a wafer to form an electronic device (microdevice) such as a semiconductor integrated circuit or a liquid crystal display. In this type of projection exposure apparatus, the exposure wavelength continues to shift towards a shorter wavelength in order to cope with the trend toward finer semiconductor integrated circuits.

Currently, a KrF excimer laser having an exposure wavelength of 248 nm is mainly used, but the ArF excimer laser with a shorter wavelength of 193 nm is beginning to be commercialized. In addition, a projection exposure apparatus using a light source which provides a beam in the wavelength band of the vacuum ultraviolet region such as an $F_2$ laser with 157 nm wavelength, a $Kr_2$ laser of 146 nm wavelength and an $Ar_2$ laser of 126 nm wavelength is being considered. High resolution through a larger numerical aperture (NA) of a projection optical system is being achieved, and the development of a projection optical system having a larger numerical aperture, in addition to the development of a shorter wavelength for the exposure wavelength is ongoing.

Availability of optical material (lens material) having an excellent transmissiveness (transmittance) and uniform property for the exposure beam of a short wavelength in the vacuum ultraviolet region is limited. In a projection optical system with the ArF excimer laser as a light source, synthetic silica glass may be used as the lens material. However, with only one type of lens material, correction of chromatic aberrations cannot be achieved sufficiently. Hence, calcium fluoride crystal (fluorite) is used for some of the lenses. On the other hand, in a projection optical system using an $F_2$ laser as a light source, in reality, calcium fluoride crystal (fluorite) is the only lens material that can be used.

SUMMARY OF THE INVENTION

Recently, the existence of intrinsic birefringence in a cubic (isometric) system calcium fluoride crystal (fluorite) for such vacuum ultraviolet rays with a short wavelength has been reported. In a super high precision optical system such as a projection optical system used in the manufacturing of electronic devices, the aberration generated in conjunction with birefringence of the lens material is fatal, and the use of a lens composition and lens design to substantially avoid the impact of birefringence is crucial.

Considering the aforementioned problems, aspects of the present invention aim to assure excellent optical performance substantially without receiving the impact of birefringence even if a crystal material with intrinsic birefringence, such as fluorite, is used.

In order to achieve the aforementioned objective, a first aspect of the invention relates to a production method of a projection optical system, of the type which projects an image of a first surface onto a second surface based on light having a predetermined wavelength and which includes at least one refractive member made of an isometric system crystal material that transmits the light having the predetermined wavelength. This aspect of the invention comprises a design step, including a sub-step of determining the direction of a crystal axis of the refractive member, made of at least one of the isometric system crystal material, while evaluating the light of a first polarization component and a second polarization component differing from the first polarization component, for obtaining the predetermined design data. This aspect of the invention also includes a crystal material preparation step of preparing the isometric system crystal material; a crystal axis measurement step of measuring the crystal axis of the isometric system crystal material; a refractive member formation step of forming a refractive member with a predetermined shape from the isometric system crystal material based on the design data in the design step; and an assembly step of arranging the refractive member based on the direction of the crystal axis of the refractive member obtained in the design step.

This aspect of the invention assures excellent optical performance because it enables the determination of the installation angle of the crystal axis of the refractive member made of the isometric system crystal material in such a manner that the impact of the birefringence is minimized while evaluating the impact of the birefringence caused by the isometric system crystal material in terms of a plurality of polarization components.

This aspect of the present invention also may include another step of preparing at least one refractive member with a predetermined birefringence distribution wherein the birefringence distribution is determined based on the design data in the design step. This aspect of the invention assures even more excellent optical performance because it enables the correction of the residual effect of birefringence which is reduced by optimization of the installation of the isometric system crystal material with the refractive member having the predetermined birefringence distribution.

The predetermined birefringence distribution may be at least one of a predetermined birefringence stress distribution of the refractive member and a birefringence distribution caused by a thin film provided on the refractive member.

The refractive member having the predetermined birefringence distribution may be made of silica or fluoride doped silica.

Preferably, the relationship, $0.6<\phi p/\phi c \leq 1$, is satisfied, where, $\phi c$ is a clear aperture of the refractive member with the birefringence stress distribution, and $\phi p$ is the light beam aperture of the light beam emitted from a predetermined point on the first surface when the light beam passes through the refractive member with the birefringence stress distribution. This aspect of the invention assures the position of the refractive member having the birefringence stress distribution to be the optimal position for correcting the birefringence caused by the isometric system crystal material using the refractive member having the birefringence stress distribution, namely, the position where the birefringence correction capability of the refractive member having the birefringence stress distribution is utilized as much as possible.

This aspect of the present invention may further comprise an aspherical surface creation step of forming the surface shape of at least one optical member in the projection optical system in an aspherical shape, wherein the aspherical shape is determined by the design data in the design step. This aspect of the invention enables the correction of a scalar component aberration (the aberration that does not depend on polarization direction) out of all the aberrations generated by the intrinsic birefringence of the isometric system crystal material using the aspherical surface.

The aspherical surface shape may include an asymmetric aspherical shape relative to the optical axis of the optical member.

The assembly step may comprise an optical performance measurement sub-step of measuring the optical performance of the assembled projection optical system, an optical member correction sub-step of changing the position and/or posture of at least one optical member in the projection optical system in order to make the measured optical performance be a predetermined optical performance, and an aspherical surface processing sub-step of forming the surface shape of at least one optical member in the projection optical system in order to make the measured optical performance be the predetermined optical performance. This aspect of the invention enables prevention of the deterioration of the optical performance caused by the integration error and the like of the optical member, because it enables the correction of low-order aberrations, for example, by adjusting position and posture of the optical member during manufacturing of the projection optical system, and enables the correction of high-order aberration of the aspherical surface to be set based on the measured optical performance.

The aspherical surface shape may be determined by considering the design data in the design step. This aspect of the invention enables the correction of both the aberration caused by the integration error of the optical member, and the scalar component aberration (the aberration that does not depend on polarization direction) among the aberrations caused by the intrinsic birefringence of the isometric system crystal material.

The assembly step may include an azimuth correction sub-step of correcting the azimuth around the optical axis of the refractive member made of the isometric system. This aspect of the invention enables the correction of the deterioration of the optical performance caused by the error in crystal axis direction in the refractive member made of the isometric system crystal material during the assembly of the projection optical system.

The assembly step may include a polarization optical performance measurement sub-step of measuring the optical performance of the assembled projection optical system regarding a plurality of polarization component light beams, and wherein an azimuth correction sub-step corrects the azimuth of the refractive member made of the isometric system crystal to make the optical performance regarding the plurality of polarization components assume a predetermined value based on the optical performance regarding the measured multiple polarization components. This aspect of the invention enables sufficient correction of a plurality of polarization component aberrations and scalar component aberrations because the projection optical system aberrations relating to a plurality of polarization components are measured during the assembly of the projection optical system, based on which measurements, the azimuth of the crystal axis of the refractive member made of the isometric system crystal material is adjusted.

The assembly step may include an optical performance measurement sub-step of measuring the optical performance of the assembled projection optical system and wherein the azimuth correction sub-step corrects the azimuth of the refractive member made of the isometric system crystal material to make the optical performance of the projection optical system assume the predetermined value based on the measured optical performance. This aspect of the invention enables sufficient correction of a projection optical system aberration because the projection optical system aberrations are measured during the assembly of the projection optical system, based on which measurements, the azimuth of the crystal axis of the refractive member made of the isometric system crystal material is adjusted.

The scalar aberration of the projection optical system may be measured, based on which measurement, the direction of the crystal axis of the refractive member made of the isometric system crystal material is preferably adjusted. At this time, a plurality of polarization component aberrations are estimated based on the measured scalar aberration, and the direction of the crystal axis of the refractive member made of isometric system crystal material is preferably further adjusted. This enables simplification of a production apparatus of a projection optical system.

The isometric system crystal material may be calcium fluoride or barium fluoride.

The predetermined wavelength may be less than or equal to 200 nm.

Another aspect of the invention includes a projection optical system produced by a production method as discussed above.

Another aspect of the present invention relates to a projection optical system in which an image of a first surface is projected onto a second surface based on a light beam having a predetermined wavelength, and includes: at least one isometric system refractive member made of an isometric system crystal material that transmits the light beam having the predetermined wavelength, and an amorphous refractive member made of an amorphous material for compensating deterioration of the optical performance due to the intrinsic birefringence of the isometric system refractive member. This aspect of the invention assures excellent optical performance because it enables the compensation for the deterioration of the optical performance caused by the intrinsic birefringence possessed by the isometric system refractive member made of the isometric system crystal material by using the amorphous refractive member.

The isometric system refractive member may be formed in such a manner that a crystal axis [100] or a crystal axis that is optically equivalent to the crystal axis [100] substantially coincides with the optical axis of the isometric system refractive member. This aspect of the invention enables the reduction of the effect of the intrinsic birefringence of the isometric system refractive member on the optical performance because the crystal axis [100] or the crystal axis that is optically equivalent to the crystal axis [100] substantially coincides with the optical axis of the isometric system refractive member, enabling the making of an angle that maximizes the impact of the birefringence of isometric system refractive member to be a relatively large angle relative to the optical axis.

The isometric system refractive member made of the isometric system crystal material may include a plurality of isometric system refractive members, and wherein the directions of the crystal axes of the plurality of isometric system refractive members are respectively determined in such a manner that the deterioration of the optical performance due to the intrinsic birefringence is reduced. This aspect of the invention assures excellent optical performance by reducing the compensation amount of birefringence in the amorphous refractive member, because it is possible to mutually offset the impact of the intrinsic birefringence of the plurality of isometric system refractive members by combining a plurality of the isometric system refractive members.

A maximum angle of the light beam passing through the isometric system refractive member, whose crystal axis direction is determined in such a manner that the deterioration of the optical performance due to the intrinsic birefringence is reduced, may be more than 20 degrees relative to the optical axis. This aspect of the invention reduces the impact of birefringence by applying the above correctional method to the isometric system refractive member, the maximum angle of which is larger than 20 degrees because the isometric system refractive member, the maximum angle of which relative to the passing light beam is more than 20 degrees and is easily effected by the intrinsic birefringence.

The isometric system refractive member whose crystal axis direction is determined in such a manner to reduce deterioration of the optical performance due to the intrinsic birefringence, may be arranged between a pupil position closest to the second surface side and the second surface of the projection optical system. This aspect of the invention reduces the impact of birefringence by applying the above correction method to the isometric system refractive member which is arranged between the pupil position closest to the second surface side and the second surface, because the isometric system refractive member arranged between the pupil position closest to the second surface side and the second surface is easily effected by the intrinsic birefringence.

The plurality of isometric system refractive members may comprise: a first group of radiation transmissive members which are formed in such a manner that a crystal axis [100] or a crystal axis that is optically equivalent to the crystal axis [100] substantially coincides with the optical axis, and a second group of radiation transmissive members which are formed in such a manner that the crystal axis [100] or the crystal axis that is optically equivalent to the crystal axis [100] substantially coincides with the optical axis, and wherein the first group of radiation transmissive members and the second group of radiation transmissive members have a positional relationship in which they are rotated substantially 45 degrees relative to each other around the optical axis.

The plurality of isometric system refractive members may comprise: a third group of radiation transmissive members which are formed in such a manner that a crystal axis [111] or a crystal axis that is optically equivalent to the crystal axis [111] substantially coincides with the optical axis, and a fourth group of radiation transmissive members which are formed in such a manner that the crystal axis [111] or the crystal axis that is optically equivalent to the crystal axis [111] substantially coincides with the optical axis, and wherein the third group of radiation transmissive members and the fourth group of radiation transmissive members have a positional relationship such that they are rotated substantially 60 degrees relative to each other around the optical axis.

The plurality of isometric system refractive members may comprise: a fifth group of radiation transmissive members which are formed in such a manner that a crystal axis [110] or a crystal axis that is optically equivalent to the crystal axis [110] substantially coincides with the optical axis, and a sixth group of radiation transmissive members which are formed in such a manner that the crystal axis [110] or the crystal axis that is optically equivalent to the crystal axis [110] substantially coincides with the optical axis, and wherein the fifth group of radiation transmissive members and the sixth group of radiation transmissive members have a positional relationship such that they are rotated substantially 90 degrees relative to each other around the optical axis.

The plurality of isometric system refractive members may comprise: a first group of radiation transmissive members which are formed in such a manner that the crystal axis [100] or the crystal axis that is optically equivalent to the crystal axis [100] substantially coincides with the optical axis, and a fifth group of radiation transmissive members which are formed in such a manner that the crystal axis [110] or the crystal axis that is optically equivalent to the crystal axis [110] substantially coincides with the optical axis.

In addition, the plurality of isometric system refractive members may further comprise: a third group of radiation transmissive members which are formed in such a manner that the crystal axis [111] or the crystal axis that is optically equivalent to the crystal axis [111] substantially coincides with the optical axis.

The plurality of isometric system refractive members, for which the crystal axis direction is determined in such a manner that the deterioration of the optical performance due to the intrinsic birefringence is reduced, may comprise a seventh group of radiation transmissive members formed in such a manner that the predetermined crystal axis substantially coincides the optical axis, and an eighth group of radiation transmissive members formed in such a manner that the predetermined crystal axis substantially coincides with the optical axis, and wherein an equation $|L7-L8|/\lambda < 3 \times 10^{+5}$ is satisfied, where L7 is an optical path length when the light beam corresponding to the maximum numerical aperture of the projection optical system passes through the seventh group of radiation transmissive members, L8 is an optical path length when the light beam corresponding to the maximum numerical aperture of the projection optical system passes through the eighth group of radiation transmissive members, and $\lambda$ is the predetermined wavelength. This aspect of the invention defines the optimal glass path length (optical path length) for the mutually offsetting ill effects of intrinsic birefringence using a plurality of isometric system refractive members.

The maximum value of the angle of the light beam passing through the seventh group and the eighth group of radiation transmissive members preferably is more than 20 degrees relative to the optical axis.

The seventh group and the eighth group of radiation transmissive members preferably are arranged between a pupil position closest to the second surface side and the second surface in the projection optical system.

This aspect of the present invention may further comprise an aspherical surface for reducing a scalar component of the deterioration of the optical performance due to the intrinsic birefringence. This aspect of the invention assures even more excellent optical performance because the scalar component aberration, in addition to the polarization component aberration caused by the intrinsic birefringence, is corrected.

The aspherical surface may have a rotationally asymmetric shape relative to the optical axis of the refractive member on which the aspherical surface is provided.

The amorphous refractive member may have a birefringence stress distribution. This aspect of the invention enables the correction of the effect of birefringence caused by the isometric system crystal material using the birefringence stress distribution, the birefringence amount of which is easily controlled.

The birefringence stress distribution may be generated due at least to impurities during the creation of the amorphous refractive member or the density distribution caused by a temperature program.

The amorphous optical member may be silica or fluoride doped silica.

The isometric refractive members preferably are made of calcium fluoride or barium fluoride.

Another aspect of the invention relates to a projection optical system which transfers an image of a first surface onto a second surface based on a light beam having a predetermined wavelength, comprising twin crystal refractive members made of a twin crystal that transmits the light beam having the predetermined wavelength. Twin crystals may be grouped into those in which two crystals with the same phase contact each other and have a directional relationship rotated 180 degrees around the crystal axis with a predetermined common low index, and those in which two crystals with the same phase contact each other and have a mirror image relationship relative to a predetermined crystal face. By using these twin crystals as the crystal refractive members in the projection optical system, deterioration of the optical performance caused by intrinsic birefringence may be reduced for the totality of the crystal refractive member because the effects of the birefringence are felt in the opposite direction at the twinning plane or at the front and the back of the twin boundary. By this construction, the optical performance of the projection optical system may be assured.

The twin boundary or twinning plane of the twin crystal refractive members may be determined in such a manner that the deterioration of the optical performance due to the intrinsic birefringence of the twin crystal is reduced even further. In this aspect of the invention, the position of the twin boundary or the twining plane is preferably the position where deterioration of optical performance due to the twin crystals' intrinsic birefringence may be corrected.

The predetermined wavelength for this aspect of the invention may be less than or equal to 200 nm.

The above aspects of the invention can be applied to a projection exposure system in which an image of an original which is arranged on a first surface is projection exposed onto a workpiece arranged on a second surface by a light beam having a predetermined wavelength, comprising: a light source that supplies the light beam having the predetermined wavelength; an illumination optical system that guides the light beam from the light source to the original, and the projection optical system of any one of the aspects of the invention described above, arranged on an optical path between the first surface and second surface and which forms the image onto the second surface.

Another aspect of the invention relates to a projection exposure method in which an image of an original which is arranged on a first surface is projection exposed onto a workpiece arranged on a second surface by a light beam having a predetermined wavelength, comprising: supplying the light beam having the predetermined wavelength; illuminating the original using the light beam having the predetermined wavelength; and forming the image of the original onto the second surface using a projection optical system of any of the aspects of the invention described above, based on the illuminated light beams from the original.

The fact that the positional relationship of the first radiation transmissive member group and the second radiation transmissive member group is substantially rotated 45 degrees relative to each other around the optical axis means that the relative angle around the optical axis of a predetermined crystal axis (for example, [010], [001], [01-1] or [011]) which is directed to the different direction from the optical axis in the first radiation transmissive member and the second radiation transmissive member group is substantially 45 degrees. Here, if the crystal axis [100] is made to be the optical axis, because the rotational asymmetry of the effect of birefringence around the optical axis appears with a period of 90 degrees, having a rotational relationship of substantially 45 degrees relative rotation around the optical axis means the same as having a rotational relationship of substantially 45 degrees+(n * 90 degrees) relative rotation around the optical axis (n is an integer).

The fact that positional relationship of the third radiation transmissive member group and the fourth radiation transmissive member group is substantially rotated 60 degrees, relative to each other around the optical axis means that the relative angle around optical axis of a predetermined crystal axis (for example, [−111], [11-1], or [1-11]) which is directed to the different direction from the optical axis in the third radiation transmissive member and the fourth radiation transmissive member group is substantially 60 degrees. Here, if the crystal axis [111] is made to be the optical axis, because the rotational asymmetry of the effect of birefringence around the optical axis appears with a period of 120 degrees, having a rotational relationship of substantially 60 degrees relative rotation around the optical axis means the same as having a rotational relationship of substantially 60 degrees+(n * 120 degrees) relative rotation around the optical axis (n is an integer).

In aspects of the present invention, the fact that the positional relationship of the fifth radiation transmissive member group and the sixth radiation transmissive member group is substantially rotated 90 degrees relative to each other around the optical axis means that the relative angle around optical axis of a predetermined crystal axis (for example, [001], [−111], [−110] or [1-11]) which is directed to the different direction from the optical axis in the third radiation transmissive member and the fourth radiation transmissive member group is substantially 90 degrees. Here, if the crystal axis [110] is made to be the optical axis, because the rotational asymmetry of the impact of birefringence around the optical axis appears with a period of 180 degrees, having a rotational relationship of substantially 90 degrees relative rotation around the optical axis means the same as having a rotational relationship of substantially 90 degrees+(n * 180 degrees) relative rotation around the optical axis (n is an integer).

In order to achieve the above and/or other objectives, another aspect of the invention relates to a production method of a projection exposure apparatus which transfers an image of a first surface onto a second surface based on light having a predetermined wavelength and which includes at least one refractive member made of an isometric crystal material that transmits light having the predetermined wavelength. This aspect of the invention comprises a preparing step of preparing another refractive member which has at least one of a birefringence amount and a birefringence distribution that is different from that of the refractive member, and an exchanging step of exchanging the refractive member for the different refractive member.

In order to achieve the above and/or other objectives, another aspect of the invention relates to a production method of a projection exposure apparatus which transfers an image of a first surface onto a second surface based on light having a predetermined wavelength and which includes at least one refractive member made of an isometric crystal material that transmits light having the predetermined wavelength. This aspect of the invention comprises a preparing step of preparing a refractive member which has a predetermined birefringence distribution, and an adjusting step of adjusting at least one of a position and a posture of the refractive member which is arranged in the projection optical system, so as to adjust a polarization aberration of the projection optical system.

In order to achieve the above and/or other objectives, another aspect of the invention relates to a production method of an illumination optical system which is applied to a projection exposure apparatus which transfers an image of a first surface onto a second surface based on light having a predetermined wavelength. The illumination optical system includes at least one refractive member made of an isometric crystal material that transmits light having the predetermined wavelength. This aspect of the invention comprises a preparing step of preparing a refractive member made of the isometric crystal material, and an optimizing step of optimizing a crystal axis direction of the refractive member so as to correct a polarization aberration.

BRIEF DESCRIPTION OF THE DRAWINGS

The invention will be described in conjunction with the following drawings in which like reference numerals designate like elements and wherein.

DETAILED DESCRIPTION OF PREFERRED EMBODIMENTS

Figure 1:
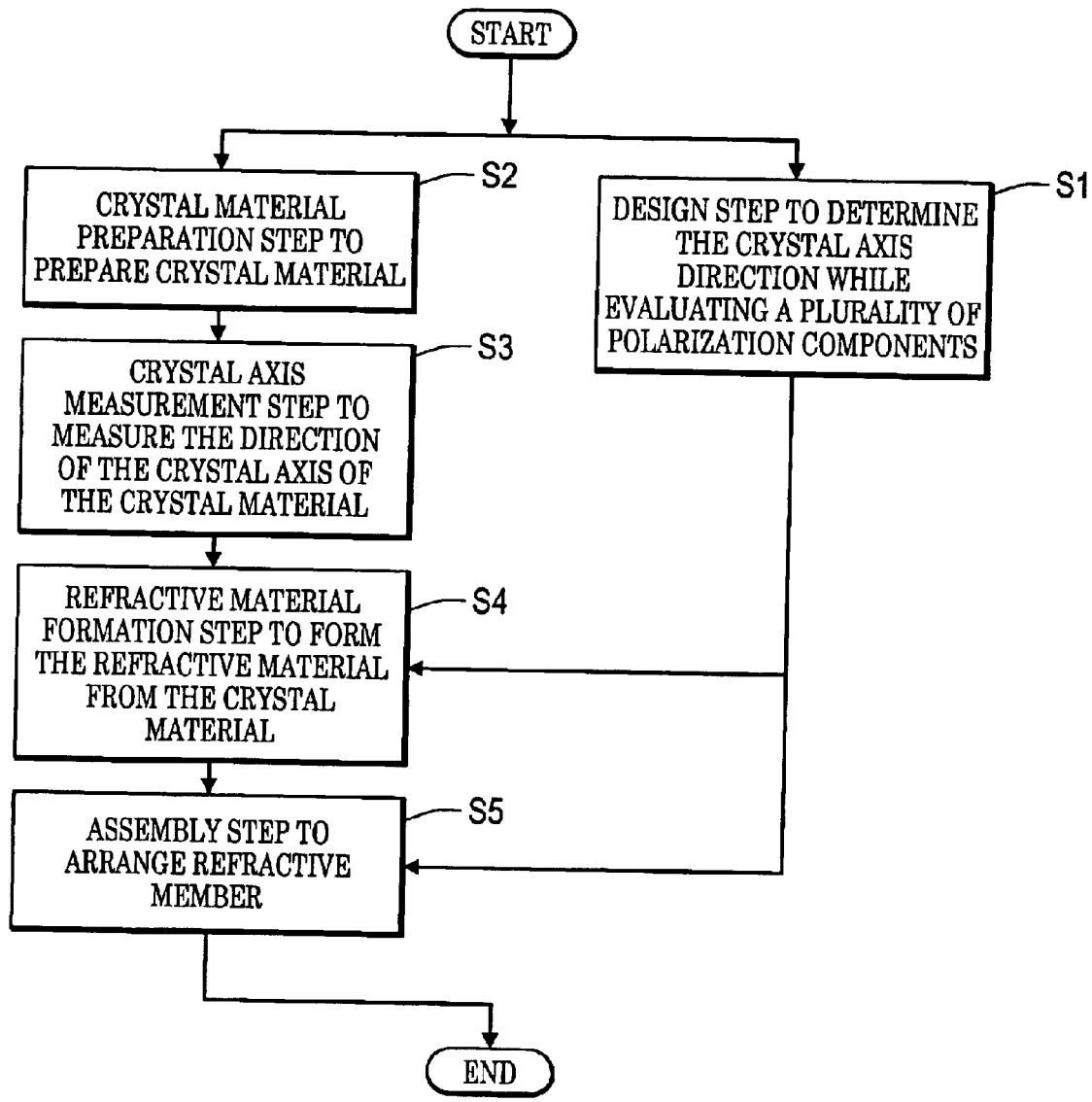
FIG. 1 is a flow chart of a production method of the projection optical system of a first embodiment of the present invention.

Hereafter, a production method of a projection optical system according to a first preferred embodiment of the present invention will be described with reference to the drawings. Before explaining in detail the production method of the projection optical system according to the embodiment, an outline will be described using FIG. 1 to make the understanding easier. FIG. 1 is a flow chart illustrating the outline of the production method of the projection optical system according to a first embodiment of the present invention.

FIG. 1 shows that the production method of the projection optical system of the present embodiment includes a designing step S1, a crystal material preparation step S2, a crystal axis measurement step S3, a refractive member formation step S4, and an assembly step S5.

In the designing step S1, a plurality of light beams with polarization components are used to perform ray tracing of the projection optical system, and the aberration for each polarization component, preferably the wavefront aberration for each polarization component, is computed in designing the optical projection system using ray tracing software. Moreover, while evaluating the projection optical system concerning the scalar aberration, which is a combined scalar component of a plurality of aberrations of each polarization component and a plurality of polarization aberrations, parameters of a plurality of optical members (refractive members, reflective members, diffractive members and the like) which form the projection optical system are optimized to obtain design data consisting of these parameters. In addition to conventional parameters such as surface shape of the optical members, distance between the surfaces of the optical members, refractive index of the optical members and the like, the crystal axis direction is used as a parameter when the optical members are made of a crystal material.

In the crystal material preparation step S2, crystal material of the isometric system having a radiation transmissive property for the wavelength with which the projection optical system is used (preferably a crystal system having the same crystal axis unit length and all the angles made by each crystal axis at the intersection of each crystal axis is 90 degrees) is prepared.

In the crystal axis measurement step S3, the crystal axis of the crystal material prepared in the crystal material preparation step is measured. In this case, either a method in which crystal axis direction is directly measured using a Laue measurement, for example, or a method in which crystal axis direction is determined by first measuring the birefringence of crystal material and using the measured birefringence based on a relationship between the known crystal axis direction and the birefringence amount may be used.

In the refractive member formation step S4, the crystal material prepared in the crystal preparation step is processed (polishing) so that the refractive member will possess the parameter obtained at the designing step (design parameter). In the present embodiment, the order of the crystal axis measurement step S3 and the refractive member formation step S4 may be switched. If the refractive member formation step S4 is executed first, for example, it is sufficient to measure the crystal axis of the crystal material which is processed to possess the shape of the refractive member, and if the crystal axis measurement step S3 is executed first, it is sufficient to provide the refractive member or a maintenance member which maintains the refractive member with the information concerning the crystal axis direction so that the crystal axis which is measured after the refractive member formation may be identified.

In the assembly step S5, the processed refractive member is integrated into the lens barrel of the projection optical system based on the design data obtained in the designing step. In this case, position is determined in such a manner that the crystal axis of the refractive member made of isometric system crystal material assumes the crystal axis direction in the design data obtained in the designing step.

This concludes the explanation of an outline of the production method of the projection optical system according to this embodiment of the present invention. Next, the detailed procedure of preferred embodiments will be described with reference to FIG. 2–FIG. 8.

Figure 2:
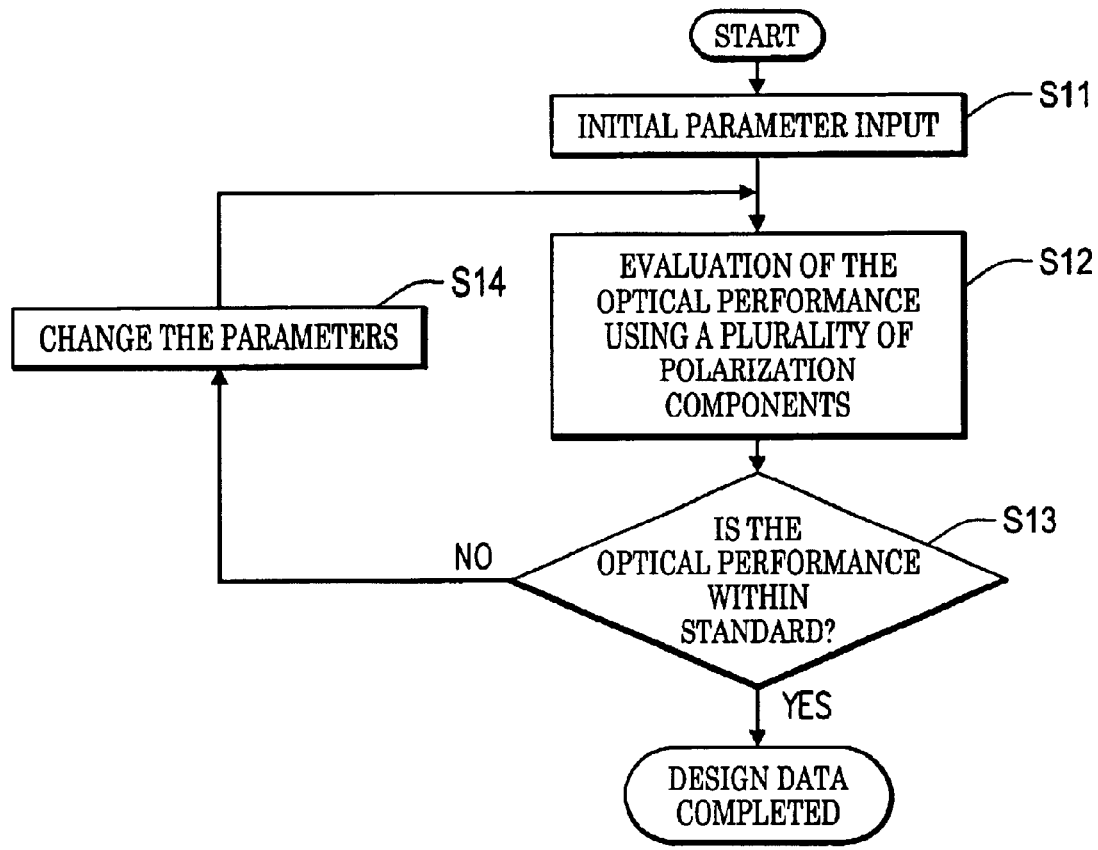
FIG. 2 is a flow chart of a designing step S1 in the first embodiment of the present invention.

FIG. 2 is a schematic flow chart of the designing step S1. FIG. 2 shows that the designing step S1 includes step S11 in which the initial value of the design parameters are input, step S12 in which optical performance of the projection optical system is evaluated based on a plurality of polarization components, step S13 in which a determination is made as to whether or not the optical performance computed in step S12 is within the predetermined standard, and step S14 in which the design parameters are changed if the optical performance of step S13 is not within the predetermined standard.

In the present embodiment, surface shape, distance between surfaces, eccentricity amount, tilt relative to optical axis, azimuth angle around the optical axis, refractive index, birefringence index distribution, reflectance, transmittance, transmittance distribution, clear aperture and common difference (tolerance) of the optical members (lenses and reflective surfaces, etc.) or structure of thin film to be formed on the surface of these optical members, namely, the number of thin film layers, thickness of each layer, material of each layer (absorption coefficient of each layer, if necessary) may be used as design parameters.

Next, step S12, in which the optical performance of the projection optical system is evaluated based on a plurality of polarization components, will be explained in detail referring to FIG. 3 and FIG. 4. Here, FIG. 3 illustrates one example of the evaluation point of the optical performance of the projection optical system, and FIG. 4 is a flow chart used to explain step S12 in detail.

Figure 3:
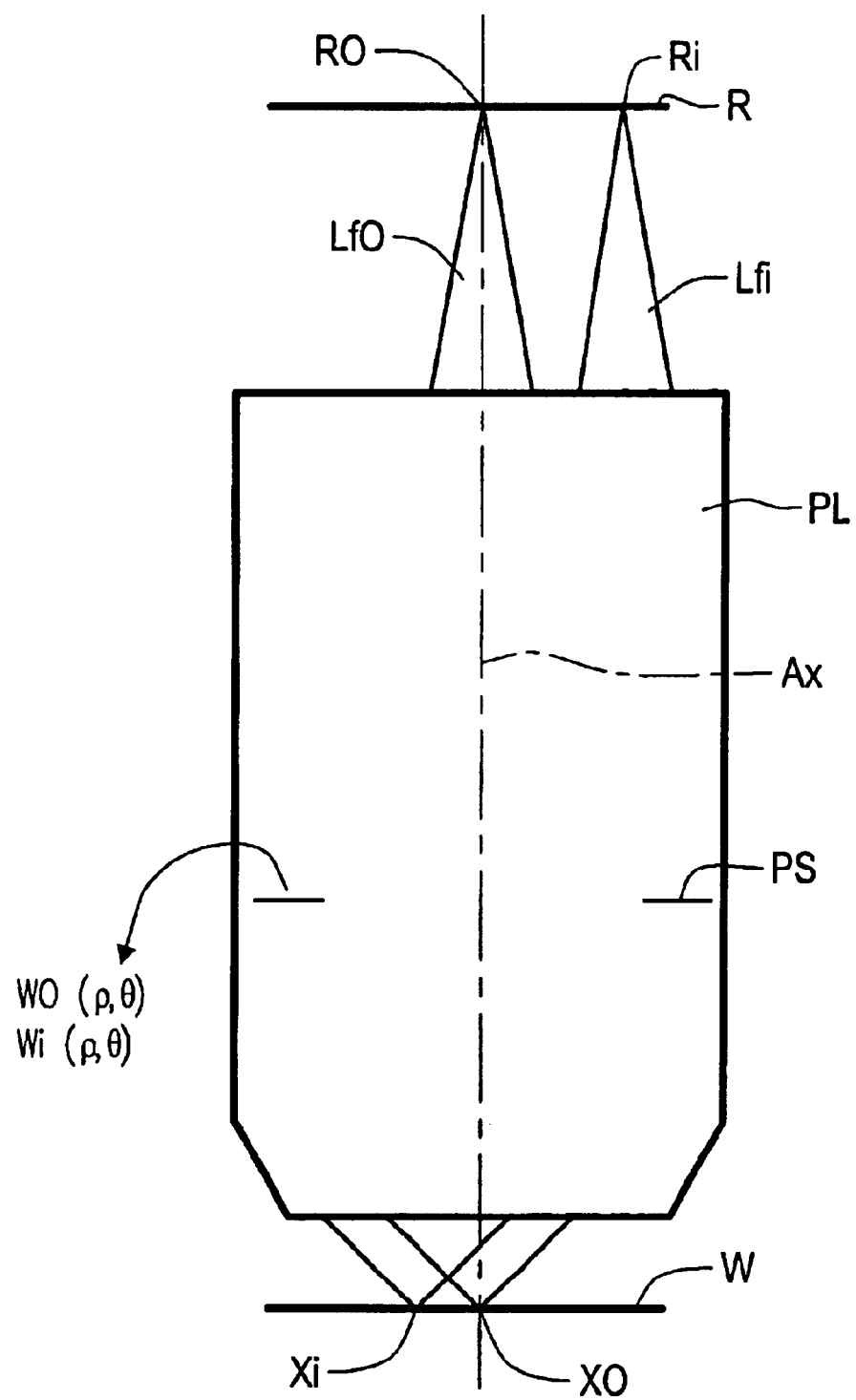
FIG. 3 is an example of the evaluation point of optical performance of the projection optical system in the first embodiment of the present invention.
Figure 4:
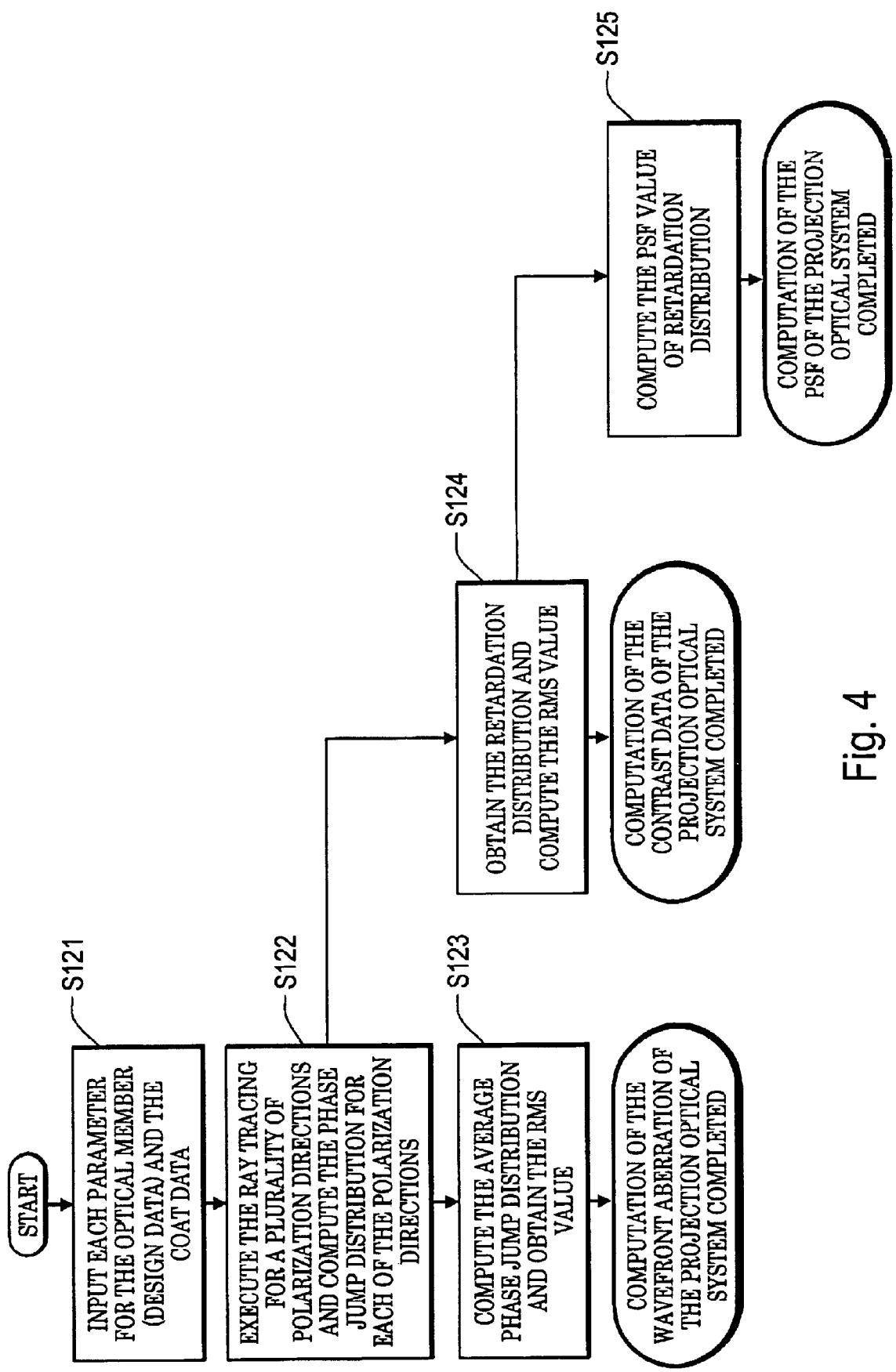
FIG. 4 is a flow chart describing in detail step S12 in the first embodiment of the present invention.
Figure 5:
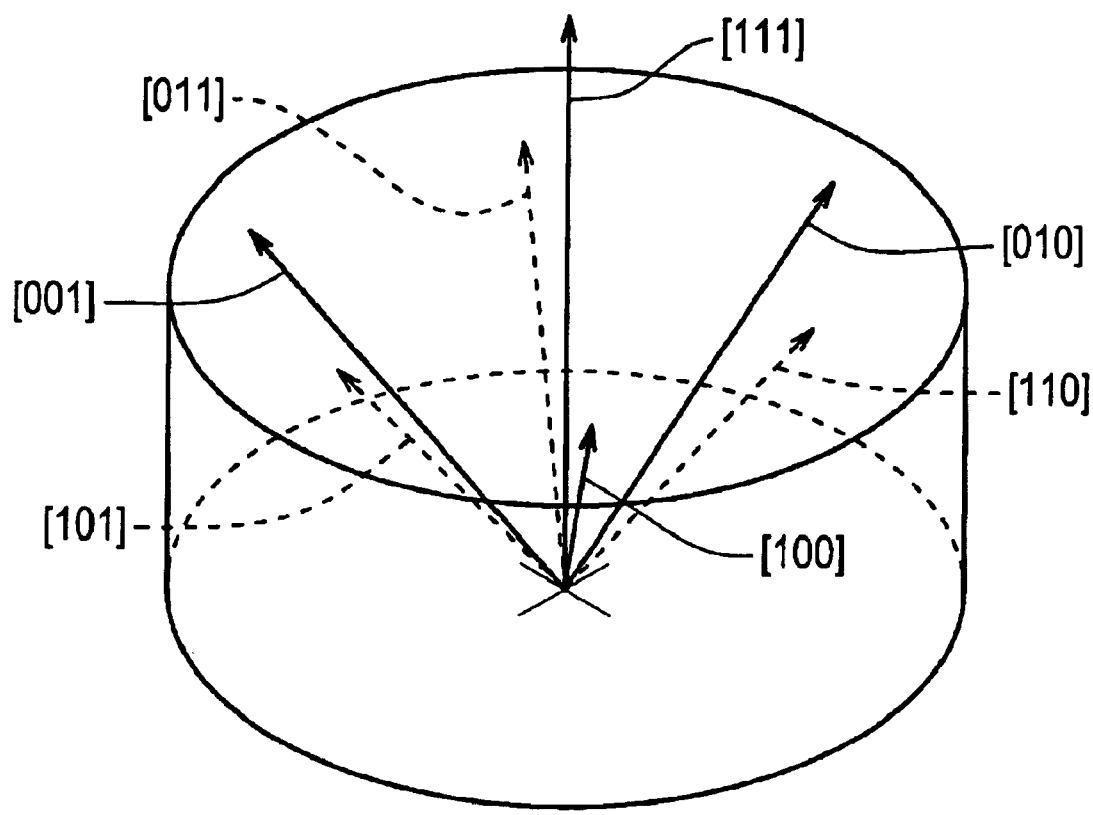
FIG. 5 is a diagram describing the crystal axis direction of the isometric system crystal material in the first embodiment of the present invention.
Figure 5:
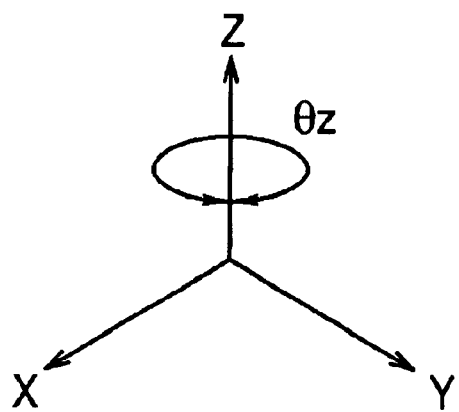

FIG. 3 shows that in the present embodiment, the evaluation point W0 on the optical axis Ax in the image plane W as a second surface in the projection optical system PL, and the evaluation point Wi at an arbitrary image height (the highest perimeter image height, for example) in the image plane W are used as evaluation points. Here, the number of arbitrary image height evaluation points Wi on image plane W is not limited to 1, and a plurality of arbitrary image height evaluation points may be used. Moreover, the imaging light beams entering the evaluation point W0 correspond to the light beams from the point R0 on the optical axis Ax on the object plane R as the first surface of the projection optical system, while the imaging light beams entering the evaluation point Wi correspond to the light beams from the point Ri of the arbitrary object height in the object plane.

Moreover, the X polarization component which vibrates in a predetermined X direction in the surface, whose normal line is the optical axis of the projection optical system, and Y polarization component which vibrates in the Y direction, perpendicular to the predetermined X direction, for example, may be used as a plurality of polarization components in step S12. Moreover, the R polarization component which vibrates in the direction containing the optical axis (radial direction R) in the surface having the optical axis as the normal line and the θ polarization component (polarization component having vibration direction in tangential direction θ) having the vibration direction perpendicular to the R polarization component, or both XY polarization components and Rθ polarization components (namely four polarization components) may be used as a plurality of polarization components.

In the present embodiment, the phase distribution W0 ($\rho$, θ) (Wi ($\rho$, θ)) at the exit pupil of the projection optical system PL is obtained for each polarization component, but this distribution is a polar coordinate representation of the phase distribution on exit pupil PS. Here, $\rho$ is a normalized pupil radius assuming the radius of exit surface PS to be 1, $\theta$ is the polar angle around the center of the exit pupil surface PS, or typically the polar coordinate with the origin at the optical axis.

In step S121, the design parameters of the projection optical system PL are input to the computer. The design parameters are the initial values of the design parameters being input in step S11, if the step S121 is executed immediately after step S11, but are the design parameters which are changed at step S14 if the step S121 is executed after step S14 of FIG. 2.

Here, the design parameters are used in obtaining the complex amplitude at the object surface (wafer surface W) of each beam which is entered and ray traced from the object side (reticle surface R side) of the projection optical system PL.

Next the computer executes ray tracing and computes the first polarization direction phase distribution $WHi(\rho, \theta)$ and the second polarization direction phase distribution $WVi(\rho, \theta)$ of the imaging light beams entering the arbitrary evaluation target image point Xi, and the first polarization direction phase distribution $WH0(\rho, \theta)$ and the second polarization direction phase distribution $WV0(\rho, \theta)$ of the imaging light beams entering evaluation image point Xi on the optical axis.

The first polarization direction and the second polarization direction used here refer to two mutually perpendicular polarization directions. The XY polarization direction, $R\theta$ polarization direction or both XY and $R\theta$ polarization directions may be used.

The complex amplitude to be obtained during computation of the phase distribution in the present embodiment is not only for the edge section of the exit pupil surface PS of the projection optical system PL, but also for the entire exit pupil surface PS. Hence, the ray tracing of the imaging light beams entering the evaluation target image point Xi must be executed for each light beam, out of all the light beams Lfi emitting from the conjugate point Ri of Xi, passing through mutually different positions on the exit pupil, being emitted with mutually different exit angles (here, the maximum emission angle of the ray to be traced relates to the image side numerical aperture of the projection optical system PL), as described in FIG. 3.

In the present embodiment, ray tracing is executed for the optical member made of isometric system crystal material having intrinsic birefringence, but John H. Burnett et al, from the U.S. National Institute of Standards and Technology, made a presentation concerning birefringence distribution for the crystal axis in such optical members at the 2nd International Symposium on 157 nm Lithography, held on May 15, 2001.

The complex amplitude distribution in the first polarization direction and the complex amplitude distribution in the second polarization direction of the light beam Lfi in the exit pupil surface PS are obtained through ray tracing, based on which respective first polarization direction phase distribution and second polarization direction phase distribution are obtained. These distributions are represented in polar coordinate $(\rho, \theta)$ on the exit pupil surface PS respectively as WHi $(\rho, \theta)$ for the first polarization direction phase distribution and WVi $(\rho, \theta)$ for the second polarization direction phase distribution of the imaging light beams entering the evaluation target image point Xi. Here, $\rho$ is the normalized pupil radius assuming the radius of the exit pupil as 1, and $\theta$ is an polar angle in the polar coordinate with the center of the exit pupil plane as the origin.

Ray tracing of the imaging light beams entering the center image height X0 is executed similarly on each light beam, out of the light beams Lf0 emitting from the conjugate point R0 of X0, passing through mutually different positions in the exit pupil surface PS being emitted with a mutually different angle. Moreover, the complex amplitude distribution of the first polarization direction and the complex amplitude distribution of the second polarization direction of the light beam Lfi are obtained and represented in the polar coordinates $(\rho, \theta)$ on the exit pupil surface PS as the first direction phase distribution WH0 $(\rho, \theta)$ and the second direction phase distribution WV0 $(\rho, \theta)$ of the imaging light beam entering the center image height X0.

Next, the computer computes the average phase distribution Wai$(\rho, \theta)$ of the evaluation target image point Xi and the average phase distribution WA0$(\rho, \theta)$ of the center image height X0 using the equations (1), (2) below.

$$WAi(\rho, \theta) = (WVi(\rho, \theta) + WHi(\rho, \theta))/2 \quad (1)$$

$$WA0(\rho, \theta) = (WV0(\rho, \theta) + WH0(\rho, \theta))/2 \quad (2)$$

In fact, the average phase distribution WAi $(\rho, \theta)$ is a median distribution obtained by making the coordinates WVi $(\rho, \theta)$ and WV0 $(\rho, \theta)$ coincide with each other.

Furthermore, the respective RMS values WAi and WA0 of the average phase distribution WAi $(\rho, \theta)$ and WA0 $(\rho, \theta)$ are obtained. These RMS values correspond to the wavefront aberration of the projection optical system PL.

Next, the computer compares WVi $(\rho, \theta)$, WHi $(\rho, \theta)$, WV0 $(\rho, \theta)$ and WH0 $(\rho, \theta)$ obtained in step S122, and computes a retardation distribution $\delta Wi (\rho, \theta)$ of the evaluation target image point Xi and the retardation distribution $\delta W0 (\rho, \theta)$ using the equations (3), (4) below.

$$\delta Wi(\rho, \theta) = WVi(\rho, \theta) - WHi(\rho, \theta) \quad (3)$$

$$\delta W0(\rho, \theta) = WV0(\rho, \theta) - WH0(\rho, \theta) \quad (4)$$

In other words, the retardation distribution $\delta Wi (\rho, \theta)$ is a distribution of the difference resulting from making the coordinates of WVi $(\rho, \theta)$ and WVi $(\rho, \theta)$ coincide and the retardation distribution $\delta W0 (\rho, \theta)$ is a distribution of the difference resulting from making the coordinates of WV0 $(\rho, \theta)$ and WV0 $(\rho, \theta)$ coincide.

Next, the respective RMS values $\delta Wi$ and $\delta W0$ of the retardation distribution $\delta Wi$ ($\Delta 2$) and $\delta W0$ $(\rho, \theta)$ are obtained. In general, larger retardation means a deterioration of the pattern image contrast. Hence, the RMS value of the retardation distribution $\delta Wi (\rho, \theta)$ and the RMS value of the retardation distribution $\delta W0 (\rho, \theta)$ show the deterioration of the image contrast at the evaluation target image point and the image contrast at the evaluation image point of the optical axis.

The computer refers to the retardation distribution $\delta W0$ to compute the RMS value $\delta W0$ and its average value A[$\delta W0$] in the exit pupil surface, then computes PSF value using the equation (5) below.

$$PSF = 1 - \frac{(4\pi^2 \times \delta w0^2 + 2\pi^2 \times A[\delta W0]^2)}{2} \quad (5)$$

The PSF value corresponds to an approximation of the maximum value of the point image intensification distribution caused by retardation. The smaller the PSF value, the worse is the deterioration of the point image intensification distribution.

In addition to WAi and WA0 obtained above, the following evaluation indices such as (a), (b), (c) and (d) below may be determined in the present embodiment.
  (a) RMS value of each term which is obtained by Zernike expansion of WAi($\rho$, $\theta$), and/or RMS value of each term obtained by grouping a plurality of terms obtained by Zernike expansion.
  (b) RMS value of each term which is obtained by Zernike expansion of WA0($\rho$, $\theta$), and/or RMS value of each term obtained by grouping a plurality of terms obtained by Zernike expansion.
  (c) RMS value of the average phase distribution WAi($\rho$, $\theta$), and/or RMS value of the average phase distribution $\delta$WAi of the evaluation target image point Xi based on the evaluation image point X0 on the optical axis.
  (d) RMS value of each term which is obtained by Zernike expansion of WAi($\rho$, $\theta$), and/or RMS value of each term obtained by grouping a plurality of terms obtained by Zernike expansion.

In step S13, judgment is made as to whether or not the optical performance computed in step S12 (for example, average phase distribution, retardation distribution, RMS and PSF values of these, etc.) are within the predetermined standards. If the optical performance is determined to be within the standard, the design data (design parameters) are output, which completes the designing step S1. On the other hand, if the optical performance computed is not within the predetermined standard, the program moves to step S14.

At step S14, at least some of the design parameters of the projection optical system are changed and the program moves to step S12. In the present embodiment, this loop is repeated until the optical performance computed becomes within the predetermined standard.

Here, in changing the design parameters, first only the parameters possessed by the optical system made of amorphous materials such as surface shape, distance between surfaces, eccentricity amount, tilt relative to optical axis, azimuth angle around optical axis, refractive index, distribution of birefringence, reflectance, clear aperture and common difference (tolerance) of the optical members (lens and reflection surface, etc.) forming the projection optical system should be changed to correct scalar component aberration of the optical performance of the projection optical system. Then, if necessary, parameters such as the structure of thin film, birefringence index and distribution of the optical member, azimuth angle around the optical axis may be changed to correct the scalar component and polarization component of the aberration.

When considering, for example, a case in which fluorite (calcium fluoride, $CaF_2$) is used as the isometric system crystal material, a method in which a refractive member with crystal axis [111] or a crystal axis optically equivalent to the crystal axis [111] being used as the optical axis is formed and has been used, hence, a larger amount of know-how for forming the refractive member has been accumulated compared to a case in which another crystal axis is used as the optical axis. Hence, in designing the projection optical system, as described in FIG. 5 for example, a method in which designing is executed with a state of having the optical axis of the optical member made of fluorite, coincides with the crystal axis [111] in the projection optical system, and adopts the azimuth angle $\theta_z$ as a design parameter of the optical member made of the fluorite.

As explained above, in the designing step S1, the design data of the projection optical system having an optical performance within the predetermined standard (surface shape, distance between surfaces, eccentricity amount, tilt relative to optical axis, azimuth angle around optical axis, refractive index, distribution of birefringence, reflectance, transmittance, transmittance distribution, clear aperture and common difference (tolerance) of the optical members (lens and reflection surface, etc.) or structure of the thin film to be formed on the surface of these optical members, namely, the number of thin film layers, thickness of each layer, material of each layer (absorption coefficient of each layer, if necessary) are obtained.

Figure 6:
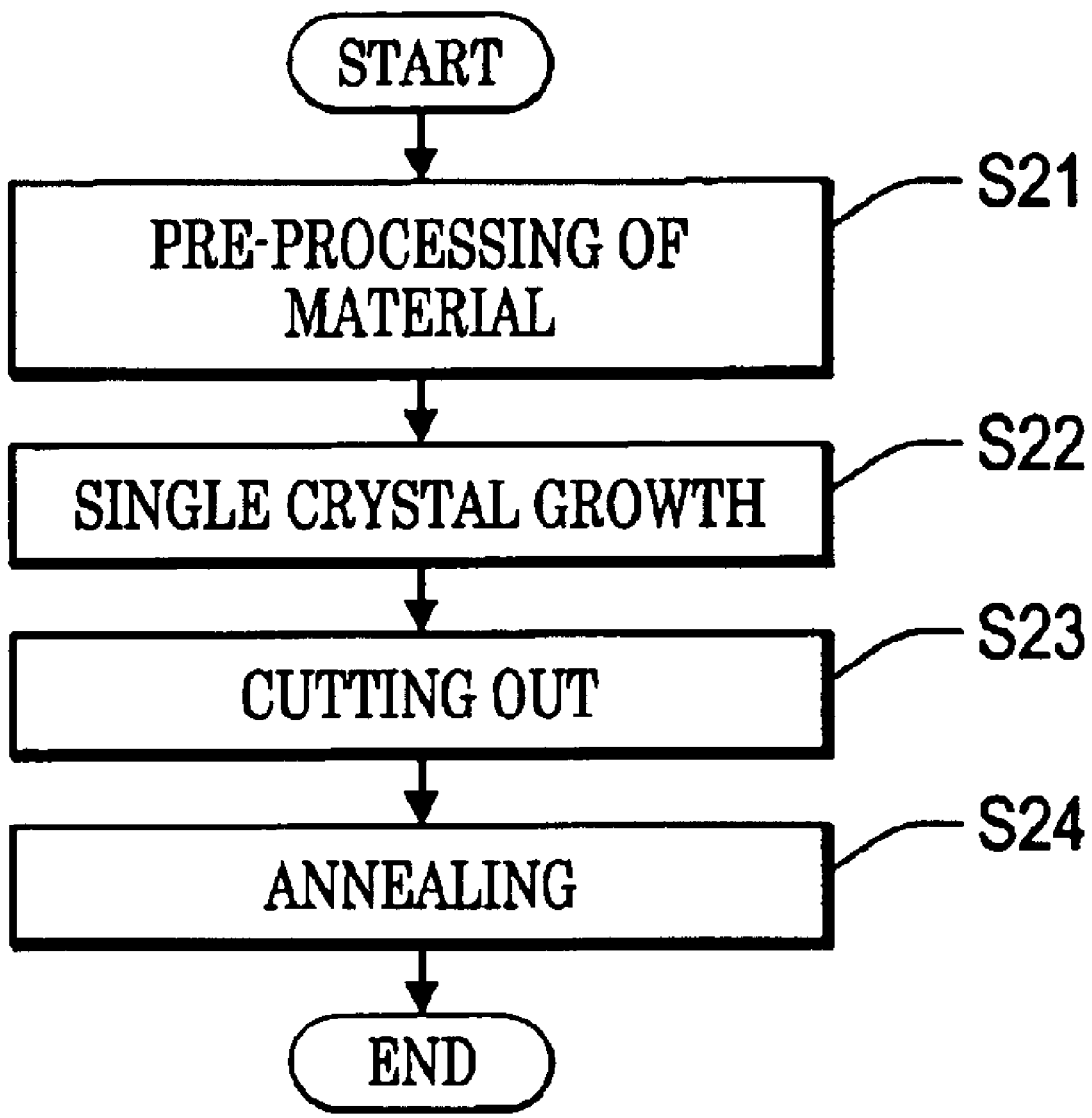
FIG. 6 is a flow chart describing in detail the crystal material preparation step S2 in the first embodiment of the present invention.

Next, the crystal material preparation step S2 will be described in reference to the flow chart of FIG. 6. FIG. 6 is a flow chart describing in detail the crystal material preparation step S2 for preparing the isometric system crystal material having a radiation transmissive property for the wavelength with which the projection optical system is used. Here, fluorite (calcium fluoride, $CaF_2$) and barium fluoride ($BaF_2$) can be such an isometric system crystal material.

In step S21, pre-processing or removing oxygen from the powdered raw material is executed. In developing a single fluorite crystal to be used in ultraviolet or vacuum ultraviolet regions by Bridgeman technique, highly pure artificial material is normally used. Furthermore, if only the raw material is melted and crystallized, the raw material may turn opaque, losing the transmissive property, so a scavenger is added and the material is heated to prevent the material from becoming opaque. Lead fluoride ($PbF_2$) is a typical example of a scavenger to be used in pre-processing and development of the single fluorite crystal. Here, a scavenger, in general, is an additive which reacts chemically to remove an impurity in the raw material. In the pre-processing of the present embodiment, first, a scavenger is added and thoroughly mixed with the highly pure powdered material. Then the mixture is heated above the melting point of the scavenger but below the melting point of the fluorite to accelerate the oxygen removal reaction.

Next, the mixture may be cooled at room temperature to form a sintered substance, or may be heated higher to melt the raw material once, then cooled to room temperature to form a polycrystalline substance. The sintered substance or polycrystalline substance for which the oxygen removal reaction is executed in the above manner is called a pre-processed product.

Next, in step S22, a single crystal ingot is obtained by executing further crystal growth on the pre-processed product. The crystal growth method is known to be roughly classified as melted liquid solidification, deposition from solution, deposition from gas and growth of a solid granule, but in the present embodiment, crystal growth is achieved using the vertical Bridgeman technique.

First, a pre-processed product is placed in a container, which is set on a predetermined position of a vertical Bridgeman apparatus (crystal growth furnace). Next, the pre-processed product in the container is heated to melt. After reaching the melting point of the pre-processed product and waiting until the elapsing of a predetermined time, the crystallization is started. When all the melted liquid is crystallized, the crystal is annealed to room temperature and the ingot is obtained.

In step S23, the ingot is cut in pieces to produce the disk material having the size and shape that is substantially the same as the optical members to be obtained in the refractive member formation step S4, which will be explained later. Here, if the optical member to be obtained in the refractive member formation step S4 is a lens, the shape of the disk material is preferably a thin cylinder shape with the aperture diameter and the thickness preferably determined to match the clear aperture (outer diameter) and the thickness in the direction of the optical axis of the lens.

In step S24, an annealing is performed on the disk material which was obtained from the single crystal fluorite ingot. By executing steps S21–S24, crystal material made of the single crystal fluorite is obtained.

Next, crystal measurement step S3 will be explained. In the crystal measurement step S3, measurement of the crystal axis of the crystal material which was prepared in the crystal material preparation step S2 is executed. To do this, a first measurement method in which the direction of the crystal axis is measured directly or a second measuring method in which direction of the crystal axis is determined indirectly by measuring the birefringence of the crystal material may be used. To begin with, the first measurement method in which the direction of the crystal axis is measured directly will be described.

Figure 7:
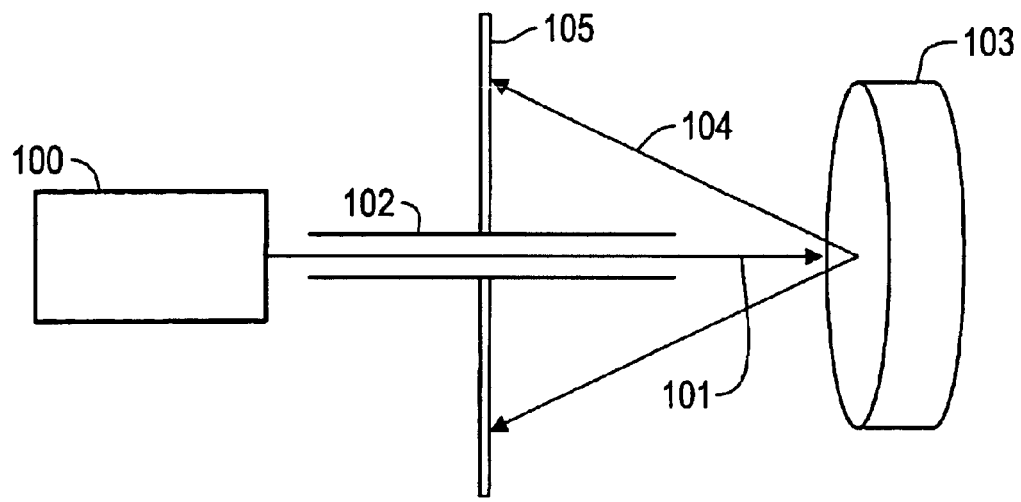
FIG. 7 is a drawing showing a schematic diagram of a Laue camera.

In the first measurement method, the crystal structure and the crystal axis of the crystal material are measured directly using an X-ray crystal analysis method. The Laue method is an example of such a measurement method. Hereafter, the Laue method is applied as the first measurement method and will be explained briefly using FIG. 7 as a reference. FIG. 7 is a schematic diagram of a Laue camera.

FIG. 7 shows that a Laue camera to be used for crystal axis measurement based on the Laue method comprises an X-ray source 100, a collimator 102 for guiding the X-rays from the X-ray source 100 to the crystal material 103 which is a sample, and an X-ray sensitive member 105 which is exposed by diffracted X-ray 104 being diffracted from the crystal material 103. Here, though unrepresented in FIG. 7, a pair of slits, facing each other is provided in the collimator 102 which penetrates the X-ray sensitive member 105.

In the first measuring method, first, an X-ray 101 is irradiated on the crystal material 103 which is prepared in the crystal material preparation step S2 to generate the diffracted X-ray 104 from the crystal material 103. Then, the X-ray sensitive member 105 such as an X-ray film and imaging plate are exposed with the diffracted X-ray 104 to form the visible image (the diffracted image) having a design corresponding to the crystal structure on the X-ray sensitive member 105. The diffracted image (the Laue image) will be a spotted image when the crystal material is a single crystal, which spots are called Laue spots. The crystal material used in the present embodiment is a fluorite with a known crystal structure, hence, the crystal axis direction is clearly determined by analyzing the Laue spots.

Here, the first measuring method which measures the crystal axis directly is not limited to the Laue method, but other X-ray crystal analysis mechanical techniques such as rotation or vibration methods in which the X-ray is irradiated while rotating or vibrating the crystal, Weissenberg method and precession method, as well as mechanical techniques such as a method utilizing the cleavage property of the crystal material, and a method in which a pressure image (or percussion image) with a unique shape appears on the crystal material surface by imposing a plastic deformation on the crystal material may be used.

Next, a brief explanation of the second measurement method in which the crystal axis direction is determined indirectly by measuring birefringence of the crystal material will be given. In the second measurement method, first, correspondence between crystal axis direction of the crystal material and the birefringence amount in that direction will be established. In this case, the crystal axis direction of the crystal material sample is measured using the aforementioned first measurement method. Moreover, the birefringence is measured for each crystal axis of the crystal material sample.

Figure 8:
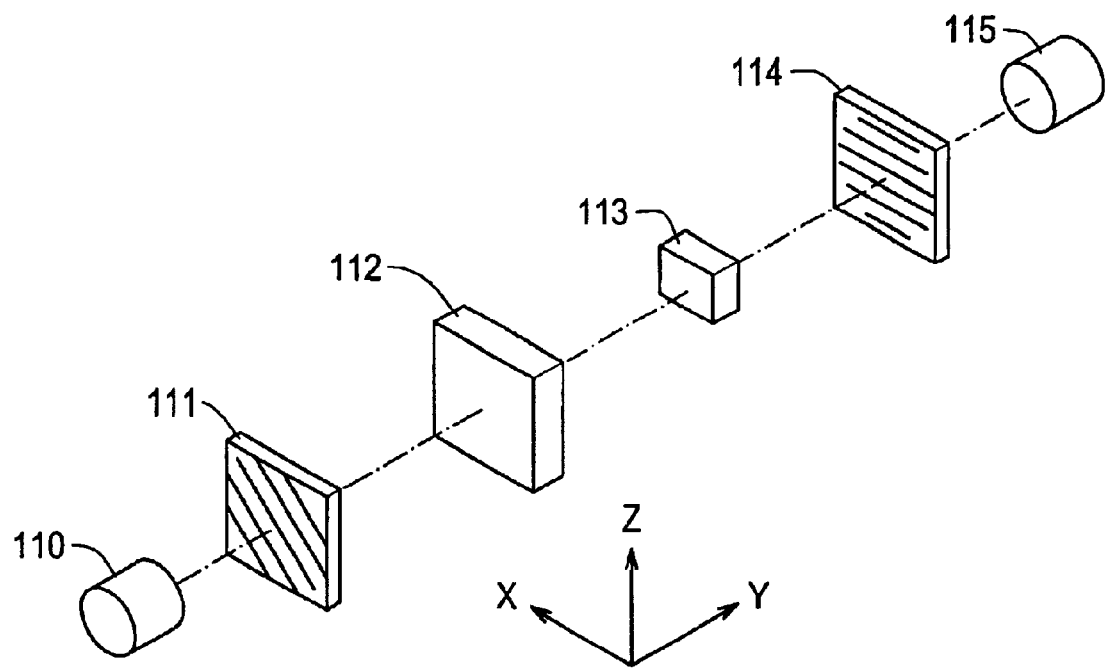
FIG. 8 is a drawing showing the schematic structure of a birefringence measurement instrument.

FIG. 8 describes a schematic structure of the birefringence measuring instrument. In FIG. 8, the light from the light source 110 is converted by a polarizer 111 to directly polarized light having a vibration surface tilted 45 degrees from the horizontal direction (X direction). The directly polarized light then receives phase modulation by photoelasticity modulator 112, and is irradiated on the crystal material sample 113. In other words, the directly polarized light with a variable phase enters the crystal material sample 113. The light passing through the crystal material sample 113 is led to an analyzer 114 which transmits only the polarized light having a vibration surface in horizontal direction (X direction), which is detected by the light detector 115.

The direction and the refractive index of the slow axis, and refractive index of fast axis may be obtained by measuring, with the change in the amount of phase delay, the amount of light being detected by the light detector 115 during predetermined phase delay caused by the photoelasticity modulator 112.

Here, if birefringence exists in the sample, the light phase of the two directly polarized light beams with a mutually perpendicular vibration surface (polarization surface) passing through the sample changes due to the difference in refractive index. In fact, the polarization phase of one light beam advances or delays relative to the other polarized light beam. The polarization direction in which the phase advances is called a fast axis and the polarization direction in which the phase delays is called a slow axis.

In the present embodiment, birefringence is measured for each crystal axis of the crystal material sample. The crystal axis of which became known by the aforementioned first measurement method, and the correspondence between the crystal axis direction and the birefringence amount in that direction will be established. In this case, a crystal axis such as [112], [210] and [211] may be used in addition to a typical axis such as [100], [110] and [111] as crystal axis of the crystal material to be measured. (Here, the crystal axes [010] and [001] are equivalent to the crystal axis [100], and the crystal axes [011] and [101] are equivalent to the crystal axis [110]). Moreover, an intermediate crystal axis of the crystal axis measured may be interpolated using a predetermined interpolation formula.

In the crystal axis measurement step S3 to which the second measurement method is applied, the birefringence of the crystal material prepared in the crystal material preparation step S2 will be measured. Moreover, because the correspondence between the crystal axis direction and the birefringence is already established, the crystal axis direction is computed, using the correspondence relationship, from the birefringence measured.

As explained above, the second method makes it possible to obtain the crystal axis direction of the crystal material without a direct measurement of the crystal axis direction.

Next the refractive member formation step S4 will be described. In the refractive member formation step S4, an optical member (lens and the like) is formed by processing the crystal material which is prepared in the crystal material preparation step S2. In this case either the crystal axis measurement step S3 or the refractive member formation step S4 may be executed first, and, for example, a first member formation method in which the refractive member formation step S4 is executed after the crystal measurement step S3, a second member formation method in which the refractive member formation step S4 is executed before the crystal measurement step S3, and a third member formation method in which the refractive member formation step S4 and the crystal measurement step S3 are executed concurrently are considered.

To begin with, the first member formation method will be explained. In the first member formation method, grinding and polishing will be performed on the disk material which is prepared in the crystal material preparation step S2 so that the optical member material may possess the design data including the parameters concerning the crystal axis direction obtained in the design step S1.

In this case, predetermined marks and the like will be placed on the optical member processed so that the crystal direction of the optical member will be easily recognized. To be more specific, the refractive members which make up the projection optical system will be manufactured using material which is the ground crystal material (typically disk material), after having the crystal direction measured in the crystal material preparation step S2. In fact, the refractive member having a predetermined lens surface shape is manufactured by polishing the surface of each lens, using a known polishing process, targeting the surface shape and distance between surfaces specified in the design data. In this case, the polishing process is repeated while measuring the error in the surface shape of each lens with an interferometer to make the surface shape of each lens as close to the target surface shape (best fit spherical surface shape) as possible. Once the surface shape error of each lens becomes within the predetermined range, the surface shape error of each lens will be measured using an accurate interferometer apparatus described in FIG. 9, for example.

Figure 9:
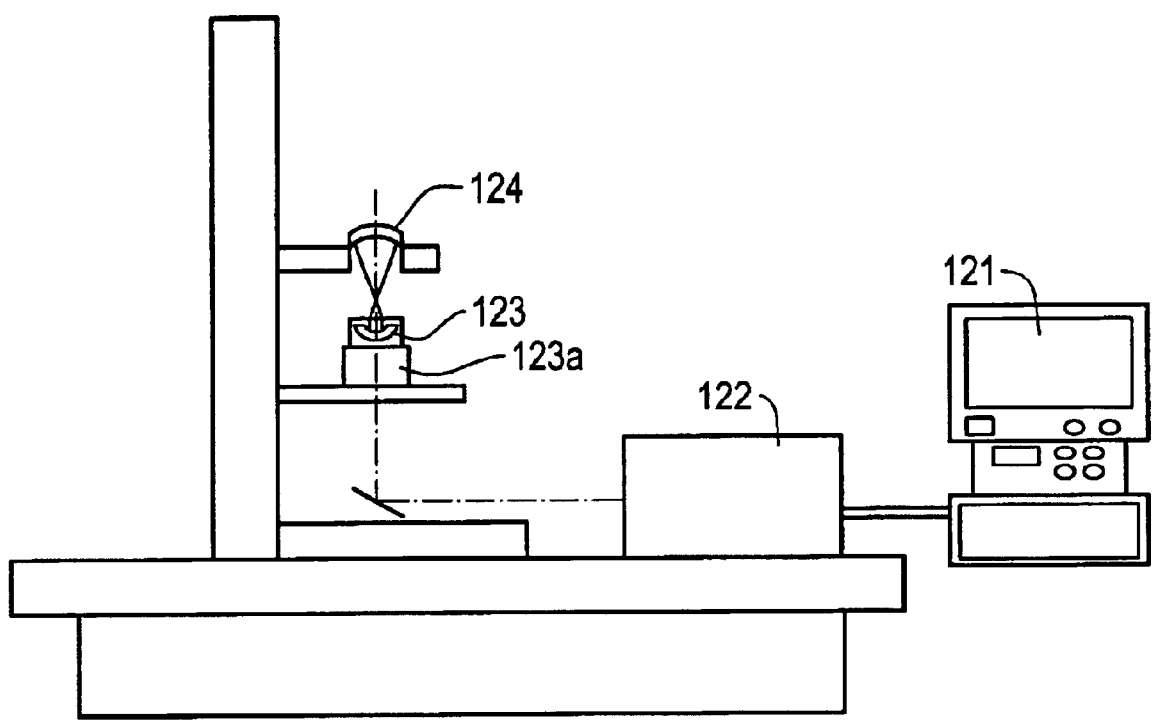
FIG. 9 is a drawing showing the schematic structure of an interferometer apparatus for measuring the error in the lens surface shape.

The interferometer of FIG. 9 is ideal for measuring surface shape of a spherical lens with a spherical design value. In FIG. 9, exiting light from the interferometer unit 122 which is controlled by the control system 121 enters the Fizeau lens 123 which is supported on the Fizeau stage 123a. Here, the light being reflected by the reference surface (Fizeau surface) of the Fizeau lens 123 becomes the reference light and returns to the interferometer unit 122. In FIG. 9, the Fizeau lens is shown as a single lens, but in reality, the Fizeau lens is made of a plurality of lenses (a lens group). Meanwhile, the light passing through Fizeau lens 123 becomes the measurement light and enters the target optical surface of the target lens 124.

The measurement light being reflected by the target optical surface of the target lens 124 returns to the interferometer unit 122 through the Fizeau lens 123. Based on the phase shift between the reference light and the measurement light which returned to the interferometer unit 122, the wavefront aberration relative to the standard surface of the target optical surface of the target lens 124, or ultimately, the surface shape error of the target lens 124 (the shift from the best fit spherical surface) is measured. For details of the measurement of the surface shape error of a spherical lens using an interferometer, U.S. Pat. Nos. 5,561,525 and 5,563,706, and Japanese Laid Open Patent Publication No. 10-154657 may be referred to. The disclosures of U.S. Pat. Nos. 5,561,525 and 5,563,706 are incorporated herein by reference in their entireties. Moreover, in measuring the surface shape error of an aspherical surface lens using an interferometer, a reference member having a planar reference surface, and an aspherical wavefront formation member which converts the light passing through the reference member into the aspherical wave with a predetermined shape should be provided on the Fizeau stage 113a in place of the Fizeau lens 113. Here, the aspherical wavefront formation member is made of a lens, zone plate or combination of these, and converts the plane wave from the reference member into the aspherical wavefront corresponding to the surface shape of the target optical surface which is an object of measurement. For the measurement method of such an aspherical surface lens, Japanese Laid Open Patent Publications such as 10-260020, 10-260024 and 11-6784 may be referred to.

In the first member formation method at the refractive member formation step S4, the measurement and polishing process will be repeated until the surface shape being measured falls within the predetermined range.

It is proposed in recent years that, in supporting the optical members such as lenses, a plurality of ridges are provided on the perimeter of the lens in order to minimize the stress on the lens, and that the plurality of ridges are kinematically supported by the lens cell which holds the lens (see U.S. Pat. No. 6,239,924). The disclosure of U.S. Pat. No. 6,239,924 is incorporated herein by reference in its entirety. Here, it is possible to show the crystal axis direction of the optical member after processing, by processing the plurality of ridges to coincide with the crystal axis direction of the optical members. Moreover, according the aforementioned optical member support method, the relationship of position and posture between the lens cell and the optical members are constant, hence, information (marks, etc.) showing the crystal axis direction of the optical member may be provided in the lens cell.

Next, the second member formation method will be explained. In the second member formation method, grinding and polishing processes will be performed on the disk material obtained in the crystal material preparation step S2. In doing this, the parameters such as shape, distances between surfaces and clear aperture (outer diameter) out of the design data obtained in designing step S1 are used for processing (not using parameters relating to crystal axis direction). Here, the measurement and polishing process will be repeated in the second member formation method, the same as the case of the first member formation method, until the surface shape becomes within the predetermined range. Moreover, the crystal axis direction of the processed optical member is measured using the aforementioned first measurement method, and the information concerning the measured crystal axis direction is provided to the processed optical member using a mark, for example.

In this manner, it is possible in the present embodiment to determine the crystal axis direction after processing.

Here, in the second member formation method, the measurement of the crystal axis direction was executed after the formation of a refractive member from the crystal material, but the measurement of the crystal axis direction may be executed during the formation of the refractive member (third member formation method).

Furthermore, in the assembly step S5, the position of each optical member is determined in such a manner that the distance of each processed optical member in the optical axis direction, vertical position of optical axis, and the rotational angle (azimuth angle) around the optical axis will be consistent with the design parameters obtained in the designing step S1, after which the projection optical system is assembled.

As explained above, the production method of the projection optical system of the first embodiment enables the determination of an installation angle of the crystal axis of the refractive member made of the isometric system crystal material to minimize the impact of birefringence while evaluating the impact of birefringence caused by the isometric system crystal material such as fluorite and barium fluoride on a plurality of polarization components, which assures excellent optical performance.

In the aforementioned first embodiment, the aberration of the projection optical system is reduced by optimizing the crystal axis direction of the refractive member made of the isometric system crystal material, but there may be cases when optimization of the crystal axis direction alone does not satisfy the required optical performance. Next, as a second embodiment, a production method of a projection optical system which compensates for the worsening of the optical performance caused by the intrinsic birefringence possessed by the isometric system refractive members made of the isometric system crystal material by using an amorphous refractive member will be described.

Figure 10:
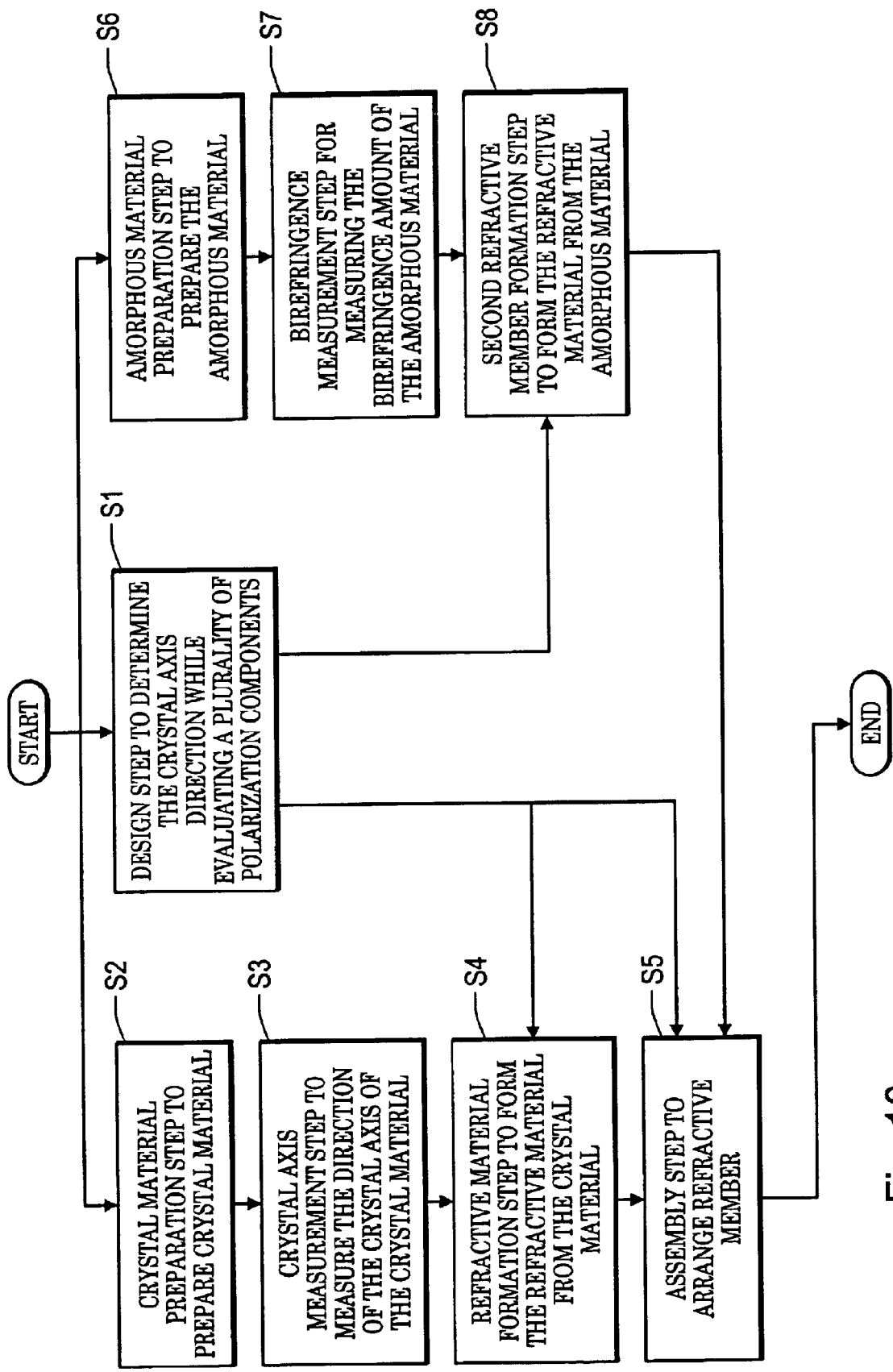
FIG. 10 is a flow chart of a production method of the projection optical system of a second embodiment of the present invention.

Before explaining in detail the production method of the projection optical system according to the present embodiment, an outline will be described using FIG. 10 to make the understanding easier. FIG. 10 is a flow chart illustrating the outline of the production method of the projection optical system according to the second embodiment of the present invention.

FIG. 10 shows that the production method of a projection optical system in the second embodiment includes, in addition to a designing step S1, crystal material preparation step S2, crystal axis measurement step S3, refractive member formation step S4, and assembly step S5 of the first embodiment, amorphous material preparation step S6, birefringence amount measurement step S7, and a second refractive member formation step S8.

Here, the first refractive member formation step S4 is the same as the first refractive member formation step S4 of the first embodiment, but in order to avoid confusion with the second refractive member formation step S8 in the present embodiment, the first refractive member formation step S4 is used instead of the refractive member formation step S4 in the present embodiment.

Hereafter differences between the production method of the first embodiment and the second embodiment will be explained.

First, in the designing step S1, in addition to the parameters in the first embodiment, the birefringence amount of amorphous material such as silica or fluoride doped silica is used as a parameter of the projection optical system to be optimized. For example, an optical system with a plurality of refractive members 11, 12 made of an isometric system crystal material and a refractive member 13 made of amorphous material such as silica or fluoride doped silica will be used as a projection optical system.

Here, in the first refractive member 11 and the second refractive member 12 made of fluorite, for example, the crystal axis [111] arranged to coincide with the optical axis Ax, and the second refractive member 12 is rotated 60 degrees around the optical axis Ax relative to the first refractive member 11 in the XY-plane. FIG. 11(b) shows the impact of the birefringence due to the first refractive member 11 and FIG. 11(b) shows the impact of the birefringence due to the second refractive member 12.

FIG. 11(b)–FIG. 11(e) show the distribution of the birefringence index relative to the incident angle of the light beam with a scale in which each of the six concentric circles denoted by broken lines in the figure represents 10 degrees. Hence, the innermost circle represents the region corresponding to the incident angle of 10 degrees relative to the optical axis, while the outermost circle represents the region corresponding to the incident angle of 60 degrees relative to the optical axis. Moreover, the black circle represents a region with a relatively large refractive index without birefringence and the white circle represents a region with relatively small refractive index without birefringence. On the other hand, bold circles and bold arrows represent the direction of a relatively large refractive index (direction of slow axis) in the region with birefringence, while the non-bold circles and non-bold arrows represent the direction of a relatively small refractive index (fast axis) in the region with birefringence.

FIG. 11(b) and FIG. 11(c) show that, in the first and the second refractive members 11, 12, the region corresponding to the crystal axis [111] coinciding with the optical axis Ax becomes a region with the relatively small refractive index without birefringence. Moreover, the region corresponding to the crystal axes [100], [010] and [001] becomes the region with a relatively large refractive index without birefringence. Furthermore, the region corresponding to the crystal axes [110], [101], [011] becomes a birefringence region with a relatively small refractive index against polarization in the tangential direction and a relative large refractive index against polarization in the radial direction.

In each refractive member 11, 12, it is found that the largest impact of birefringence is felt in the region making 35.26 degrees from the optical axis (the angle between the crystal axis [111] and the crystal axis [110]).

FIG. 11(d) shows the combined impact of birefringence of the first and the second refractive members 11, 12 with the relative rotational angle of 60 degrees around the optical axis. FIG. 11(d) clearly shows that for the totality of the first and the second refractive members 11, 12, the impact of the crystal axes [110], [101], [011] with the largest birefringence is reduced. However, in the region of 35.26 degrees from the optical axis, namely the region relatively close to the optical axis, the birefringence region where a refractive index against tangential polarization is smaller than the refractive index against radial polarization remains. In other words, with a technique to adjust the angle of the crystal axis of the refractive member made of the isometric system crystal material, some impact of birefringence may be felt depending on the angle of the crystal axis, and may not be able to assure sufficiently satisfactory imaging performance (optical performance).

Hence, in the present embodiment, a birefringence distribution is provided to the refractive member 13 which is made of the amorphous material unlike the refractive members 11, 12, which are made of the isometric system crystal material, to cancel the birefringence caused by refractive members 11, 12. The birefringence distribution of refractive member 13 is shown in FIG. 11(e). A technique to provide the desired birefringence distribution to a refractive member made of the amorphous material will be explained later in the amorphous material preparation step S6.

In the aforementioned designing step S1, the birefringence distribution of the refractive member made of such amorphous material will be computed. In fact, the birefringence distribution parameters of the refractive members are added to the design parameters (design data) in the designing step S1 of the first embodiment, and steps S11–S14 will be executed as in the first embodiment.

In the present embodiment, it is possible to use a technique in which the parameters other than the parameter of the birefringence distribution due to the refractive member made of amorphous material are optimized (the same parameters as the parameters in the first embodiment), and the residual aberration computed by these optimized parameters is corrected by optimizing the parameter of the birefringence distribution due to the refractive member made of amorphous material.

Moreover, it is possible, as in the case of the first embodiment, to use a method in which only the first parameters possessed by the optical system made of amorphous materials such as surface shape, distance between surfaces, eccentricity amount, tilt relative to optical axis, azimuth angle around optical axis, refractive index, distribution of birefringence, reflectance, clear aperture and common difference (tolerance) of the optical members (lens and reflection surface, etc.) forming the projection optical system are changed to correct the scalar component aberration of the optical performance of the projection optical system. Then, parameters such as the structure of thin film, the distribution of birefringence of the optical member, azimuth angle around the optical axis, etc. may be changed to correct the scalar component and polarization component of aberration.

Here, if the scalar aberration remains in addition to the polarization aberration as a result of optimizing the crystal axis direction of the refractive member made of the isometric system crystal material, an aspherical surface may be formed on the optical surface (lens surface, reflection surface) of some optical member out of the optical members forming the projection optical system to correct the scalar aberration. An aspherical surface (typically rotationally asymmetric shape relative to the optical axis) for correcting the residual aberration which is computed in step S526 in the assembly step S5 to be described later, may be used as the aforementioned aspherical surface, or another aspherical surface may be provided. If another aspherical surface is provided, the aspherical surface shape (rotationally asymmetric shape relative to optical axis) should be included as a design parameter in the aforementioned designing step S1.

Next, the amorphous material preparation step S6 will be described. In the present embodiment, silica or fluoride doped silica (hereafter modified silica) are used as the amorphous material, but such silica or improved silica, unlike optical crystal, does not generate birefringence under ideal conditions.

However, in the case of silica or modified silica, if impurities are mixed in or if temperature distribution occurs during cooling, the silica being formed at high temperature, birefringence will be generated due to internal stress. Hence, in the present embodiment, desired birefringence distribution is generated in the silica or modified silica by adjusting the amount or types of the impurity to be mixed in the ingot, or by adjusting the thermal history (temperature program).

Here, possible impurities are OH, Cl, metal impurities and dissolved gas. In the case of the direct method, OH of more than several hundred ppm, followed by Cl of several dozen ppm are thought to be dominant, judging from the amount being mixed in. When such impurities mix in the ingot, the shrinkage of the part where the impurities mix in becomes large and internal stress occurs due to the difference in shrinkage, causing stress birefringence.

Moreover, the temperature program exists independent of production methods such as the aforementioned direct method, VAD (vapor axial deposition), sol-gel method and plasma burner method.

In the present embodiment, an Si compound gas ($O_2$, $H_2$ and other carrier gas are used to deliver Si compound gas) which is a raw material for silica, and combustion gas ($O_2$ gas and $H_2$ gas) for heating are discharged from the burner to synthesize the silica using a flame hydrolysis deposition method in which the silica is deposited in the flame, and ingot is obtained. Then the ingot is cut out to obtain the disk material, which is annealed.

In the present embodiment, the synthesis conditions at the time of silica synthesis and the temperature program conditions at the time of annealing are adjusted so that the birefringence distribution of the refractive member made of silica becomes the birefringence distribution computed in the designing step S1. The parameters for synthesis conditions at this time may be burner structure, gas flow amount, exhaust gas amount, target swing motion pattern and the like. Here, such synthesis conditions or anneal conditions may be determined through trial and error, or through rules determined by previous experience.

Here, in the present embodiment, the symmetry axis of birefringence of the amorphous material made of silica or modified silica, for example, and the optical axis of the refractive member formed from the aforementioned amorphous material are made to substantially coincide. For this reason, during the time of the silica synthesis, the ingot is rotated to make the impurity concentration and material distribution to have a central symmetry. Because the central position (substantially coinciding with the rotational center at the time of synthesis) of the ingot becomes the center of the stress distribution, the refractive member is preferably formed using the central position as the standard (by coinciding the central position and the optical axis), in the second refractive member formation step to be explained later. For this reason, the central position of the material cut out from the ingot is preferably marked.

Furthermore, during annealing, the material cut out from the ingot should be shaped into a cylindrical disk and heated in the center of the furnace with the central symmetric temperature distribution. At this time, the disk material is preferably rotated during the anneal process.

Next, the birefringence amount measurement step S7 will be explained. In this birefringence amount measurement step S7, the birefringence distribution of the amorphous material made of silica or modified silica obtained from the amorphous material preparation step S6 will be measured. In measuring the birefringence distribution, the birefringence measurement instrument shown in FIG. 8 may be used, and the birefringence measurement method is the same as previously explained, hence an explanation will be omitted here. Here, information concerning the position of the symmetry axis of the birefringence distribution obtained by the measurement is preferably provided to the amorphous material by marking the disk material, for example.

Figure 12:
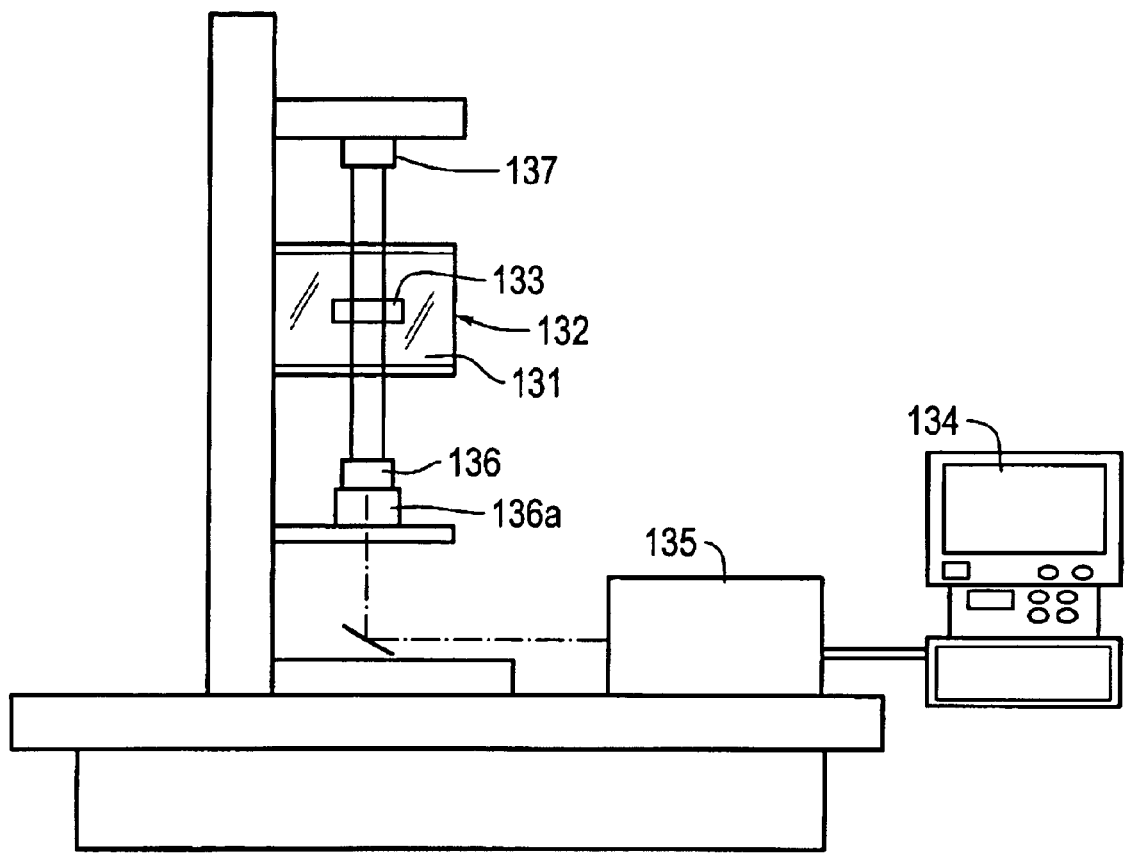
FIG. 12 is a drawing showing the schematic structure of an interferometer apparatus for measuring the absolute value and distribution of refractive index.

Moreover, the refractive index of the amorphous material is preferably measured also during the birefringence amount measurement step. Hereafter a method of measuring absolute value of the refractive index and the refractive index distribution will be described using FIG. 12 as reference. FIG. 12 is a schematic diagram of an interferometer for measuring the absolute value of the refractive index and the refractive index distribution.

In FIG. 12, an amorphous material 133, a target object, is placed on a predetermined position in the sample case 132 which is filled with oil 131. Moreover, the exit light beam from the interferometer unit 135 which is controlled by the control system 134 is incident to the Fizeau flat (Fizeau surface) 136 which is supported by the Fizeau stage 136a.

Here, the light beam being reflected by the Fizeau flat 136 becomes a reference light beam and returns to the interferometer unit 135. On the other hand, the light beam passing through the Fizeau flat 136, becomes the measurement light beam and is incident to the target object 133 in the sample case 132. The light beam passing through the target object 133 is reflected by the reflection flat 137 and returns to the interferometer unit 135 through the target object 133 and the Fizeau flat 136. In this manner, the wavefront aberration caused by the refractive index distribution of the amorphous optical member 133 is measured based on the phase shift between the reference light beam and the measurement light beam. Here, U.S. Pat. No. 6,025,955 may be referred to for details concerning the measurement using interferometer with the uniform refractive index. The disclosure of U.S. Pat. No. 6,025,955 is incorporated herein by reference in its entirety.

Next, the second refractive member formation step S8 in which refractive member is formed from the amorphous material will be explained. In the second refractive member formation step S8, each lens which makes up the projection optical system will be manufactured using material which is the ground amorphous material (typically disk material), the birefringence distribution and the refractive index distribution of which are measured in the birefringence amount measurement step S7. In fact, the refractive member having a predetermined lens surface shape is manufactured by polishing the surface of each lens, using a known polishing process, targeting the surface shape and distance between surfaces specified in the design data. In this second refractive member formation step, as in the case of the first refractive member formation step (the refractive member formation step S4 in the first embodiment), the polishing process is repeated while measuring the error in the surface shape of each lens with an interferometer to make the surface shape of each lens as close to the target surface shape (best fit spherical surface shape) as possible. Once the surface shape error of each lens becomes within the predetermined range, the surface shape error of each lens will be measured using an accurate interferometer apparatus described in FIG. 9, for example, as in the case of the first refractive member formation step (refractive member formation step S4 in the first embodiment). In the second refractive member formation step S8 also, the measurement and polishing will be repeated until the measured surface shape becomes within the predetermined range.

Figure 13:
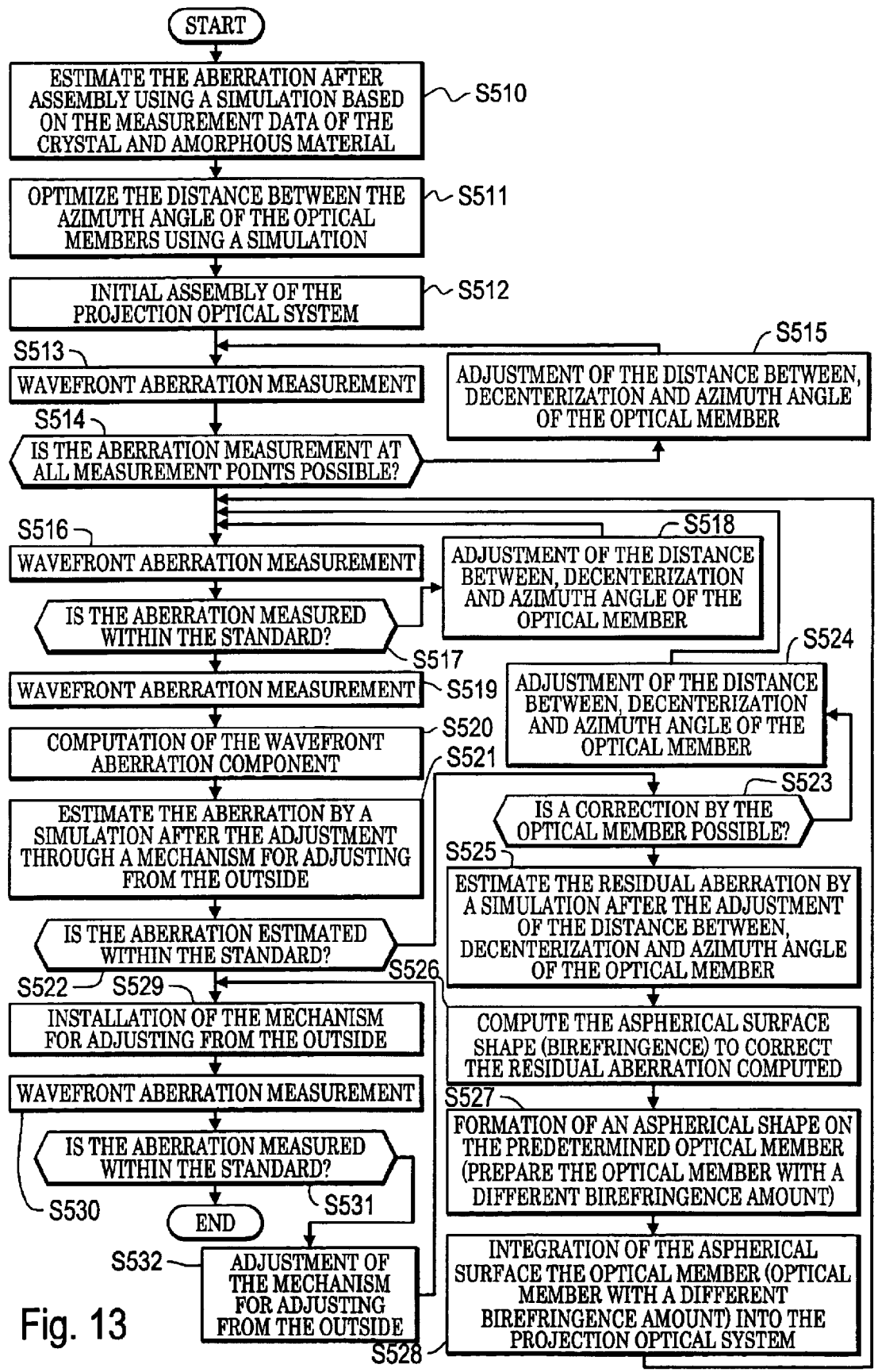
FIG. 13 is a flow chart describing in detail an assembly step S5 of a production method of the projection optical system of the second embodiment of the present invention.

Next, the assembly step S5 in the second embodiment will be described using FIG. 13 as a reference. FIG. 13 is a flow chart describing in detail a production method of a projection optical system of the second embodiment. While the decision steps in the flow chart, in general, are represented by a rhombus, in FIG. 13 the decision steps (for example S514, S517, S522, S523 and S532 in FIG. 13) are represented by a hexagon for convenience sake.

In step S510, the optical performance of an assembled projection optical system, based on the information concerning crystal axis of refractive member made of crystal material which is measured in the crystal axis measurement step S3, the information measured in the first refractive member formation step S4 concerning surface shape, the distance between surfaces of the processed refractive member, the information concerning birefringence amount and distribution thereof and the refractive index of the refractive member made of amorphous material measured in the birefringence measurement step S7, and information measured in the second refractive member formation step S8 concerning surface shape, the distance between the surfaces of the processed refractive member, using the optical member having these parameters (surface shape, distances between surface, refractive index, refractive index distribution, crystal axis direction, birefringence amount, birefringence distribution, etc) are estimated using a computer simulation.

To be more specific, first, parameters of each optical member in the projection optical system are set according to the design data obtained at the designing step S1, then the optical performance of the projection optical system will be computed by adding the aforementioned information to each optical member. Here, the aforementioned average phase distribution, retardation distribution as well as RMS value and PSF value of these distributions may be used as the evaluation values of the optical performance of the projection optical system.

In step S511, the optical performance of the projection optical system PL when distances, eccentricity amount relative to the optical axis and azimuth angle around the optical axis (installation angle) of each optical member which are substantially assembled by simulation are changed is obtained through simulation. Because the optical members produced through the aforementioned steps S2–S4 and S6–S8 contain production errors such as uneven refractive index distribution and birefringence distribution, surface shape, distance between surfaces and crystal axis direction and the like, the characteristics of the projection optical system PL change even when only the azimuth angle (installation angle) around the optical axis of the optical member is changed.

In step S512, optical members are installed in the lens barrel which holds each optical member according to the distance, eccentricity amount and installation angle of the optimized optical member based on the distance, eccentricity amount and installation angle of the optical member which is optimized through simulation.

Figure 14:
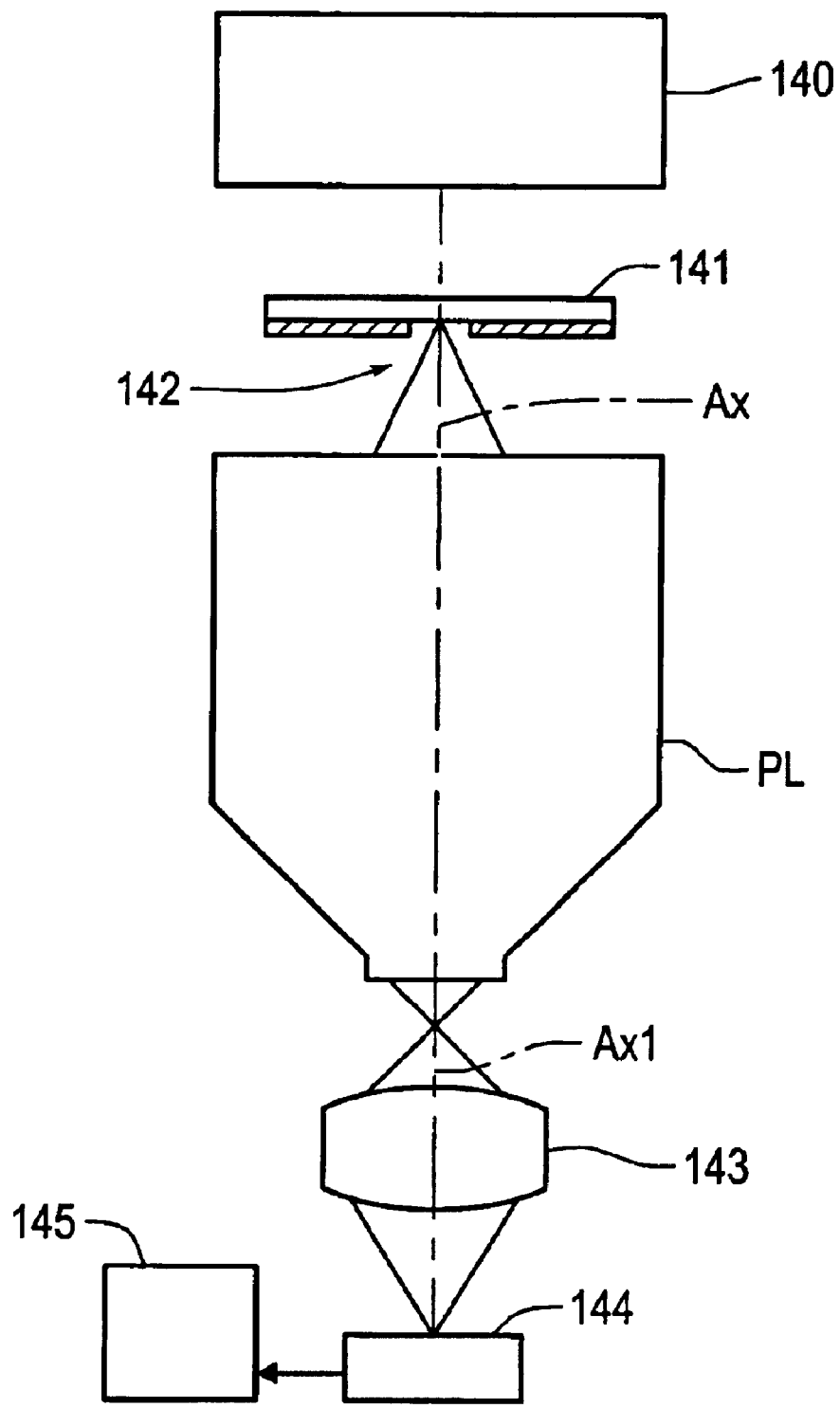
FIG. 14 is a drawing describing the schematic structure of the aberration measurement apparatus using a principle of the phase recovery method.

In step S513, the wavefront aberration is measured using an aberration measurement instrument described in FIG. 14. The aberration measurement instrument shown in FIG. 14 uses a principle of phase retrieval method. In FIG. 14, the position of the pattern formation plane is determined on the pattern plate 141 in the object plane of the projection optical system PL, and, at the same time, the position of the front focal point of the object optical system 143 is determined on the imaging position (image plane) of the projection optical system PL. Then, the ideal spherical surface wavefront is generated by irradiating a pinhole 142 which is formed on the pattern plate 141, by the illumination light emitted from the illumination light source 140. When this ideal spherical surface wavefront passes through the projection optical system PL, the impact from the residual aberration in the projection optical system PL changes the wavefront pattern of the ideal spherical wavefront. The image pickup signals which are obtained by imaging the image produced by image pickup element 144 after gathering, through the object optical system 143, the light beams passing through the projection optical system PL change the intensity distribution depending on residual aberration of the projection optical system PL. Hence, performing a predetermined algorithm based on the phase retrieval method on the image signals containing information on the residual aberration of the projection optical system PL, the residual aberration of the projection optical system will be obtained. U.S. Pat. No. 4,309,602, the disclosure of which is incorporated herein by reference in its entirety, may be referred to for details of the aforementioned phase retrieval method.

Here, in order to measure the residual aberration in the projection optical system PL, the wavefront aberration needs to be measured in a state where the pinhole 142 is arranged on a plurality of measurement points (several dozen points, for example) in the surface perpendicular to the optical axis Ax, in addition to the case in which the pinholes being formed in the pattern plate 141 are arranged on the optical axis Ax in the projection optical system PL, as described in FIG. 14. Hence, in the present step, the wavefront aberrations are measured while the positions of the pinhole 142 are moved to measurement points in the surface perpendicular to the optical axis Ax. Here, instead of moving the pattern plate 141, a plurality of pinholes may be formed on the pattern plate 141 and a member, to regulate the illumination region in the illumination light source 140, may be provided so that the wavefront aberration is measured by illuminating one pinhole at a time.

In step S514, a determination is made as to whether or not the measurement of wavefront aberration is possible at all the measurement points on the image surface of the projection optical system. The aberration measurement instrument of FIG. 14 measures the residual aberration of the projection optical system PL by performing a predetermined algorithm based on the phase retrieval method on the image pickup signals obtained by the imaging through the image pickup element 144, but the phase retrieval method fails to retrieve the wavefront if the residual aberration of the projection optical system is too large.

Hence, a determination as to whether or not the measurement of the wavefront aberration is possible at all the measurement points is made at the step S514. If a determination is made that there is even one measurement point where aberration measurement is impossible the determination result is NG, and the program moves to step S515.

In step S515, at least one adjustment out of the adjustment of distance between each optical member in the optical direction, the adjustment of positions of each optical member in the surface perpendicular to the optical axis, and the azimuth angle around the optical axis of each optical member is executed to adjust the optical performance of the projection optical system, after which the program moves to step S513.

These steps S513–S515 will be repeatedly executed until a determination is made in step S514 that the aberration measurement is possible at all the measurement points. If determination is made in step S514 that aberration measurement is possible at all the measurement points, the determination result is OK, and the program advances to step S516.

At step S516, the wavefront aberration is measured at all the measurement points using the aforementioned aberration measurement instrument.

At step S517, a determination is made as to whether or not the wavefront aberrations measured in step S516 are within a predetermined range. The step S517 is a step to determine whether or not the optical performance of the projection system is adjusted well enough for a more precise aberration measurement to be explained later. If the determination result is NG the program will move to step S518, and if the determination result is OK the program advances to S519.

In step S518, at least one adjustment out of the adjustment of distance between each optical member in the optical direction, the adjustment of the positions of each optical member in the surface perpendicular to the optical axis, and the azimuth angle around the optical axis of each optical member is executed to adjust the optical performance of the projection optical system, after which the program moves to step S516.

When the optical performance of the projection optical system is adjusted well enough to have a highly precise aberration measurement executed by repeating the aforementioned steps S516–S518, the program advances to step S519.

In step S519, a high precision wavefront aberration measurement is conducted using a Fizeau interferometer method wavefront aberration measuring instrument disclosed in U.S. Pat. No. 5,898,501 of PDI (phase diffraction interferometer) method wavefront aberration measuring instrument which is disclosed in Japanese Laid Pat. Publication 2000-97616, for example. The disclosure of U.S. Pat. No. 5,898,501 is incorporated herein by reference in its entirety.

At this time, in the present embodiment, the wavefront aberration is measured for each of a plurality of polarization components for the projection optical system. The aforementioned XY polarization component or Rθ polarization component may be used. Here, in the present embodiment, instead of, or in addition to the wavefront aberration measurement of each of a plurality of polarization components, measurement of non-polarization components (such as simultaneous measurement of the aforementioned XY polarization component and Rθ polarization component) may be executed.

In step S520, the expansion coefficient for each term is obtained for the wavefront aberration measured by fitting the circle polynomial of Zernike Zn ($\rho$, $\theta$), and each component of the wavefront aberration (each component of the wavefront aberration for each polarization, if necessary) is computed.

Next, the wavefront aberration fitting using the circle polynomial of Zernike Zn ($\rho$, $\theta$) will be explained briefly. First, a polar coordinate is defined on the exit surface and the wavefront aberration is represented as W ($\rho$, $\theta$). Here, $\rho$ is a normalized pupil radius assuming the exit pupil radius to be 1, and $\theta$ is a polar angle in the polar coordinate. Now, the wavefront aberration W ($\rho$, $\theta$) is expanded using the circle polynomial of Zernike Zn W ($\rho$, $\theta$) as an equation (6) below.

$$W(\rho, \theta) = \Sigma CnZn(\rho, \theta) = C1Z1(\rho, \theta) + C2Z2(\rho, \theta) + \ldots + CnZn(\rho, \theta) \quad (6)$$

The circle polynomial relating to each term of the circle polynomial of Zernike Zn ($\rho$, $\theta$) is well known, hence a detailed explanation is omitted here.

Now, a mechanism for adjusting from outside is provided for the projection optical system of the present embodiment, enabling adjustment of the optical performance even after mounting of the projection optical system to the main body of the exposure apparatus. A mechanism to adjust the position and posture of the optical members forming the projection optical system by an actuator or manually, and a mechanism enabling switching of the optical member positioned closest to the first surface or the second surface with an optical member possessing different optical characteristics than the optical member are examples of such a mechanism for adjusting from outside.

Hereafter a mechanism for adjusting from outside will be explained briefly using FIG. 15 as a reference. In the present embodiment, the projection optical system is structured in such a manner that a plurality of optical members 21–27 are arranged along the optical axis direction (Z direction), and the optical member 21 closest to the first surface R side and the optical member 22 closest to the second surface W side are made to be exchangeable for the main body of the projection optical system PL. Moreover, the positions of the five lenses 23–27 out of a plurality of optical members are made to be adjustable about the rotational direction (θx, θy direction) around the optical axis direction (Z direction) and the direction perpendicular to the optical axis (XY direction) by the respective actuator 28–32. Here, the lens cell 33 which holds the optical member closest the second surface W side is structured in such a manner that it may be removed from the part 34 of the lens barrel forming the projection optical system PL.

In the present embodiment, the position of five lenses are made to be adjustable respectively in the Z direction, θx direction and θy direction, hence, five rotational symmetric aberrations (magnification, low order distortion, low order coma aberration, low order field curvature and low order spherical aberration) and five decentered aberrations (two types of decentered distortion, decentered coma aberration, decentered astigmatism, and decentered spherical aberration) are correctable. Here, in the present embodiment, the position of five lenses are adjustable, but the number of lenses, the position of which are adjustable, is not limited to five.

Moreover, in the present embodiment, at least one of the optical members closest to the first surface R side and the optical member closest to the second surface W side is exchangeable with an optical member having a different birefringence amount and birefringence distribution than that optical member. Here, an isometric system crystal material (fluorite, barium fluoride, for example) which is manufactured by the same production method as the aforementioned crystal material preparation in step S2, crystal axis measurement in step S3 and first refractive member formation in step S4, or an amorphous material (silica, modified silica) which is manufactured by the same production method as the aforementioned amorphous material preparation in step S6, birefringence amount measurement in step S7 and second refractive member formation in step S8, may be used as the optical member.

Moreover, for the optical member closest to the first surface R side and/or the optical member closest to the second surface W side, their positions in the XY plane, their inclination in θx,θy directions and positions in the Z direction are preferably made adjustable in the projection optical system PL. Such structure enables correction of the rotational asymmetric polarization aberration by adjusting the position and posture of the optical members 21, 22 possessing a predetermined birefringence distribution if the rotational asymmetric polarization aberration, for example, occurs in the projection optical system PL. Here, if the optical member closest to the second surface W side is a parallel plane plate, decentered coma aberration may be corrected by adjusting the inclination in θx and θy directions. In addition, by adjusting in such a manner to change the refractive power of the optical member closest to the second surface W side (exchanging with an optical member with a different refractive power), a Petzval sum of the projection optical system PL may be adjusted.

Moreover, by providing some optical members forming the projection optical system PL with a toric surface shape optical surface (refraction surface, reflection surface, etc.), which are not represented, and by adjusting the azimuth angle of the optical member around the optical axis AX, the astigmatism on the optical axis may be corrected.

Now, in step S521 in FIG. 13, if the projection optical system assumes the value of each component of the wavefront aberration computed in step S520, the wavefront aberration after adjustment using the aforementioned mechanism for adjusting from the outside is estimated by simulation. To be more specific, the value of each component of the wavefront aberration computed is used as starting values, and the parameters mechanism for adjusting from the outside (shift amount of lenses 23–27, surface shapes, thickness, refractive index, refractive index distribution, birefringence amount, birefringence distribution of optical member 21 and/or 22) are optimized, and the aberrations of the projection optical system after optimization are obtained through simulation.

Here, if an optical member with a different birefringence amount and distribution is not exchanged in the mechanism for adjusting from the outside, only the scalar component of wavefront aberration may be estimated.

In step S522, a determination is made as to whether or not the aberrations estimated through simulation are within a predetermined standard. If the determination result of step S522 is NG, the program moves to S523, but if the determination result of step S522 is OK, the program advances to S529.

In step S523, a determination is made as to whether the aberrations estimated in step S522 are correctable by adjusting the distance between each optical member in the optical axis direction, adjusting the position of each optical member in the surface perpendicular to the optical axis (decenterization adjustment), and by adjusting the azimuth angle of each optical member around the optical axis. Here, if the determination result of step S523 is NG, the program moves to step S524, and if the determination result is OK, the program moves to step S525.

In step S524, the aberrations in the projection optical system are corrected by executing at least one adjustment out of the adjustment of distance between each optical member in the optical axis direction, adjustment of position of each optical member in the surface perpendicular to the optical axis (decentrization adjustment) and adjustment of azimuth angle of each optical member around the optical axis, after which the program moves to step S516 where the wavefront aberration measurement takes place.

The steps S516–S524 are the steps in which the extent of the optical performance of the projection optical system to be achieved without forming an aspherical surface on the optical member of the projection optical system or without exchanging an optical member with a different birefringence distribution is determined.

Here, in the step S523, if a determination is made that correction of the aberration which is outside of the standard is impossible only by adjustment of distances between the optical members, decentrization adjustment and azimuth angle adjustment, then the program moves to step S525 below.

In step S525, the wavefront aberrations (or each component of the wavefront aberrations, and wavefront aberrations for each polarization beam, if necessary) after adjustment of distance between each optical member in the optical axis direction, adjustment of the position of each optical member in the surface perpendicular to the optical axis (decentrization adjustment) and adjustment of the azimuth angle of each optical member around the optical axis are estimated by simulation.

To be more specific, using each component of the wavefront aberrations computed as starting values, the adjustment amount of the distances between each optical member, decentrization adjustment amount and azimuth angle adjustment amount are optimized as parameters, and aberrations of the projection optical system after optimization are obtained.

In step S526, the aspherical surface shape and/or the birefringence distribution which can correct the residual aberration (residual component of aberration) which was estimated in step S525 are computed. In step S526, the optical members which change the optical members forming an aspherical surface shape and/or the birefringence distribution based on the aberrations to be corrected are selected.

Figure 16:
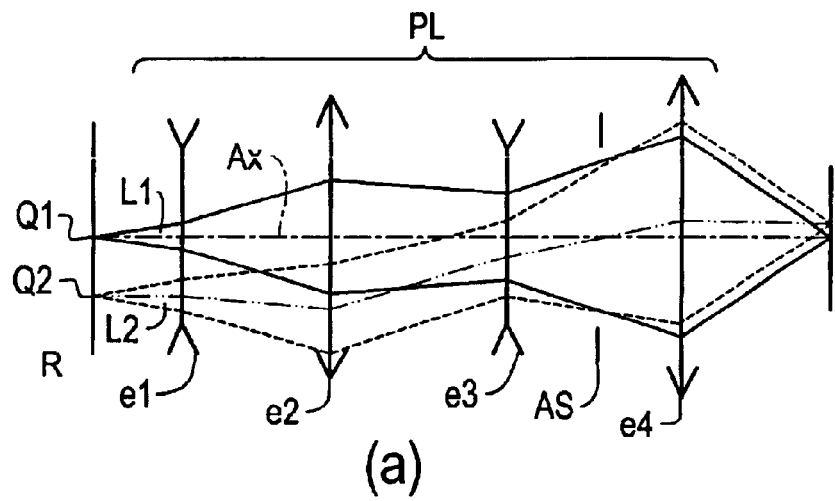
FIG. 16 (FIGS. 16(a)–(c)) describes an optical member on which the aspherical surface is formed and/or the birefringence distribution is changed.
Figure 16:
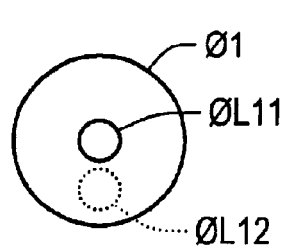
Figure 16:
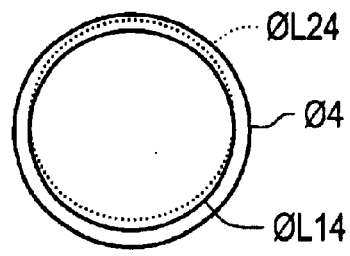

FIG. 16 describes the optical members on which aspherical surface shape is formed and/or optical members by which the birefringence distribution is changed. The projection optical system PL shown in FIG. 16, which is simplified for convenience sake, comprises, in the following order from the first surface R side, an optical member e1 having a negative refractive power, an optical member e2, having a positive refractive power, an optical member e3 having a negative refractive power, an aperture stop AS, and an optical member e4, having a positive refractive power.

Next, the optical path for the light beam from two different object points Q1, Q2 on the first surface R passing through the projection optical system PL is explained. In the figure, the symbol L1 is the optical path of the light beam emitted from the object point Q1, and the symbol L2 is the optical path of the light beam emitted from the object point Q2. The light beams from the object point Q1 which is the intersection of the optical axis Ax and the first surface R of the projection optical system PL, whenever passing through optical members e1–e4, are diverged or converged, and form an image on the intersection of the optical axis AX and the second surface W. Here, the clear apertures of the optical members e1–e4 are denoted by $\phi 1$–$\phi 4$. Moreover, the light beam aperture of the light beam L1 passing through each optical member e1–e4 is denoted by $\phi L11$–$\phi L14$, and the light beam aperture of the light beam L2 passing through each optical member e1–e4 is denoted by $\phi L21$–$\phi L24$.

As for the optical path of the light beams L1, L2 passing through the optical member e1, the ratio of the light beam aperture $\phi L11$ to the clear aperture $\phi 1$ of the optical member e1 and the ratio of the light beam aperture $\phi L21$ to the clear aperture $\phi 1$ of the optical member e1 is about 0.25. Moreover, the position where the light beam L1 passes through the optical member e1 and the position where the light beam L2 passes through the optical member e1 are different.

As for the optical path of the light beams L1, L2 passing through the optical member e4, the ratio of the light beam aperture $\phi L14$ to the clear aperture $\phi 4$ of the optical member e4 and the ratio of the light beam aperture $\phi L24$ to the clear aperture $\phi 4$ of the optical member e4 is substantially 1. Moreover, the position where the light beam L1 passes through the optical member e4 and the position where light beam L2 passes through the optical member e4 are substantially the same.

Hence, in determining the aspherical surface of the optical members in the projection optical system PL and in computing the birefringence amount and birefringence distribution of the optical members in the projection optical system PL in step S526, it becomes necessary to select optical members that can effectively correct the aberrations by considering the passage of the light beams explained in FIG. 16.

For example, in correcting the aberrations with a high degree of dependency on the image surface coordinates (scalar aberrations such as distortion and field curvature, and polarization aberration (birefringence affect) which differ with image surface coordinates), aberrations with a high degree of dependency on the image surface coordinates may be effectively corrected by providing an aspherical surface on the optical surface (lens surface, reflection surface and the like) of the optical member e1 where the light beam L1 from the object point Q1 and the light beam L2 from the object point L2 pass through at different positions, or by changing the birefringence distribution of the optical member e1.

Moreover, in correcting aberrations with a high degree of dependency on the pupil coordinates (scalar aberrations such as spherical aberration and decentered coma aberration, and polarization aberration (birefringence affect) with a low degree of dependency on the image surface coordinates), aberrations with a high degree of dependency on the pupil coordinates may be effectively corrected by providing an aspherical surface on the optical surface of the optical member e4 where the light beam L1 from the object point Q1 and the light beam L2 from the object point Q2 pass through substantially the entire surface, or by changing the birefringence distribution of the optical member e4.

In correcting aberrations with substantially the same degree of dependency on the image surface coordinates and pupil coordinates (for example, coma aberrations and the like), aberrations with substantially the same degree of dependency on the image surface coordinates and pupil coordinates may be effectively corrected by providing an aspherical surface on the optical surface of the optical member (for example, optical member e2 and the like) where overlapping of the light beam L1 from the object point Q1 and the light beam L2 from the object point Q2 become intermittently, or by changing the birefringence distribution of the optical member (for example, the optical member e2 and the like) where overlapping of the light beam L1 from the object point Q1 and the light beam L2 from the object point Q2 become intermittent.

Hence, in step S26, the aspherical surface shape of at least three optical members out of a plurality of optical members e1–e4 in the projection optical system PL are preferably determined in order to correct scalar aberrations. Moreover, in correcting polarization aberration (birefringence affect), the birefringence amount and distribution are preferably computed for at least one optical member out of a plurality of optical members e1–e4 in the projection optical system PL, because the occurrence of polarization aberration (birefringence affect) with high degree of dependency on the pupil coordinate (a low degree of dependency on the image surface coordinate) is frequent.

Here, the optical member made of the amorphous material having such a birefringence amount and distribution is preferably arranged on a position satisfying, $$0.6 < \phi p/\phi c \leq 1 \quad (7)$$

where, $\phi c$ denotes the clear aperture of the optical member and $\phi p$ denotes the light beam aperture of the light beam from a predetermined point on the first surface R at the time of passing through the optical member.

By arranging the optical member with a predetermined birefringence distribution on a position where the equation (7) is satisfied, polarization aberration (birefringence affect) caused by the refractive member made of isometric system crystal material may be effectively corrected. Here, in order to further improve the correction of the polarization aberration (birefringence affect), the lower limit of equation (7) may preferably be set to 0.7.

Moreover, the optical member made of the amorphous material having the birefringence amount and distribution to correct the polarization aberration (birefringence affect) with a high degree of dependency on the pupil coordinates (a low degree of dependency on image surface coordinates) may preferably be arranged within 150 mm of the pupil position of the projection optical system.

Moreover, in order to more effectively correct the coma and other aberrations with substantially the same degree of dependency on the image surface coordinates and the pupil coordinates, the computation of the aspherical surface shape on the optical surface of the two optical members where overlapping of the light beam L1 from the object point Q1 and the light beam L2 from the object point Q2 becomes intermittent is desired, hence, the determination of aspherical surface shape on optical surface of at least four optical members out of a plurality of optical members e1–e4 in the projection optical system PL is preferably made.

Here, the aspherical surface to be formed on the optical members e1–e4 may be symmetric or asymmetric with respect to the optical axis Ax. The aspherical surface may even be formed randomly based on the aberration generated. Likewise, the birefringence distribution to be provided in the optical members e1–e4 may be either symmetric or asymmetric relative to the optical axis Ax, or even be a random birefringence distribution based on the generated aberration to be changed.

Here, the aspherical surface and birefringence amount and distribution are not necessarily limited to the purpose of correcting the entire wavefront aberration remaining in the projection optical system PL, but may be only for the correction of a specific residual aberration. For example, it is not crucial to correct the wavefront aberration which may be corrected by the mechanism for adjusting from the outside to be explained later in step S526, but it may be corrected by the mechanism for adjusting from the outside. Moreover, some of the residual aberration in the projection optical system PL which may be ignored from the imaging performance point of view may not be corrected by providing the aspherical surface or birefringence distribution.

Now returning to FIG. 13, in step S527, the optical surface (lens surface, reflection surface and the like) of the optical members selected in step S526 are processed to become the aspherical surface shape determined in step S526. Moreover, if the birefringence distribution of a predetermined optical member is changed in step S526, optical material with the birefringence amount and distribution computed in step S526 is prepared and processed.

In step S528, the optical member on which the aspherical surface of a predetermined shape is formed and/or the optical members having a predetermined birefringence amount and distribution are installed into the projection optical system. In this case, a mounting error may occur, but the mounting error occurring here is considered to be too small to cause a problem for the aberration measurement instrument of FIG. 14, hence, the program moves to step S516 in the present embodiment.

Now, if the aberration estimated through the simulation in step S522 satisfies the predetermined standard (if determination result is OK), the optical characteristics of the projection optical system PL are adjusted to the level that they may be corrected by a slight adjustment using a mechanism for adjusting from the outside. Hence, the installation and initial adjustment of the mechanism for adjusting from outside are executed.

Figure 15:
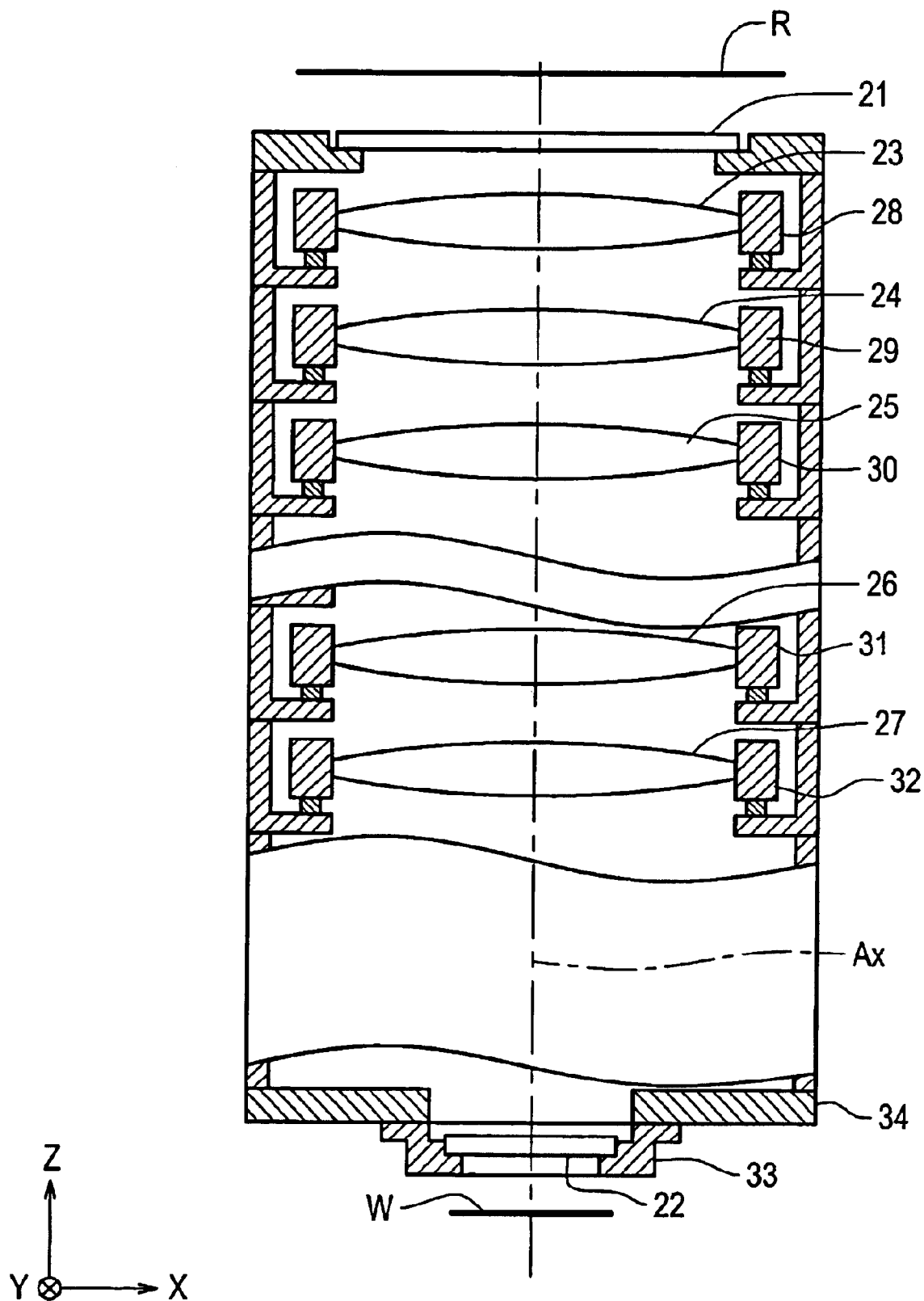
FIG. 15 is a drawing describing the schematic structure of a mechanism for adjusting from outside in a projection optical system of the second embodiment of the present invention.

Here, in the initial adjustment of the mechanism for adjusting from the outside, an adjustment of the response amount to control signals of actuators 28–32 described in FIG. 15 is executed. To be more specific, even if, for example, the control signals to extend 1 µm are sent from the unrepresented control system to the actuators 28–32, actuators 28–32 may not extend 1 µm as commanded by control signals, hence, the response amount of actuators 28–32 against the control amount of control system is adjusted. Here, because the control signals being output from the control system are the signals that change the optical performance of the projection optical system PL, the initial adjustment is essentially a process to establish a correlation between the adjustment by the mechanism for adjusting from outside and the amount of change in performance of the projection optical system PL. Once the actuators 28–32 are installed, only the adjustment by the mechanism for adjusting from the outside will be executed.

Upon completion of step S529 above, the wavefront aberrations are measured using the wavefront measurement instrument used in the aforementioned step S516. In this case, the wavefront aberration component may be computed by obtaining the expansion coefficients Cn (Zernike Coefficients) for each term, by fitting the Zernike circle polynomial Zn ($\rho$, $\theta$) to the result of the wavefront aberration measurement as in the case of the aforementioned step S520.

Upon completion of step S530 above, a determination is made as to whether or not the result satisfies the predetermined aberration standard of the projection optical system. If the determination result in step S531 is NG, the program moves to S532, and if the determination result in step S531 is OK, the production of the projection optical system PL is completed.

In step S532, an adjustment using the aforementioned mechanism for adjusting from the outside is performed, after which the program moves to step S529. Here, steps S529–S532 are repeated until the determination result of step S531 turns OK.

Here, in the assembly step in the second embodiment, an adjustment using the wavefront aberration of a plurality of polarization components is performed, but the wavefront aberration may be measured using the non-polarization component only. In this case, because only the scalar component of the wavefront aberration is known, it is sufficient to obtain a correlation between the parameters of the optical member which affect the polarization component of the wavefront aberration and the scalar component of the wavefront aberration, based on which correlation, parameters of the optical members are changed in each step.

As explained above, the production method of the projection optical system of the second embodiment enables the determination of an integration (installation) angle of the crystal axis of the refractive member made of the isometric system crystal material to minimize the impact of the birefringence (polarization aberration) while evaluating the impact of birefringence caused by the isometric system crystal material such as fluorite and barium fluoride on a plurality of polarization components, and in addition compensation, through the amorphous refractive member, for impact of the birefringence (polarization aberration) which can not be corrected by the optimization of the crystal axis direction alone is enabled, which assures excellent optical performance.

Figure 17:
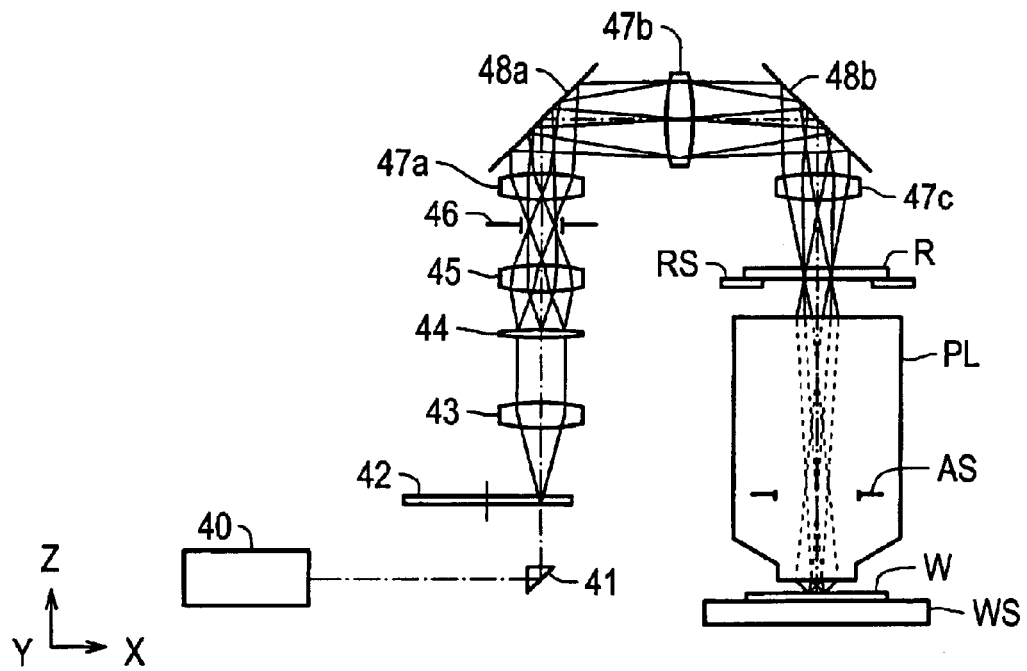
FIG. 17 is a drawing describing the schematic structure of an exposure apparatus with a projection optical system manufactured according to the first or second embodiments.

Next, the exposure apparatus with a projection optical system manufactured according to the first embodiment or the second embodiment is described as a third embodiment using FIG. 17 as a reference. FIG. 17 is a schematic diagram showing an exposure apparatus of the third embodiment.

In FIG. 17, the pulse light beam from the light source 40 made of an ArF excimer laser which supplies a 193 nm pulse light beam, for example, moves along the X direction, deflected by the optical path folding prism 41, and the incident DOE (diffractive optical element) provided in DOE turret 42. A plurality of diffractive optical elements of different types are provided in the DOE turret 42. These diffractive optical elements convert the incident light beams in a farfield region of the diffractive optical elements so that the light beams may possess a predetermined cross-section shape, such as a circular cross-section, annular cross-section and multi-pole cross-section (a plurality of apertures decentered from the standard optical axis).

The scattered light beams from the diffractive optical elements are gathered by a condenser lens group 43, and form the diffractive optical element farfield region in the vicinity of a micro fly-eye lens 44. Here, the micro fly-eye lens refers to a system in which a plurality of lens surfaces, arranged in a two-dimensional matrix, are integrated onto one or more substrates. Here, a fly-eye lens with a plurality of lens elements integrated into a two-dimensional matrix may be used in place of the micro fly-eye lens 44. Moreover, the condenser lens group to be arranged between the diffractive optical elements and the micro fly-eye lens 44 are preferably a variable magnification optical system such as a zooming optical system which is capable of the continuous change of a focal length by moving the lens along the optical axis direction, and a multi-focal length optical system which is capable of the discontinuous change of a focal length by switching the lenses.

Now, the two-dimensional light source, a light source formed of a plurality of light source images, is formed in the exit surface side of the micro fly-eye lens 44. Here, the virtual images of the plurality of light sources may be formed in the incident surface of the micro fly-eye lens 44 (or the fly-eye lens).

The light beams from the two-dimensional light source are gathered by the condenser optical system 45 and overlappingly illuminate a variable field stop 46. Moreover, the light beams from the variable field stop 46 reach the reticle R through a blind imaging optical system 47a–47c, which images a substantially conjugate aperture section of the variable field stop 46 onto the reticle R as the projection plate arranged at the first surface. Here, in the present embodiment, two optical path folding mirrors 48a, 48b are arranged in the blind imaging optical system 47a–47b, to deflect the optical path by substantially 180 degrees. By the light beams from the blind imaging optical system 47a–47c, a slit-like illumination field, for example, is formed on part of the pattern formation region on the reticle R. The light beams from the illumination field reach the wafer W which is arranged at the second surface of the projection optical system as the workpiece (the photosensitive substrate) through the projection optical system PL which is obtained by the production method of the aforementioned first or second embodiments, and form an image of the pattern in the slit-like illumination field on the wafer W.

In the present embodiment, the reticle stage RS supporting the reticle R on the first surface and the wafer stage supporting the wafer W on the second surface are allowed to move along the Y direction, and the pattern image, and by exposing while moving the reticle stage RS and wafer stage WS with a ratio of β, which is the magnification of the projection optical system, the pattern image inside pattern formation region of the reticle R is formed in the shot region which has shape of the slit-like imaging region being swept in the Y direction, or typically rectangular shape, on the wafer WS.

After completing the scanning exposure to the one shot region, the scanning exposure to another shot region is executed by driving the wafer stage WS, until a plurality of shot regions are formed over substantially the entire surface of the wafer W.

Here, in the present embodiment, an example in which the projection optical system manufactured by the production method of the first and second embodiments was applied to the scanning exposure apparatus is shown, but the projection optical system manufactured by the production method of the first and second embodiments may be applied to a batch exposure type projection exposure apparatus, for example.

Moreover, in the projection exposure apparatus of the present embodiment, the optical members made of the isometric system crystal material (fluorite, for example) is used for at least part, particularly, the part where the light energy becomes high, of the illumination optical system 41–47c which illuminates the reticle R arranged, as the original projection plate, at the first surface based on the light beams from the light source. In such an illumination optical system, the optical performance required is lower than that required for the projection optical system. Hence, optimization of the crystal axis direction of the isometric system crystal material in the illumination optical system, to reduce the impact of birefringence (polarization aberration), is not done in the present embodiment.

However, if a high level of optical performance is required for the illumination optical system, optimization of the crystal axis direction of the isometric system crystal material or the correction of the impact from birefringence (polarization aberration) caused by the isometric system crystal material in the optical member made of amorphous material may be executed.

Moreover, in the present embodiment, the ArF excimer laser supplying a pulse light beam of 193 nm wavelength was used as the light source, but the $F_2$ laser supplying pulse light beam of 157 nm wavelength, the $Kr_2$ laser supplying light beams of 147 nm wavelength, and the $Ar_2$ laser supplying light beam of 126 nm wavelength, for example, may be used instead as the light source.

If the $F_2$ laser supplying pulse light beam of 157 nm wavelength is used, for example, the isometric system crystal material such as fluorite or barium fluoride or fluoride doped silica (modified silica) may be used as the radiation transmissive member in the illumination optical system 41–47c. Particularly, the modified silica is desirable as the optical material of the aforementioned micro fly-eye lens because of its easy processability and shortness of the glass path length.

Figure 18:
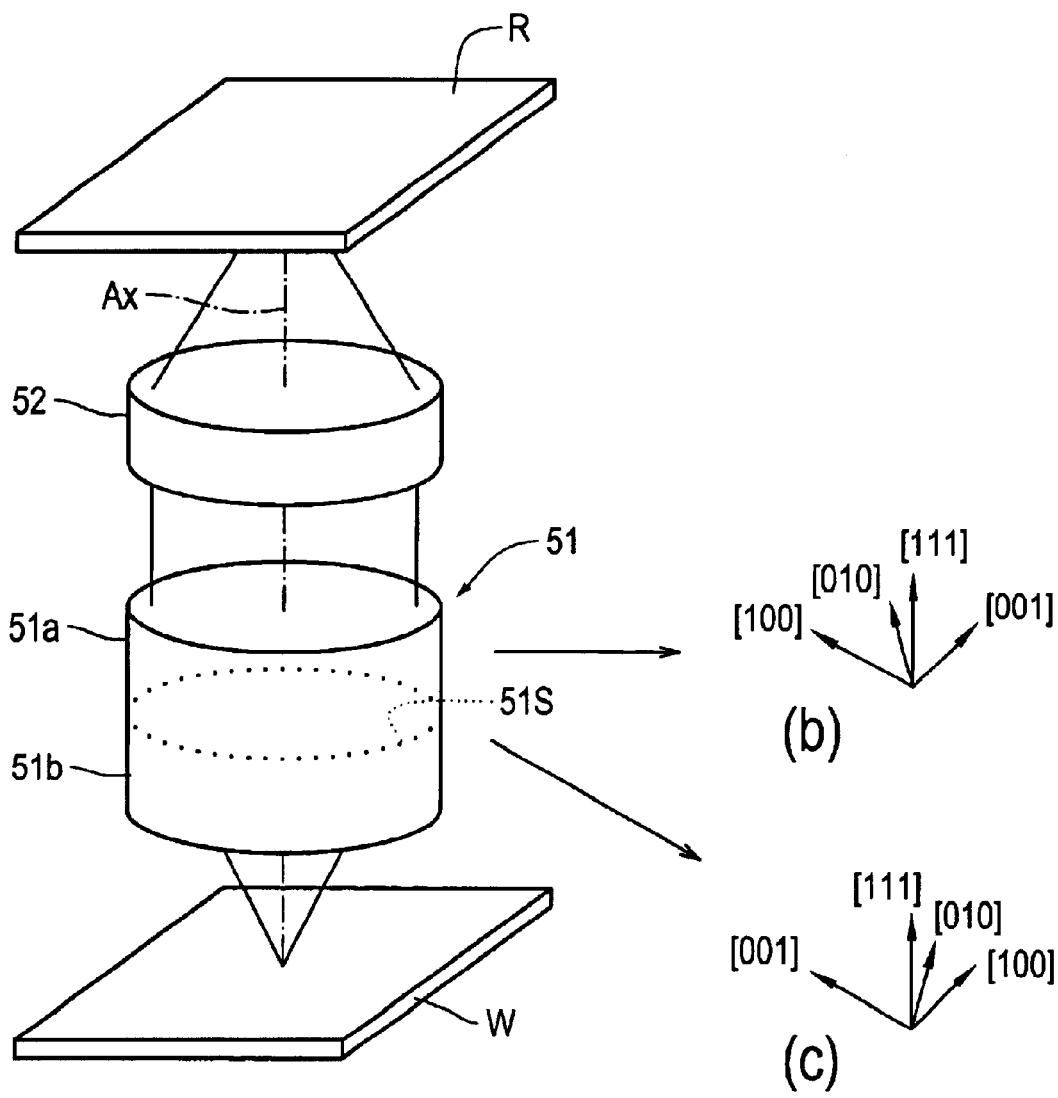
FIG. 18 (FIGS. 18(a)–(c)) describes a typical projection optical system of a fourth embodiment as an example of a method that reduces intrinsic birefringence through a combination of a plurality of isometric system crystal material.

Next, a projection optical system using the refractive member made of the twin crystal will be explained as a fourth embodiment. FIG. 18 is a drawing of a projection optical system in the fourth embodiment. Here, the projection optical system of the fourth embodiment, which will be described in detail below, may also be used as a projection optical system of a projection exposure apparatus in the aforementioned third embodiment.

FIG. 18(*a*) illustrates a schematic structure of a projection optical system having a refractive member 51 made of the twin crystal and a refractive member 52 made of the amorphous material. FIG. 18(*b*) represents a crystal axis of the crystal 51a in the refractive member 51, and FIG. 18(*c*) represents a crystal axis of the crystal 51b in the refractive member 51. Here, FIGS. 18(*a*)–18(*c*) have the common coordinate system as represented in the diagrams.

FIGS. 18(*a*)–(*c*) show that the refractive member 51 made of the twin crystal is either one in which the two same phase crystals 51a and 51b, which are mutually adjacent with the twin crystal surface of the twin crystal boundary 51S as a border, have a directional relationship of 180 degrees rotation around a predetermined common low index crystal axis (crystal axis [111] in the present embodiment), or one in which the two same phase crystals adjacent to each other, have a mirror image relationship with respect to the predetermined crystal surface (the surface [111] in the present example).

In this structure, the refractive member 51 made of the twin crystal has the crystal axis [111] of the two crystals 51a, 51b coincide with the optical axis Ax, and the crystal 51b is rotated 180 degrees relative to the crystal 51a in the XY plane. This is equivalent to the structure in which the crystal axes of two crystals 51a, 51b coincide with the optical axis Ax, and the crystal 51b is rotated 60 degrees relative to the crystal 51a in the XY plane. Hence, by the same reason as the projection optical system described in the aforementioned FIG. 11, the impact of birefringence (polarization aberration) may be almost entirely eliminated with the crystal 51a and crystal 51b. Here, the optical member material 52 made of the amorphous material may be used to correct the impact of birefringence (polarization aberration) which the crystals 51a and 51b could not cancel, as in the case of the aforementioned embodiments.

As explained above, in the present embodiment, the deterioration of the optical performance caused by intrinsic birefringence may be reduced with the totality of the crystal refractive members by utilizing the fact that the effect of birefringence acts in a mutually opposite direction near the twin crystal surfaces or twin crystal boundaries. This assures the optical performance of the projection optical system.

Hereafter, an example in which the predetermined first group refractive member optical axis, out of a plurality of refractive members made of the isometric crystal material, is made to almost coincide with the crystal axis [100] or the crystal axis optically equivalent to the crystal axis [100], and the predetermined second group refractive member optical axis, different from the first group, is made to substantially coincide with the crystal axis [100] or the crystal axis optically equivalent to the crystal axis [100], and these first group and second group refractive members are rotated 45 degrees relative to each other around the optical axis, will be described as the fifth embodiment.

Figure 19:
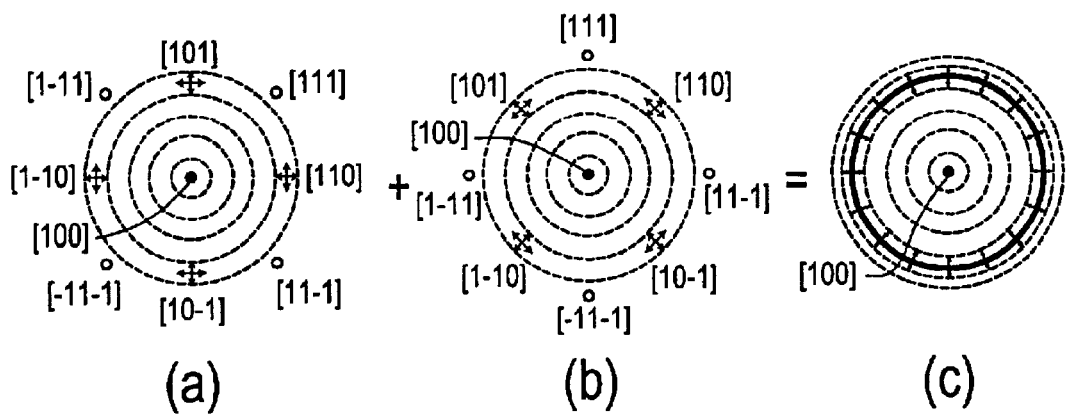
FIG. 19 (FIGS. 19(a)–(c)) describes a typical projection optical system of a fifth embodiment as an example of a method that reduces the intrinsic birefringence through a combination of a plurality of isometric system crystal material.

FIG. 19 describes a technique used in the fifth embodiment, and explains the birefringence distribution with respect to the incident angles of the light beams, as in the case of the aforementioned FIGS. 11(b)–(e).

FIG. 19(a) shows the birefringence distribution in the first group refractive member and FIG. 19(b) shows the birefringence distribution in the second group refractive member in the method of the fifth embodiment. FIG. 19(c) shows the resulting birefringence distribution of the first group refractive member and the second refractive member combined.

FIG. 19(a) and FIG. 19(b) show that, in the method of the fifth embodiment, the region corresponding to the crystal axis [100] coinciding with the optical axis Ax becomes a region with a relatively large refractive index without birefringence. Moreover, the region corresponding to the crystal axis [111], [1-11], [–11-1] and [11-1] becomes the region with a relatively small refractive index without birefringence.

Furthermore, the region corresponding to crystal axes [101], [10-1], [110] and [1-10] becomes a birefringence region with a relatively large refractive index against polarization (θ polarization) in the tangential direction and a relative small refractive index against polarization in the radial direction R polarization). For the lens element of each group, it is found that the largest impact of birefringence is felt in the region making 45 degrees from the optical axis (the angle between the crystal axis [100] and the crystal axis [101]).

FIG. 19(c) clearly shows that for the totality of the first and the second refractive members, the impact of the crystal axes [101], [10-1], [110] and [1-10] with the largest birefringence is substantially reduced by rotating the first group refractive member and the second group refractive member 45 degrees relative to each other around the optical axis, and in the region of 45 degrees from the optical axis, namely the region away from the optical axis. The birefringence region where the refractive index against the tangential polarization (θ polarization) is larger than the refractive index against radial polarization R polarization) remains. In this case, the maximum angle between the optical axis and the light beam in each lens element is about 35 degrees–40 degrees in a regular projection optical system. Hence, by using the method of the fifth embodiment, excellent imaging performance is assured without suffering substantially any impact of birefringence from the crystal axes [101], [10-1], [110], [1-10].

Here, in the aforementioned description, each of the first group refractive member and the second group refractive member includes one or more refractive members. Moreover, in the case when the first group refractive member or the second group refractive member contain a plurality of refractive members, the plurality of refractive members do not necessarily border each other. The concept of the group refractive members in the present embodiment is the same as the refractive members of the third-sixth groups which will be explained later. In the method of the fifth embodiment, the total thickness along the optical axis of the first group refractive members and the total thickness along the optical axis of the second group refractive members are preferably substantially equal to each other.

Figure 11:
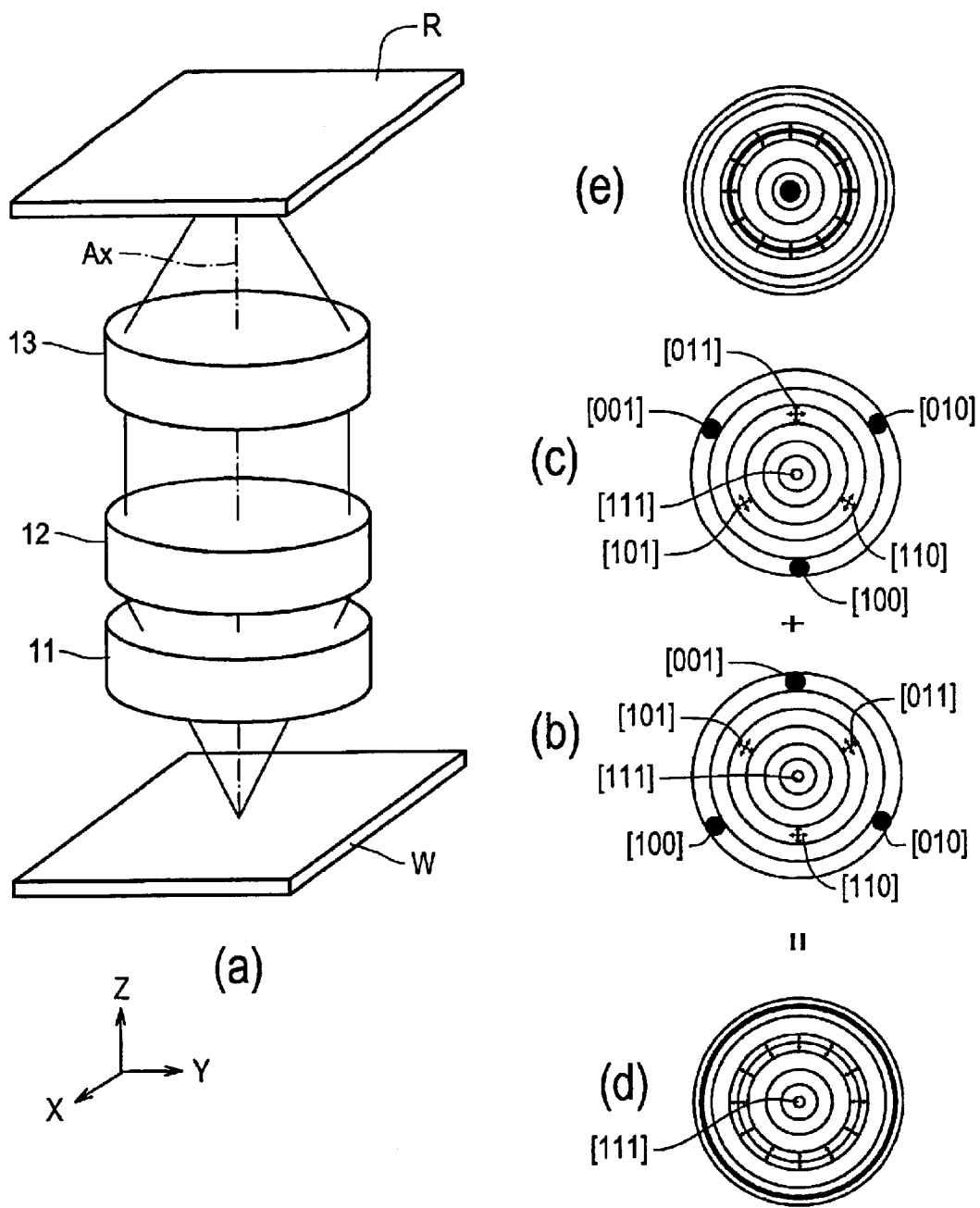
FIG. 11 (FIGS. 11(a)–(e)) describes an example of a method to reduce the intrinsic birefringence through combination of a plurality of isometric system crystal material.

Now, if FIG. 19(c) is compared to the aforementioned FIG. 11(d), the direction of birefringence in the region 35.26 degrees from the optical axis in the method of FIG. 11 and the direction of birefringence in the region 45 degrees from the optical axis in the method of the fifth embodiment are mutually opposite. Hence, the combination of the method of fifth embodiment and the method of FIG. 11 will result in a method in which excellent imaging performance is assured without suffering substantially any impact of birefringence.

Next, an example in which the method of the aforementioned fifth embodiment and the method of FIG. 11 are combined and will be presented as a sixth embodiment. In the method of the sixth embodiment, the predetermined first group refractive member optical axis, out of a plurality of refractive members made of the isometric crystal material, is made to substantially coincide with the crystal axis [100] (or the crystal axis optically equivalent to the crystal axis [100]), and a predetermined second group refractive member optical axis, different from the first group, is made to substantially coincide with the crystal axis [100] (or the crystal axis optically equivalent to the crystal axis [100]), and these first group and second group refractive members are rotated 45 degrees relative to each other around the optical axis. Moreover, a predetermined third group refractive member optical axis is made to substantially coincide with the crystal axis [111] (or the crystal axis optically equivalent to the crystal axis [111]), and a predetermined fourth group refractive member optical axis, different from the third group refractive member, is made to substantially coincide with the crystal axis [111] (or the crystal axis optically equivalent to the crystal axis [111]), and these first group and second group refractive members are rotated 60 degrees relative to each other around the optical axis.

Here, the crystal axes optically equivalent to the crystal axis [111] are the crystal axes [–111], [1-11], [1-11] and [11-1].

In the method of the sixth embodiment, the total thickness along the optical axis of the first group refractive members and the total thickness along the optical axis of the second group refractive members are preferably substantially equal to each other, and the total thickness along the optical axis of the third group refractive members and the total thickness along the optical axis of the fourth group refractive members are preferably substantially equal to each other.

Next, an example in which at least one refractive member optical axis out of a plurality of refractive members made of the isometric crystal material is made to coincide with the crystal axis [100] (or the crystal axis optically equivalent to the crystal axis [100]) will be presented as a seventh embodiment.

Referring to the aforementioned FIGS. 11(b) and 11(c), the region corresponding to crystal axis [110], [101], [011] where birefringence is maximum is found to exist at a 120 degrees pitch, hence, it appears that the impact of birefringence with the 3θ distribution in the pupil surface, namely the impact causing coma aberration in image surface (wafer surface) is felt.

On the other hand, in FIGS. 19(a) and 19(b), the refractive member optical axis and the crystal axis [100] are made to coincide, hence, the region corresponding to crystal axis [101] with the maximum birefringence exists with a 90 degree pitch, and the impact of birefringence having 4θ distribution in the pupil surface is felt.

In this case, because the vertical and horizontal patterns are dominant in the pattern to be projected on the wafer, the impact to cause astigmatism against the vertical and horizontal pattern is not felt with the 4θ distribution and the image collapse is not noticeable. Hence, an adaptation of the method of the seventh embodiment in which at least one refractive member of the optical axis out of the plurality of refractive members made of the isometric crystal material is made to coincide with the crystal axis [100] (or the crystal axis optically equivalent to the crystal axis [100]) assures excellent imaging performance without suffering substantially any impact of birefringence.

Next an example in which a predetermined fifth group optical axis, out of a plurality of refractive members made of the isometric crystal material, is made to substantially coincide with the crystal axis [110] or the crystal axis optically equivalent to the crystal axis [110], and a predetermined sixth group optical axis, different from the fifth group, is made to substantially coincide with the crystal axis [110] or the crystal axis optically equivalent to the crystal axis [110], and these fifth group and sixth group refractive members are rotated 90 degrees relative to each other around the optical axis is presented as an eighth embodiment.

Figure 20:
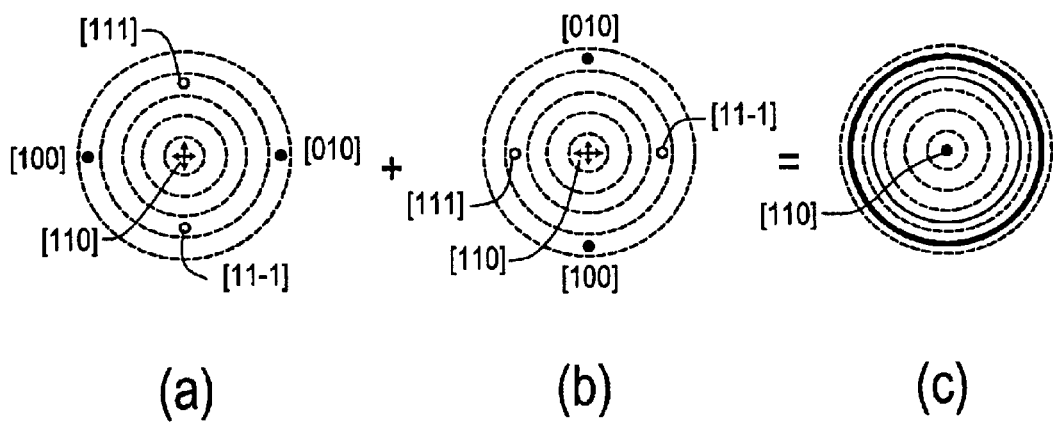
FIG. 20 (FIGS. 20(a)–(c)) describes a typical projection optical system of an eighth embodiment as an example of a method that reduces intrinsic birefringence through a combination of a plurality of isometric system crystal material.

FIG. 20 describes a technique used in the eighth embodiment, and explains the birefringence distribution with respect to the incident angles of the light beams, as in the case of the aforementioned FIGS. 11(b)–(e) and FIG. 19.

FIG. 20(a) shows the birefringence distribution in the fifth group refractive member and FIG. 20(b) shows the birefringence distribution in the sixth group refractive member in the method of the eighth embodiment. FIG. 20(c) shows resulting birefringence distribution of the fifth group refractive member and the sixth refractive member combined.

FIG. 20(a) and FIG. 20(b) show that, in the method of eighth embodiment, the region corresponding to the crystal axis [110] coinciding with the optical axis Ax becomes a birefringence region with a relatively large refractive index against polarization of one direction and with a relatively small refractive index against the other polarization of the other direction (perpendicular to first direction). Moreover, the region corresponding to the crystal axis [100] and [010] becomes the region with a relatively large refractive index without birefringence and the region corresponding to the crystal axis [111] and [11-1] becomes the region with a relatively small refractive index without birefringence.

On the other hand, in FIG. 20(c), the totality of the fifth group refractive member and the sixth group refractive member may be made to be a region without birefringence with the impact of the crystal axis [110] with a maximum birefringence being hardly present, in the vicinity of optical axis of which possesses an average refractive index by rotating the fifth group refractive member and the sixth group refractive member 90 degrees relative to each other around optical axis. In other words, by using the method of the eighth embodiment, excellent imaging performance is assured without suffering substantially any impact of birefringence.

In the method of the eighth embodiment also, the total thickness of the fifth refractive members along optical axis and the total thickness of the sixth refractive members along optical axis are preferably made equal to each other. Particularly in the eighth embodiment, use of a negative lens with a thin center section is preferred because the birefringence region exists in the central section (the optical axis and its vicinity).

Here, one method arbitrarily selected out of aforementioned four methods, or combination of several methods out of the four methods may be used.

Moreover, in the refractive members made of the isometric system crystal material, if the maximum angle, relative to the optical axis, of the light beam passing through the refractive members exceeds 20 degrees, impact of birefringence is easily felt regardless of the arrangement positions. Hence, for the refractive members made of the isometric system crystal material with the maximum angle of the light beams passing through the refractive members exceeding 20 degrees, application of one or more of the methods described in FIG. 11 and fifth through eighth embodiments is desirable. With this structure, the impact of birefringence is further reduced, resulting in excellent optical performance.

Moreover, in the projection optical system with a large image side numerical aperture, the lens arranged closer to the second surface than to the pupil position (pupil position closest to the image (second surface side) in the case of a multiple times imaging optical system with intermediate imaging points) tends to make the maximum angle of the transmissive light beams relative to the optical axis larger. Hence, the application of one or more methods described in FIG. 11 and the fifth through eighth embodiments is desirable for the refractive members made of the isometric system crystal material, out of all the refractive members to be arranged between the pupil position closest to the second surface side and the second surface. With this structure, the impact of birefringence is further reduced, resulting in excellent optical performance.

Moreover, out of the plurality of refractive members made of the isometric system crystal members, a seventh group of radiation transmissive members formed in such a manner that the predetermined crystal axis substantially coincides with the optical axis, and an eighth group of radiation transmissive members formed in such a manner that the predetermined crystal axis substantially coincides the optical axis, preferably satisfies an equation $$|L7-L8|/\lambda < 3 \times 10^{+5} \qquad (9)$$

where L7 is the optical path length when the light beam corresponding to the maximum numerical aperture of the projection optical system passes through the seventh group of the radiation transmissive members, L8 is the optical path length when the light beam corresponding to the maximum numerical aperture of the projection optical system passes through the eighth group of the radiation transmissive members, and $\lambda$ is the predetermined wavelength. Such a structure enables the reduction of the birefringence impact by these seventh and eighth groups of radiation transmissive members, even if the projection optical system has a large image side numerical aperture. Here, setting the upper limit of the equation (9) to $2.6 \times 10^{+5}$ will enable a further reduction of the birefringence impact.

Hereafter, examples based on specific numerical values will be described.

Figure 21:
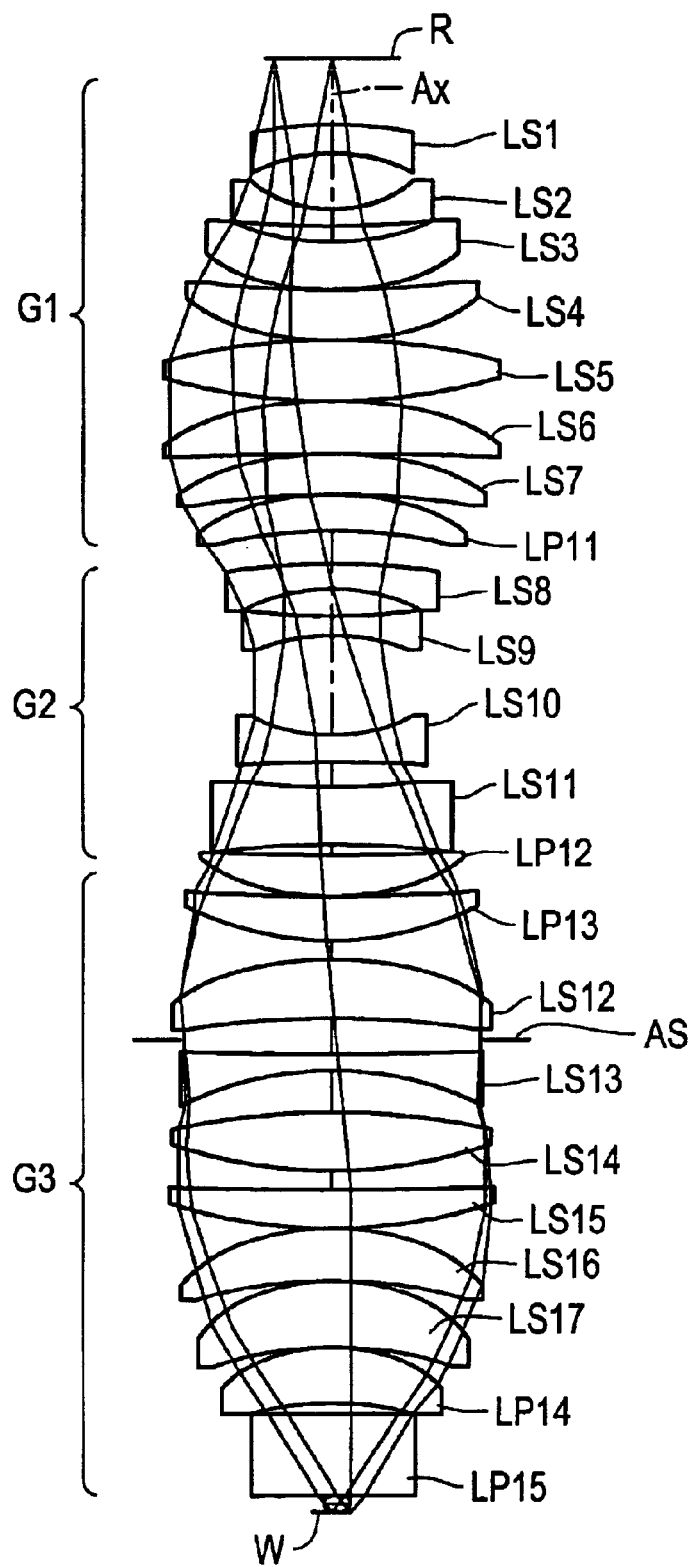
FIG. 21 is a drawing describing a lens structure of the projection optical system of the first embodiment as a specific example of the present invention.

FIG. 21 is a diagram showing a lens structure of a projection optical system relating to a first example of the present invention. The projection optical system uses silica $SiO_2$ and fluorite $CaF_2$ as the optical material, and projects an image of the reticle R arranged at a first surface onto a wafer arranged at a second surface.

The projection optical system comprises, in the following order from the reticle R side, a first lens group G1 with positive refractive power, a second lens group G2 with negative refractive power, and a third lens group G3 with positive refractive power. Here, the first lens group G1 includes a lens LP11 with a positive refractive power made of fluorite. The third lens group G3 includes lenses LP12, LP13, LP14, LP15 made of fluorite. An aperture stop AS is arranged within the third lens group. The standard wavelength of the projection optical system of the first example is 193.3 nm (the ArF excimer laser) and is an optical system with both sides being telecentric.

Now, in the first example, the first lens group G1 with positive refractive power relays the telecentric light beams from the first surface to the second lens group G2, at the same time generates the beforehand positive distortion aberration in order to correct negative distortion aberrations generated by the second and third lens groups G2, G3. The second lens group G2 with a negative refractive power contributes mainly to the Petzval sum and achieves flatness of the image surface. The third lens group G3 with a positive refractive power plays a role of imaging an image on the second surface using the light beams relayed from the second lens group G2, under the telecentric light beams with a condition in which occurrence of a spherical aberration mainly is vigorously controlled.

Silica glass material is known to generate an irradiation fluctuation such as absorption and compaction in the ArF laser. Here, by using at least one piece of fluorite glass material in the first lens group with a positive refractive power, deterioration of irradiation fluctuation due to silica glass material may be controlled. In the first lens group, because the light beams passing through the center of the optical axis (partial diameter) and light beams passing through the perimeter are relatively distant from each other, a coma aberration and the difference between the center and the perimeter in the projection area become apparent when irradiation fluctuation occurs in the first lens group, resulting in a large aberration fluctuation. Hence, by using a fluorite in the first lens group G1, the aberration deterioration due to irradiation fluctuation may be controlled effectively.

Moreover, in the projection optical system of the present example, at least one lens component, out of all the lens components of the first lens group G1 which are made of fluorite will preferably possess a positive refractive power. As explained above, the impact of a coma aberration and the difference between the center and the perimeter in the projection area due to the first lens group G1 is larger than those that are caused by other lens groups. In particular, convex lenses easily suffer the impact of glass material irradiation fluctuation because the light beams passing though the optical center has a longer optical path in glass material than the perimeter light beams. Hence, the fluorite glass material is preferably used for the lens with a positive refractive power in effectively controlling the aberration fluctuation due to irradiation fluctuation. Moreover, the fluorite glass material is preferably used for a lens with a positive refractive power in performing an achromatism utilizing the difference in the refractive index with silica.

Moreover, the third lens group G3 will preferably contain at least one lens component made of fluorite. In the projection optical system of the present example, the light beams that are diverged by the second lens group G2 are converged by the third lens group G3, causing a higher irradiation energy density in each lens of the third lens group G3. This becomes a reason for generating compaction, which is a type of irradiation fluctuation. Use of the fluorite glass material in the third lens group effectively reduces the impact of the compaction. Moreover, use of the fluorite glass material as a thick glass material near the surface where irradiation energy density is concentrated helps an even more effective correction of the compaction.

Table 1 below provides various dimensional values in the projection optical system of the first embodiment. In the table, $\beta$ is the projection magnification (lateral magnification), NA is image side (second surface side) numerical aperture, B is a diameter of the image circle on the image surface. In Table 1, the surface number represents the following order from the reticle side, which is the object surface (first surface), to the wafer surface, which is an image surface (second surface) along the direction of the light beams movement, r represents the radius of curvature (vertex radius of curvature in the case of the aspherical surface) and d represents the distance between surfaces of each surface along the optical axis.

Moreover, Table 2 provides aspherical surface coefficients for each surface. The aspherical surface is represented by equation (10) below, $$Z=(y^2/r)/[1+\{1-(1+K)\cdot y^2/r^2\}^{1/2}]+A\cdot y^4+B\cdot y^6+C\cdot y^8+D\cdot y^{10}+E\cdot y^{12}+F\cdot y^{14} \quad (10)$$

where Y is the vertical height in the direction perpendicular to the optical axis, Z is the distance (sag amount), along the optical axis, from tangential plane at the vertex on the aspherical surface to the position of height y in the aspherical surface, r is the vertex radius of curvature, K is a conical coefficient, and A–F are nth order aspherical coefficients. Here, Em in the column of each aspherical surface coefficient in Table 2 denotes $10^m$.

Also mm is an example of units for the curvature and distance between the various dimensional values of the present example. The refractive index of each glass material with a wavelength of 193.3 nm are shown below.

$SiO_2$ 1.5603261

$CaF_2$ 1.5014548

TABLE 1

$\beta = -0.25$
NA = 0.78
B = 27.4

| Surface Number | Radius of Curvature | Distance between surfaces | Glass material |
|---|---|---|---|
|  |  | 56.57 |  |
| 1 | 388.465 | 23.27 | $SiO_2$ |
| 2 | 177.000 | 42.53 |  |
| 3 | −120.028 | 15.00 | $SiO_2$ |
| 4 | −752.332 | 16.54 |  |
| 5 | −193.722 | 44.12 | $SiO_2$ |
| 6 | −192.988 | 1.00 |  |
| 7 | −799.710 | 42.35 | $SiO_2$ |
| 8 | −240.979 | 1.00 |  |
| 9 | 666.130 | 51.12 | $SiO_2$ |
| 10 | −543.380 | 1.00 |  |
| 11 | 299.996 | 49.64 | $SiO_2$ |
| 12 | ∞ | 1.00 |  |
| 13 | 276.988 | 35.60 | $SiO_2$ |
| 14 | 991.456 | 1.00 |  |
| 15 | 252.935 | 30.34 | $CaF_2$ |
| 16 | 574.560 | 30.59 |  |
| 17 | 687.760 | 19.37 | $SiO_2$ |
| 18 | 143.863 | 30.27 |  |
| 19 | −399.976 | 15.00 | $SiO_2$ |
| 20 | 170.000 | 87.67 |  |
| 21 | −128.314 | 26.18 | $SiO_2$ |
| 22 | 804.730 | 21.59 |  |
| 23 | −570.040 | 51.47 | $SiO_2$ |
| 24 | 950.000 | 10.24 |  |

TABLE 1-continued

β = -0.25
NA = 0.78
B = 27.4

| Surface Number | Radius of Curvature | Distance between surfaces | Glass material |
|---|---|---|---|
| 25 | ∞ | 35.89 | CaF$_2$ |
| 26 | -250.424 | 1.02 | |
| 27 | ∞ | 41.69 | CaF$_2$ |
| 28 | -262.449 | 13.09 | |
| 29 | 290.060 | 56.21 | SiO$_2$ |
| 30 | 1757.000 | 26.96 | |
| 31 | ∞ | 15.03 | SiO$_2$ |
| 32 | 276.988 | 34.69 | |
| 33 | 533.910 | 48.23 | SiO$_2$ |
| 34 | -471.548 | 15.61 | |
| 35 | ∞ | 32.96 | SiO$_2$ |
| 36 | -490.708 | 2.60 | |
| 37 | 199.138 | 42.55 | SiO$_2$ |
| 38 | 439.306 | 3.65 | |
| 39 | 170.020 | 49.30 | SiO$_2$ |
| 40 | 300.000 | 1.66 | |
| 41 | 154.428 | 45.93 | CaF$_2$ |
| 42 | 522.270 | 5.77 | |
| 43 | ∞ | 60.00 | CaF$_2$ |
| 44 | 1687.460 | 11.35 | |

TABLE 2

(Aspherical coefficients)

[Surface number 2]

K = 0.000000
A = -0.106010E-06
B = 0.204228E-11
C = -0.588237E-16
D = 0.112269E-20

[Surface number 14]

K = 0.000000
A = 0.417491E-08
B = 0.514111E-13
C = -0.666592E-18
D = 0.141913E-22

[Surface number 20]

K = 0.000000
A = 0.166854E-07
B = 0.370389E-12
C = -0.138273E-16
D = -0.304113E-20

[Surface number 24]

K = 0.000000
A = 0.361963E-07
B = -0.679214E-12
C = -0.128267E-16
D = 0.908964E-21
E = -0.121007E-25

[Surface number 40]

K = 0.000000
A = -0.179608E-07
B = 0.149941E-12
C = -0.128914E-17
D = -0.506694E-21
E = 0.204017E-25
F = -0.730011E-30

In the present example, the ill effect (polarization aberration) of birefringence is corrected by adjusting the azimuth angle (rotational angle around optical axis) of the lens components LP11–LP15 made of fluorite out of the optical members forming the projection optical system.

FIG. 22(a) represents the point image intensity distribution on the optical axis when the lens components LP11–LP15 made of fluorite are arranged in such a manner that the crystal axis [111] coincides with the optical axis and each azimuth angle are in the same direction. Here, the maximum PSF value is 90.72 in FIG. 22(a).

FIG. 22(b) represents the point image intensity distribution on the optical axis when the azimuth angle of the lens components LP14 out of the fluorite lens components LP11–LP15 is rotated 180 degrees relative to other fluorite lens components LP11–LP13, LP15 around optical axis. Here, in FIG. 22(b) the maximum PSF value is 96.41.

A comparison of FIG. 22(a) and FIG. 22(b) shows that the case in which all the azimuth angles of the crystal axis of lens components LP11–LP15 made of fluorite are the same (the case of FIG. 22(a)) has a large 3θ component of scalar aberration and a low PSF value of about 90.6, but in the case of rotating the azimuth angle of the lens component LP14 180 degrees relative to the other fluorite lens components LP11–LP13, LP15 around optical axis (equivalent to the case in which the relative azimuth angle between the lens component LP14 and fluorite lens components LP11–LP13, LP15 is 60 degrees, the case of FIG. 22(b)), 3θ component of the scalar aberration is smaller and the PSF value climbs to about 96.4. In this manner, the changing of azimuth angle of the crystal axis of the isometric system crystal material results in an improvement of the optical performance of the projection optical system.

FIG. 22(c) represents a case in which in addition to the condition of FIG. 22(b) (the azimuth angle of the lens components LP14 out of the lens components made of fluorite is rotated 180 degrees relative to the other fluorite lens components LP11–LP13, LP15 around optical axis), the birefringence distribution is provided to the lens components LS12 and LS14 which are near the pupil, out of lens components LS1–LS17 made of silica in the projection optical system in order to correct the aberration described in FIG. 22(b). This makes the maximum PSF value 99.86 and further improves the optical performance of the projection optical system.

Figure 22:
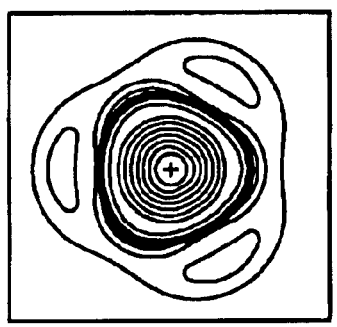
FIG. 22 (FIGS. 22(a)–(c)) describes the point image intensity of the projection optical system of the first embodiment.
Figure 22:
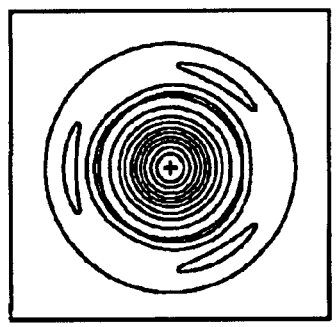
Figure 22:
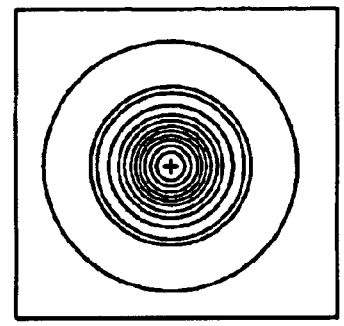

Now, in the example of FIG. 22, a technique in which the crystal axis [111] of the fluorite lens components is made to coincide with the optical axis in the projection optical system is used, but the other crystal axis may be made to coincide with the optical axis.

Figure 23:
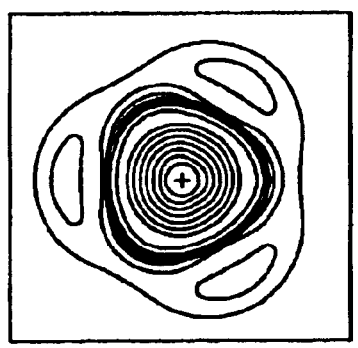
FIG. 23 (FIGS. 23(a)–(b)) describes the point image intensity of the projection optical system of the first embodiment.
Figure 23:
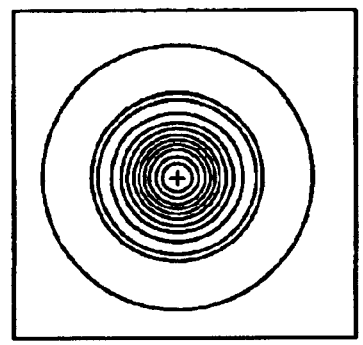

FIG. 23(a), same as FIG. 22(a), represents a point image intensity distribution on the optical axis when the lens components LP11–LP15 made of fluorite are arranged in such a manner that the crystal axis [111] coincides with the optical axis and each azimuth angle are in the same direction. Moreover, FIG. 23(b) represents a case in which the optical axis of the lens components LP11, LP12 and LP13, out of the fluorite lens components LP11–LP15, is made to coincide with the fluorite crystal axis [100], and the optical axis of the lens components LP14 and LP15 is made to coincide with the fluorite crystal axis [110].

Moreover, in the lens components LP11, LP12 and LP13 having a crystal axis [100] as the optical axis, the azimuth angles of the lens components LP11 and LP13 are made to be the same while the azimuth angle of the lens component LP12 is rotated 45 degrees relative to the lens components LP11 and LP13 around the optical axis. Moreover, in the lens components LP14 and LP15 having the crystal axis [110] as optical axis, the azimuth of one lens component is rotated 90 degrees relative to the azimuth angle of the other lens component around the optical axis.

A comparison between FIG. 23(a) and FIG. 23(b) shows that the case represented by FIG. 23(b) has better optical performance with the maximum PSF value of 99.4. Here, in FIG. 23(b), in order to correct a small amount of the residual polarization aberration component, a predetermined birefringence may be provided to at least one lens component, out of the lens components LS1–LS17 made of silica, as in the case of FIG. 22(c), to further improve the optical performance.

Figure 24:
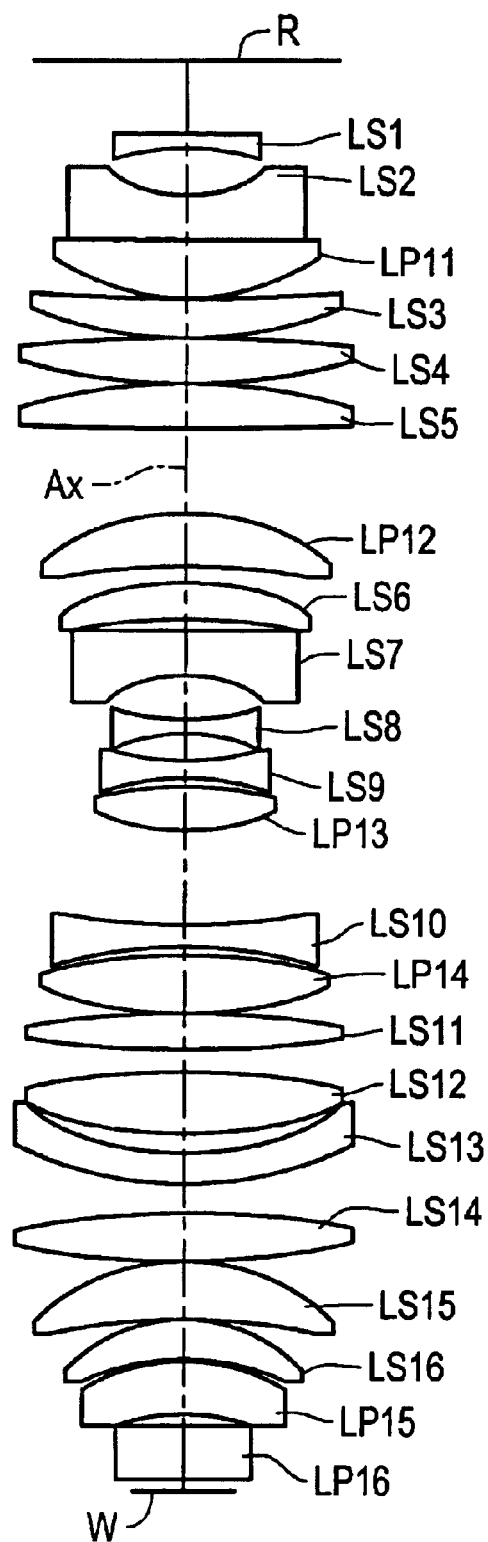
FIG. 24 is a drawing describing a lens structure of the projection optical system of the second embodiment as a specific example of the present invention.

FIG. 24 is a diagram showing a lens structure of a projection optical system relating to a second example of the present invention. The projection optical system uses silica $SiO_2$ and fluorite $CaF_2$ as the optical material, and projects an image of a reticle R being arranged at a first surface onto a wafer arranged at a second surface. The projection optical system of the second example includes lenses LP11–LP17 with a positive refractive power made of fluorite and lenses LS1–LS16 with a negative refractive power made of silica. The standard wavelength of the projection optical system of the second example is 193.3 nm (ArF excimer laser) and is an optical system with both sides being telecentric.

Table 3 below shows various dimensional values in the second example because the symbols and the meaning in Table 3 are the same as Table 1, an explanation will be omitted here.

The aspherical surface coefficients of each aspherical surface are shown in Table 4. The aspherical surface shape is described by the aforementioned equation (10). Here, Em in the column of each aspherical surface coefficient in Table 4 denotes $10^m$.

Also mm is an example of units for the curvature and distance between the surface in the various dimensional values of the present example. The refractive index of each glass material with the wavelength of 193.3 nm are the same as aforementioned first example.

TABLE 3

$\beta$= −0.25
NA = 0.85
B = 23.4

| Surface Number | Radius of Curvature | Distance between surfaces | Glass material |
|---|---|---|---|
| 1 | −16644.993 | 14.681 | $SiO_2$ |
| 2 | 200.000 | 38.160 | |
| 3 | −97.636 | 39.394 | $SiO_2$ |
| 4 | −3498.612 | 1.963 | |
| 5 | 20854.806 | 47.225 | $CaF_2$ |
| 6 | −189.240 | 1.00 | |
| 7 | −1848.127 | 33.691 | $SiO_2$ |
| 8 | −335.321 | 1.00 | |
| 9 | 1292.071 | 37.309 | $SiO_2$ |
| 10 | −600.215 | 1.331 | |
| 11 | 492.732 | 38.730 | $SiO_2$ |
| 12 | −3044.576 | 77.326 | |
| 13 | 190.000 | 48.156 | $CaF_2$ |
| 14 | 833.704 | 12.324 | |
| 15 | 177.093 | 34.107 | $SiO_2$ |
| 16 | 525.225 | 8.344 | |
| 17 | 1357.022 | 39.940 | $SiO_2$ |
| 18 | 104.862 | 40.492 | |
| 19 | −211.803 | 13.000 | $SiO_2$ |
| 20 | 167.689 | 25.248 | |
| 21 | −172.613 | 14.042 | $SiO_2$ |
| 22 | 207.257 | 6.376 | |
| 23 | 377.821 | 39.683 | $CaF_2$ |
| 24 | −169.378 | 86.157 | |
| 25 | −380.085 | 20.000 | $SiO_2$ |
| 26 | 515.903 | 7.314 | |
| 27 | 504.576 | 50.802 | $CaF_2$ |
| 28 | −308.601 | 1.000 | |
| 29 | 1127.574 | 30.958 | $SiO_2$ |
| 30 | −781.573 | 19.652 | |
| 31 | 763.980 | 52.719 | $SiO_2$ |

TABLE 3-continued $\beta$= −0.25
NA = 0.85
B = 23.4

| Surface Number | Radius of Curvature | Distance between surfaces | Glass material |
|---|---|---|---|
| 32 | −331.674 | 21.193 | |
| 33 | −211.490 | 25.066 | $SiO_2$ |
| 34 | −300.000 | 26.763 | |
| 35 | 1063.093 | 41.880 | $SiO_2$ |
| 36 | −559.169 | 1.000 | |
| 37 | 189.378 | 50.245 | $SiO_2$ |
| 38 | 764.962 | 1.000 | |
| 39 | 145.835 | 35.087 | $SiO_2$ |
| 40 | 235.771 | 1.000 | |
| 41 | 178.250 | 45.678 | $CaF_2$ |
| 42 | 406.631 | 6.433 | |
| 43 | −5014.697 | 43.998 | $CaF_2$ |
| 44 | ∞ | 10.500 | |

TABLE 4

(Aspherical coefficients)

[Surface number 2]

K = 0.000000
A = −1.460090E−07
B = 5.901790E−12
C = −2.851310E−16
D = 2.350150-20
E = −2.375080E−24
F = 1.914710E−28

[Surface number 16]

K = 0.000000
A = 2.294100E−08
B = −2.794170E−13
C = 1.017110E−17
D = 5.514660E−22
E −5.807000E−26
F = 4.364070E−30

[Surface number 22]

K = 0.000000
A = 7.961350E−09
B = −3.690120E−12
C = 1.927460E−17
D = 5.305600E−21
E = −2.919800E−26
F = −2.770450E−29

[Surface number 26]

K = 0.000000
A = 2.103660E−08
B = −6.466850E−13
C = −6.551390E−18
D = 2.426880E−22
E = 1.189120E−27
F = −3.538550E−31

[Surface number 40]

K = 0.000000
A = −1.693250E−08
B = 6.620660E−13
C = −9.551420E−18
D = −1.367360E−21
E = 1.080030E−25
F = −4.115960E−30

An ill effect (polarization aberration) of birefringence is corrected by adjusting the azimuth angle of the fluorite lens component LP11–LP16 out of all the optical members forming the projection optical system.

FIG. 25(a) describes the point image intensity distribution on the optical axis when the impact of intrinsic birefringence of fluorite is ignored for comparison. Here, in FIG. 25(a), the maximum PSF value is 99.97.

FIG. 25(b) represents the point image intensity distribution on the optical axis when the fluorite lens components LP11–LP16 are arranged in such a manner that the fluorite crystal axis [111] is made coincide with the optical axis and that each azimuth angle is made to be the same. Here in FIG. 22(a), the maximum PSF value is 94.57.

FIG. 25(c) shows the point image intensity distribution on the optical axis when the azimuth angle of the lens component LP11 out of fluorite lens components LP11–LP16 is rotated 60 degrees around the optical axis relative to the other fluorite lens components LP12–LP14, LP16 and the azimuth angle of the lens component LP15 out of fluorite is rotated 60 degrees around the optical axis relative to the other fluorite lens components LP12–LP14, LP16. Here in FIG. 25(c), the maximum PSF value is 95.86.

A comparison of FIG. 25(b) and FIG. 22(c) shows that the case in which all the azimuth angles are the same, if the crystal axis of lens components LP11–LP16 made of fluorite (the case of FIG. 22(b)) has a large 3θ component of a scalar aberration and a low PSF value of about 94.6, but in the case of rotating the azimuth angle of the lens component LP11 60 degrees relative to other fluorite lens components LP12–LP14, LP16 around the optical axis and rotating the azimuth angle of the lens component LP15 60 degrees around the optical axis relative to other fluorite lens components LP12–LP14, LP16 (the case of FIG. 25(c)), 3θ component of the scalar aberration is smaller and the PSF value climbs to about 95.8. In this manner, the changing of the azimuth angle of the crystal axis of the isometric system crystal material results in an improvement of the optical performance of the projection optical system.

FIG. 25(d) represents a case in which an addition to the condition of FIG. 25(c) (the azimuth angle of the lens components LP11, LP15 is rotated 180 degrees relative to the other fluorite lens components LP12–LP14, LP15 around optical axis), the birefringence distribution is provided to the lens components LS14 which are near the pupil, out of lens components LS1–LS16 made of silica in the projection optical system in order to correct the aberration described in FIG. 25(c). This makes the maximum PSF value 99.82. Here, a comparison with an ideal condition of FIG. 25(a), the PSF value of FIG. 25(d) is substantially equal to the PSF value of 99.92 in FIG. 25(a), which clearly indicates the further improvement of the optical performance of the projection optical system.

Figure 25:
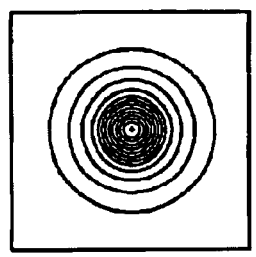
FIG. 25 (FIGS. 25(a)–(d)) describes the point image intensity of the projection optical system of the second embodiment.
Figure 25:
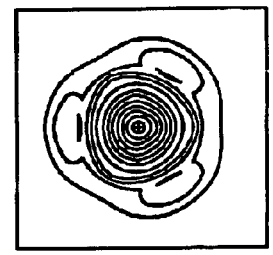
Figure 25:
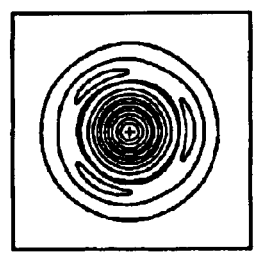
Figure 25:
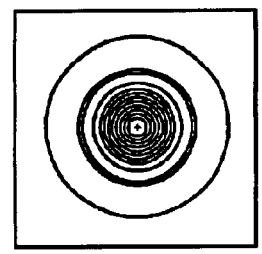

Now, the example described in FIG. 25 uses a technique in which the crystal axis [111] of fluorite lens component is made to coincide with the optical axis in the projection optical system, but another crystal axis may be made to coincide with the optical axis, as in the case of the aforementioned first embodiment.

Figure 26:
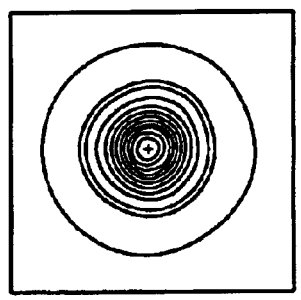
FIG. 26 (FIGS. 26(a) . (b)) describes the point image intensity of the projection optical system of the second embodiment.
Figure 26:
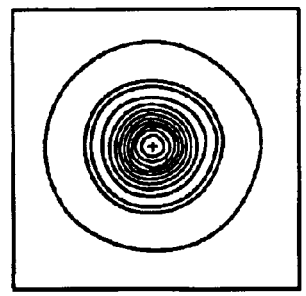

FIG. 26(a) describes the point image intensity distribution in the case when the optical axis of the lens components LP11 and LP12 are made to coincide with the fluorite crystal axis [110], the optical axis of the lens components LP13 and LP14 are made to coincide with the fluorite crystal axis [100], and the optical axis of the lens components LP15 and LP16 are made to coincide with the fluorite crystal axis [111], out of the fluorite lens components LP11–LP16 in the projection optical system. In the case of FIG. 26(a), the azimuth angle of one of the lens components LP11 and LP12 having a crystal axis [110] as the optical axis is rotated 90 degrees around the optical axis relative to the other azimuth angle. Moreover, the azimuth angle of one of the lens components LP13 and LP14 having a crystal axis [110] as the optical axis is rotated 45 degrees around the optical axis relative to the other azimuth angle. Furthermore, the azimuth angle of one of the lens component LP15 and LP16 having a crystal axis [111] as the optical axis is rotated 60 degrees around the optical axis relative to the other azimuth angle.

Here, a comparison with a control example of FIG. 25(b), the PSF value of FIG. 26(a) is 98.76, which indicates an improvement in the optical performance.

Moreover, FIG. 26(b) represents the point image intensity distribution for a case in which in addition to the condition of FIG. 26(a), the birefringence distribution is provided to the lens components LS14 which are near pupil, out of the lens components LS1–LS16 made of silica in the projection optical system in order to correct the aberration described in FIG. 26(a). This makes the maximum PSF value 99.76. Here, a comparison with an ideal condition of FIG. 25(a), the PSF value of FIG. 25(d) is substantially equal to the PSF value of 99.92 in FIG. 25(a), which clearly indicates a further improvement of the optical performance of the projection optical system.

In the exposure apparatus of each of the aforementioned embodiments, a microdevice (semiconductor element, image pickup element, liquid crystal display element, thin film magnetic head, and the like) may be produced by illuminating the reticle (mask) with an illumination apparatus (the illumination step), and exposing patterns (the exposure step) formed on the mask onto a photosensitive substrate with the projection optical system. Hereafter, an example of the methods used to produce a semiconductor device as a microdevice by forming the predetermined circuit patterns on a wafer and the like as a photosensitive substrate using the exposure apparatus of each embodiment will be described referring to flow chart of FIG. 27.

Figure 27:
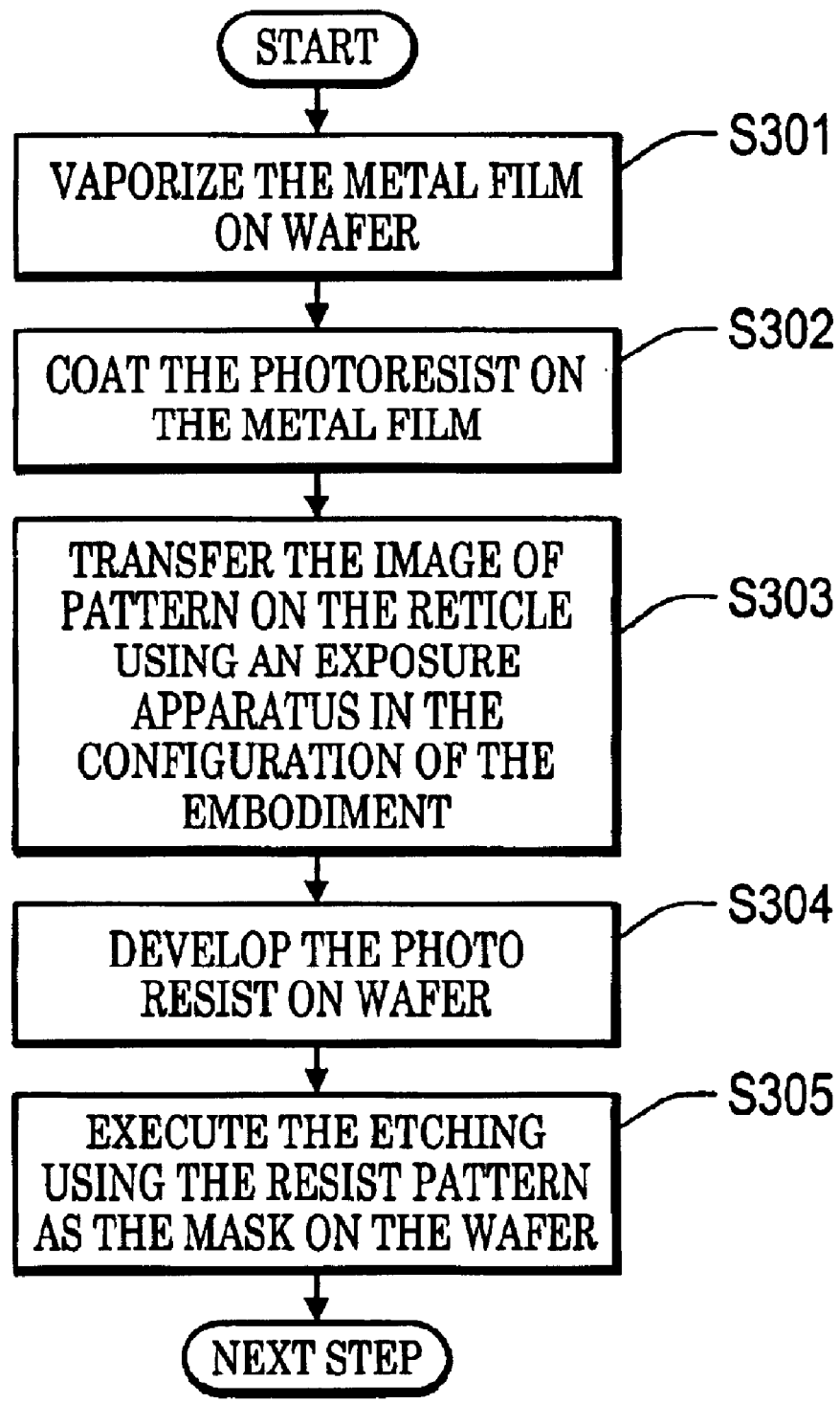
FIG. 27 is a flow chart describing a method for obtaining a semiconductor device as a microdevice.

First, in step 301 of FIG. 27, a metal film is vaporized on one lot of wafers. Next, in step 302, the photoresist is coated onto the metal film on the lot of wafers. Then in step 303, the pattern images on the mask are sequentially exposed and transferred to each shot region on the wafers using the projection optical system. After developing the photoresist on the wafers in step 304, the circuit pattern corresponding to the patterns on the mask are formed in each shot region of each wafer by etching the resist pattern on the lot of wafers as a mask in step 305.

Finally devices such as the semiconductor element are produced by forming a circuit pattern on subsequent layers. The aforementioned semiconductor device production method enables the manufacturing of a semiconductor device with an extremely fine circuit pattern having an improved throughput. Moreover, in steps 301–305, metal is evaporated onto a wafer, the resist is coated on the metal film, on which the steps of exposure, development, and etching are executed, but it is clear that another method may be used in which the silicon oxide film is formed on the wafer prior to the aforementioned steps and the resist is coated on the silicon oxide film, followed by each step of exposure, development and etching.

Figure 28:
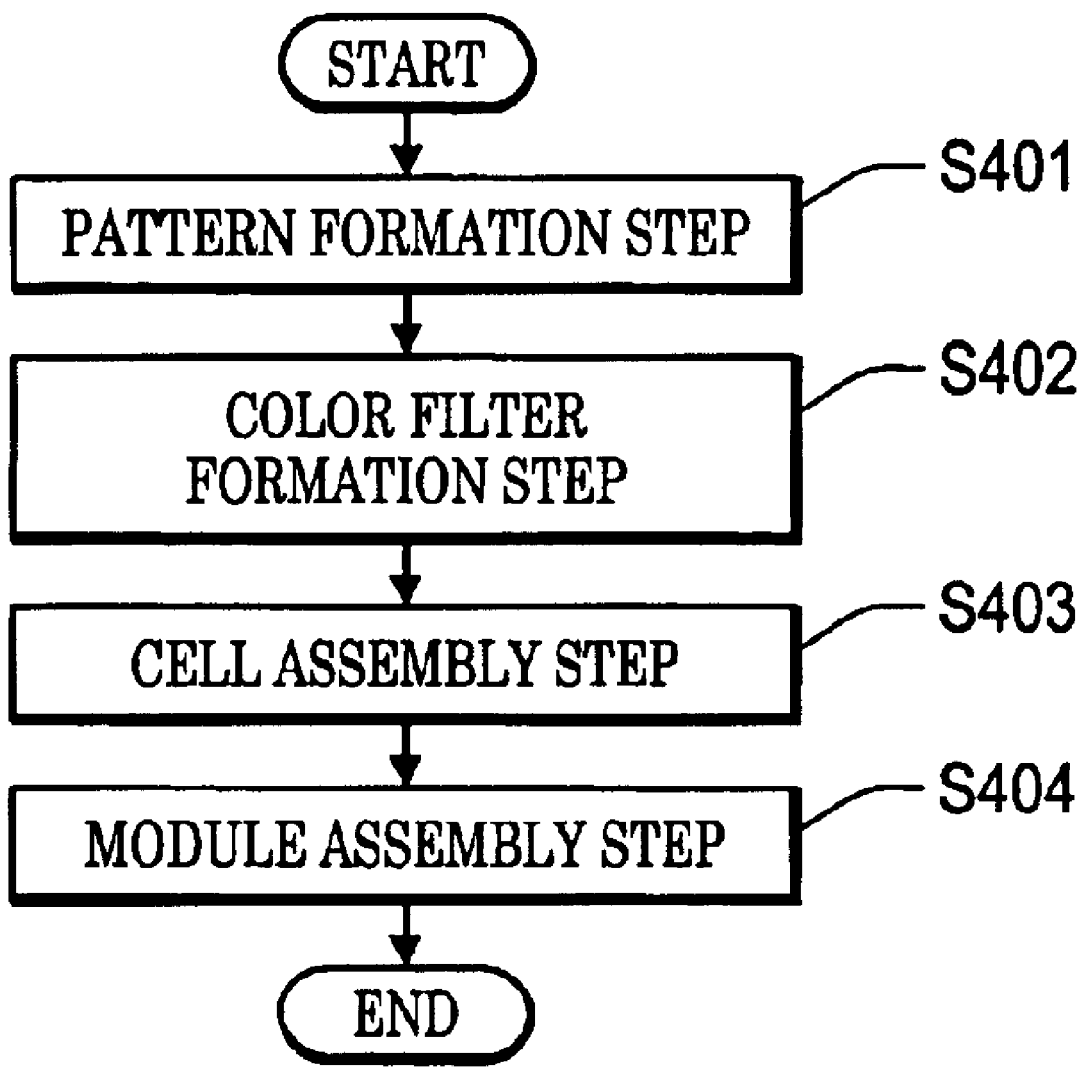
FIG. 28 is a flow chart describing a method for obtaining a liquid crystal display element as a microdevice.

Moreover, in the exposure apparatus of each of the embodiments, a liquid crystal display element as a microdevice may be obtained by forming a predetermined pattern (circuit pattern, electrode pattern) on a plate (glass substrate). Hereafter, one example of this method will be described using the flowchart in FIG. 28 as a reference. In a pattern formation step of FIG. 28, the so-called photolithography step is executed in which the mask pattern is transfer and exposed onto a photosensitive substrate (resist coated glass substrate) using an exposure apparatus of any of the embodiments. The predetermined pattern containing many electrodes and the like is formed on the photosensitive substrate through the photolithography step. Then, the predetermined pattern is formed on the exposed substrate through each step such as the development step, etching step, mask removing step, after which the process moves to the color filter formation step 402.

Next, in the color filter formation step 402, a color filter is formed through a matrix arrangement of many sets of three dots corresponding to R (red), G (green) and B (blue) or arrangement of a plurality of sets of the three R, G, B striped filters in a horizontal scanning direction. Next, the cell assembly step 403 is executed after the color filter formation step 402. In the cell assembly step 403, a liquid crystal panel (liquid crystal cell) is assembled using substrates with the predetermined patterns obtained in the pattern formation step 401 and the color filters obtained in filter formation step 402. The liquid crystal panel (liquid crystal cell) is produced in the cell assembly step 403 by injecting the liquid crystal between the substrates with the predetermined patterns obtained in the pattern formation step 401 and the color filters obtained in filter formation step 402, for example.

Then the liquid crystal display element is completed in the module assembly step 404, by installing an electric circuit, backlight and the like, which enables the display of motion using the liquid crystal panel (liquid crystal cell) assembled. The aforementioned production method enables the production with excellent throughput of a liquid crystal display element having very fine circuit patterns.

As explained above, the present invention assures excellent optical performance without substantially any impact of birefringence even when the crystal material with intrinsic birefringence such as fluorite is used.

While the invention has been described with reference to preferred embodiments thereof, it is to be understood that the invention is not limited to the preferred embodiments or constructions. To the contrary, the invention is intended to cover various modifications and equivalent arrangements conceived by those skilled in lithographic systems. In addition, while the various elements of the preferred embodiments are shown in various combinations and configurations, which are exemplary, other combinations and configurations, including more, less or only a single element, are also within the spirit and scope of the invention.

What is claimed is:

1. A projection optical system in which an image of a first surface is projected onto a second surface based on a light beam having a predetermined wavelength, comprising:
   at least one isometric system refractive member made of an isometric system crystal material that transmits a light beam having the predetermined wavelength, and
   an amorphous refractive member made of an amorphous material for compensating for deterioration of optical performance due to intrinsic birefringence of the isometric system refractive members,
   wherein the isometric system refractive member made of the isometric system crystal material includes a plurality of isometric system refractive members,
   wherein directions of the crystal axes of the plurality of isometric system refractive members are respectively determined in such a manner that the deterioration of the optical performance due to intrinsic birefringence is reduced,
   wherein the plurality of isometric system refractive members comprises:
      a first group of radiation transmissive members which are formed in such a manner that a crystal axis [100], or a crystal axis that is optically equivalent to the crystal axis [100], substantially coincides with the optical axis; and
      a second group of radiation transmissive members which are formed in such a manner that the crystal axis [100], or the crystal axis that is optically equivalent to the crystal axis [100], substantially coincides with the optical axis; and
   wherein the first group of the transmissive members and the second group of radiation transmissive members have a positional relationship in which they are rotated substantially 45 degrees relative to each other around the optical axis.

2. A projection optical system of claim 1, further comprising an aspherical surface for reducing a scalar component of the deterioration of the optical performance due to intrinsic birefringence.

3. A projection optical system of claim 2, wherein the aspherical surface has a rotationally asymmetric shape relative to the optical axis of the refractive members on which the aspherical surface is provided.

4. A projection optical system of claim 1, wherein the amorphous refractive member has a birefringence stress distribution.

5. A projection optical system of claim 4, wherein the birefringence stress distribution is generated due at least to impurities during creation of the amorphous refractive member or density distribution caused by a temperature program.

6. A projection optical system of claim 5, wherein the amorphous optical member is silica or fluoride doped silica.

7. A production method of the projection optical system of claim 1, wherein the isometric system refractive members include calcium fluoride or barium fluoride.

8. A projection optical system of claim 1, wherein the amorphous optical member is silica or fluoride doped silica.

9. A projection optical system of claim 1, wherein the predetermined wavelength is less than or equal to 200 nm.

10. A projection exposure system in which an image of an original which is arranged on a first surface is projection exposed onto a workpiece arranged on a second surface by a light beam having a predetermined wavelength, comprising:
    a light source that supplies the light beam having the predetermined wavelength;
    an illumination optical system that guides the light beam from the light source to the original; and
    a projection optical system of claim 1, which is arranged on an optical path between the first surface and the second surface and which forms the image of the original onto the second surface.

11. A projection exposure method in which an image of an original which is arranged on a first surface is projection exposed onto a workpiece arranged on a second surface by a light beam having a predetermined wavelength, comprising:
    supplying the light beam having the predetermined wavelength;
    illuminating the original using the light beam having the predetermined wavelength; and
    forming the image of the original onto the second surface using a projection optical system of claim 1, based on the illuminated light beam from the original.

12. A projection optical system in which an image of a first surface is projected onto a second surface based on a light beam having a predetermined wavelength, comprising:
    at least one isometric system refractive member made of an isometric system crystal material that transmits a light beam having the predetermined wavelength, and an amorphous refractive member made of an amorphous material for compensating for deterioration of optical performance due to intrinsic birefringence of the isometric system refractive member, wherein the isometric system refractive member made of the isometric system crystal material includes a plurality of isometric system refractive members, wherein directions of the crystal axes of the plurality of isometric system refractive members are respectively determined in such a manner that the deterioration of the optical performance due to intrinsic birefringence is reduced, wherein the plurality of isometric system refractive members comprises:

a third group of radiation transmissive members which are formed in such a manner that a crystal axis [111], or a crystal axis that is optically equivalent to the crystal axis [111], substantially coincides with the optical axis; and a fourth group of radiation transmissive members which are formed in such a manner that the crystal axis [111], or the crystal axis that is optically equivalent to the crystal axis [111], substantially coincides with the optical axis; and wherein the third group of radiation transmissive members and the fourth group of radiation transmissive members have a positional relationship such that they are rotated substantially 60 degrees relative to each other around the optical axis.

13. A projection optical system of claim 12, wherein the crystal axis direction of the plurality of isometric system refractive members is determined in such a manner that deterioration of the optical performance due to intrinsic birefringence is reduced, and further comprising a seventh group of radiation transmissive members formed in such a manner that a predetermined crystal axis substantially coincides with the optical axis, and an eighth group of radiation transmissive members formed in such a manner that the predetermined crystal axis substantially coincides with the optical axis, and wherein an equation $$|L7-L9|/\lambda < 3 \times 10^{+5}$$

is satisfied, wherein L7 is an optical path length when the light beam corresponding to a maximum numerical aperture of the projection optical system passes through the seventh group of radiation transmissive members, L8 is an optical path length when the light beam corresponding to the maximum numerical aperture of the projection optical system passes through the eighth group of radiation transmissive members, and $\lambda$ is the predetermined wavelength.

14. A projection optical system of claim 13, wherein the maximum value of the angle of the light beam passing through the seventh group and the eighth group of radiation transmissive members is more than 20 degrees relative to the optical axis.

15. A projection optical system of claim 13, wherein the seventh group and the eighth group of radiation transmissive members are arranged between a pupil position closest to a second surface side and the second surface in the projection optical system.

16. A projection optical system of claim 12, further comprising an aspherical surface for reducing a scalar component of the deterioration of the optical performance due to intrinsic birefringence.

17. A projection optical system of claim 16, wherein the aspherical surface has a rotationally asymmetric shape relative to the optical axis of the refractive members on which the aspherical surface is provided.

18. A projection optical system of claim 12, wherein the amorphous refractive member has a birefringence stress distribution.

19. A projection optical system of claim 18, wherein the birefringence stress distribution is at least generated due to impurities during creation of the amorphous refractive member or density distribution caused by a temperature program.

20. A projection optical system of claim 19, wherein the amorphous optical member is silica or fluoride doped silica.

21. A production method of the projection optical system of claim 12, wherein the isometric system refractive members include calcium fluoride or barium fluoride.

22. A projection optical system of claim 12, wherein the amorphous optical member is silica or fluoride doped silica.

23. A projection optical system of claim 12, wherein the predetermined wavelength is less than or equal to 200 nm.

24. A projection exposure system in which an image of an original which arranged on a first surface is projection exposed onto a workpiece arranged on a second surface by a light beam having a predetermined wavelength, comprising:

a light source that supplies the light beam having the predetermined wavelength;

an illumination optical system that guides the light beam from the light source to the original; and the projection optical system of claim 12, which is arranged on an optical path between the first surface of the second surface and which forms the image of the original onto the second surface.

25. A projection exposure method in which an image of an original which is arranged on a first surface is projection exposed onto a workpiece arranged on a second surface by a light beam having a predetermined wavelength, comprising:

supplying the light beam having the predetermined wavelength;

illuminating the original using the light beam having the predetermined wavelength; and forming the image of the original onto the second surface using the projection optical system of claim 12, based on the illuminated light beam from the original.

26. A projection optical system in which an image of a first surface is projected onto a second surface based on a light beam having a predetermined wavelength, comprising:

at least one isometric system refractive member made of an isometric system crystal material that transmits a light beam having the predetermined wavelength; and an amorphous refractive member made of an amorphous material for compensating for deterioration of optical performance due to intrinsic birefringence of the isometric system refractive member, wherein the isometric system refractive member made of the isometric system crystal material includes a plurality of isometric system refractive members, wherein directions of the crystal axes of the plurality of isometric system refractive members are respectively determined in such a manner that the deterioration of the optical performance due to intrinsic birefringence is reduced, wherein the plurality of isometric system refractive members comprises:

a fifth group of radiation transmissive members which are formed in such a manner that a crystal axis [110], or a crystal axis that is optically equivalent to the crystal axis [110], substantially coincides with the optical axis; and a sixth group of radiation transmissive members which are formed in such a manner that the crystal axis [110], or the crystal axis that is optically equivalent to the crystal axis [110], substantially coincides with the optical axis; and wherein the fifth group of radiation transmissive members and the sixth group of radiation transmissive members have a positional relationship such that they are rotated substantially 90 degrees relative to each other around the optical axis.

27. A projection optical system in which an image of a first surface is projected onto a second surface based on a light beam having a predetermined wavelength, comprising:

at least one isometric system refractive member made of an isometric system crystal material that transmits a light beam having the predetermined wavelength, and an amorphous refractive member made of an amorphous material for compensating for deterioration of optical performance due to intrinsic birefringence of the isometric system refractive member, wherein the isometric system refractive member made of the isometric system crystal material includes a plurality of isometric system refractive members, wherein directions of the crystal axes of the plurality of isometric system refractive members are respectively determined in such a manner that the deterioration of the optical performance due to intrinsic birefringence is reduced, and wherein the plurality of isometric system refractive members comprises:

a first group of radiation transmissive members which are formed in such a manner that the crystal axis [100], or a crystal axis that is optically equivalent to the crystal axis [100], substantially coincides with the optical axis; and a fifth group of radiation transmissive members which are formed in such a manner that a crystal axis [110], or a crystal axis that is optically equivalent to the crystal axis [110], substantially coincides with the optical axis.

28. A projection optical system of claim 27, wherein the plurality of isometric system refractive members further comprises: a third group of radiation transmissive members which are formed in such a manner that a crystal axis [111], or a crystal axis that is optically equivalent to the crystal axis [111], substantially coincides with the optical axis.

29. A projection optical system in which an image of a first surface is projected onto a second surface based on a light beam having a predetermined wavelength, comprising:

at least one isometric system refractive member made of an isometric system crystal material that transmits a light beam having the predetermined wavelength;

an amorphous refractive member made of an amorphous material for compensating for deterioration of optical performance due to intrinsic birefringence of the isometric system refractive member;

a seventh group of radiation transmissive members formed in such a manner that a predetermined crystal axis substantially coincides with the optical axis; and an eighth group of radiation transmissive members formed in such a manner that the predetermined crystal axis substantially coincides with the optical axis;

wherein the isometric system refractive member made of the isometric system crystal material includes a plurality of isometric system refractive members, wherein the crystal axis direction of the plurality of isometric system refractive members is determined in such a manner that the deterioration of the optical performance due to intrinsic birefringence is reduced, and wherein an equation $$|L7-L8|/\lambda < 3 \times 10^{+5}$$

is satisfied, wherein L7 is an optical path length when the light beam corresponding to a maximum numerical aperture of the projection optical system passes through the seventh group of radiation transmissive members, L8 is an optical path length when the light beam corresponding to the maximum numerical aperture of the projection optical system passes through the eighth group of radiation transmissive members, and $\lambda$ is the predetermined wavelength.

30. A projection optical system of claim 29, wherein the maximum value of an angle of the light beam passing through the seventh group and the eighth group of radiation transmissive members is more than 20 degrees relative to the optical axis.

31. A projection optical system of claim 29, wherein the seventh group and the eighth group of radiation transmissive members are arranged between a pupil position closest to a second surface side and the second surface in the projection optical system.

32. A projection optical system of claim 29, wherein the amorphous refractive member has a birefringence stress distribution.

33. A projection optical system of claim 32, wherein the birefringence stress distribution is at least generated due to impurities during creation of the amorphous refractive member or density distribution caused by a temperature program.

34. A projection optical system of claim 33, wherein the amorphous optical member is silica or fluoride doped silica.

35. A production method of the projection optical system of claim 29, wherein the isometric system refractive members include calcium fluoride or barium fluoride.

36. A projection optical system of claim 29, further comprising an aspherical surface for reducing a scalar component of the deterioration of the optical performance due to intrinsic birefringence.

37. A projection optical system of claim 36, wherein the aspherical surface has a rotationally asymmetric shape relative to the optical axis of the refractive members on which the aspherical surface is provided.

38. A projection optical system of claim 29, wherein the amorphous refractive member has a birefringence stress distribution.

39. A projection optical system of claim 38, wherein the birefringence stress distribution is at least generated due to impurities during creation of the amorphous refractive member or density distribution caused by a temperature program.

40. A projection optical system of claim 39, wherein the amorphous optical member is silica or fluoride doped silica.

41. A production method of the projection optical system of claim 29, wherein the isometric system refractive members include calcium fluoride or barium fluoride.

42. A projection optical system of claim 29, wherein the amorphous optical system is silica or fluoride doped silica.

43. A projection optical system of claim 29, wherein the predetermined wavelength is less than or equal to 200 nm.

44. A projection exposure system in which an image of an original which is arranged on a first surface is projection exposed onto a workpiece arranged on a second surface by a light beam having a predetermined wavelength, comprising:

a light source that supplies the light beam having the predetermined wavelength;

an illumination optical system that guides the light beam from the light source to the original; and the projection optical system of claim 29, which is arranged on an optical path between the first surface and the second surface and which forms the image of the original onto the second surface.

45. A projection exposure method in which an image of an original which is arranged on a first surface is projection exposed onto a workpiece arranged on a second surface by a light beam having a predetermined wavelength, comprising:

supplying the light beam having the predetermined wavelength;

illuminating the original using the light beam having the predetermined wavelength; and forming the image of the original into the second surface using the projection optical system of claim 29, based on the illuminated light beam from the original.

46. A projection optical system in which an image of a first surface is projected onto a second surface based on a light beam having a predetermined wavelength, comprising:

a plurality of isometric system refractive members each made of an isometric system crystal material that transmits a light beam having the predetermined wavelength; and an amorphous refractive member made of an amorphous material for compensating for deterioration of optical performance due to intrinsic birefringence of the isometric system refractive member;

wherein directions of the crystal axes of the plurality of isometric system refractive members are respectively determined in such a manner that the deterioration of the optical performance due to intrinsic birefringence is reduced; and wherein the amorphous refractive member has an internal stress birefringence distribution which reduces a residual deterioration of an optical performance.

47. A projection optical system of claim 46, wherein the internal birefringence stress distribution is at least generated due to impurities during creation of the amorphous refractive member or density distribution caused by a temperature program.

48. A projection exposure system in which an image of an original which is arranged on a first surface is projection exposed onto a workpiece arranged on a second surface by a light beam having a predetermined wavelength, comprising:

a light source that supplies the light beam having the predetermined wavelength;

an illumination optical system that guides the light beam from the light source to the original; and the projection optical system of claim 46, which is arranged on an optical path between the first surface and the second surface and which forms the image of the original onto the second surface.

49. A projection exposure method in which an image of an original which is arranged on a first surface is projection exposed onto a workpiece arranged on a second surface by a light beam having a predetermined wavelength, comprising:

supplying the light beam having the predetermined wavelength;

illuminating the original using the light beam having the predetermined wavelength; and forming the image of the original onto the second surface using the projection optical system of claim 46, based on the illuminated light beam from the original.

* * * * *